United States Patent [19]
Irie et al.

[11] Patent Number: 5,525,808
[45] Date of Patent: Jun. 11, 1996

[54] ALIGNMENT METHOD AND ALIGNMENT APPARATUS WITH A STATISTIC CALCULATION USING A PLURALITY OF WEIGHTED COORDINATE POSITIONS

[75] Inventors: Nobuyuki Irie, Kawasaki; Eiji Takane, Tokyo; Shigeru Hirukawa, Kashiwa; Yoshichika Iwamoto, Kumagaya; Ryoichi Kaneko, Zushi, all of Japan

[73] Assignee: Nikon Corporaton, Tokyo, Japan

[21] Appl. No.: 360,028

[22] Filed: Dec. 20, 1994

Related U.S. Application Data

[63] Continuation-in-part of Ser. No. 174,080, Dec. 27, 1993, abandoned, which is a continuation-in-part of Ser. No. 134,870, Oct. 12, 1993, abandoned, which is a continuation of Ser. No. 5,146, Jan. 15, 1993, abandoned.

[30] Foreign Application Priority Data

| Jan. 23, 1992 | [JP] | Japan | 4-010091 |
| Nov. 6, 1992 | [JP] | Japan | 4-297121 |
| Dec. 25, 1992 | [JP] | Japan | 4-346071 |
| Jan. 22, 1993 | [JP] | Japan | 5-008905 |
| Feb. 8, 1993 | [JP] | Japan | 5-019748 |
| Mar. 19, 1993 | [JP] | Japan | 5-059763 |
| Dec. 24, 1993 | [JP] | Japan | 5-327381 |

[51] Int. Cl.$^6$ .................................... G01N 21/86
[52] U.S. Cl. ..................... 250/548; 250/559.3; 356/400
[58] Field of Search .................... 250/548, 559.3, 250/559.37, 559.49; 356/399, 400, 401; 355/53; 364/559

[56] References Cited

U.S. PATENT DOCUMENTS

| 4,902,900 | 2/1990 | Kamiya et al. | 250/548 |
| 5,243,195 | 9/1993 | Nishi | 356/401 |

Primary Examiner—Edward P. Westin
Assistant Examiner—Que T. Le
Attorney, Agent, or Firm—Shapiro and Shapiro

[57] ABSTRACT

A method of aligning each of a plurality of processing areas regularly aligned on a substrate according to designed alignment coordinates to a predetermined reference position in a static coordinate system for defining the moving position of the substrate is disclosed. The coordinate positions, on the static coordinate system, of at least three processing areas selected in advance as specific processing areas from the plurality of processing areas are measured. The coordinate positions, on the static coordinate system, of the plurality of processing areas on the substrate are determined by weighting the coordinate positions, on the static coordinate system, of the at least three specific processing areas according to the distances between a processing area of interest and each of the at least three specific processing areas in units of processing areas on the substrate, and executing a statistic calculation using the plurality of weighted coordinate positions.

57 Claims, 25 Drawing Sheets

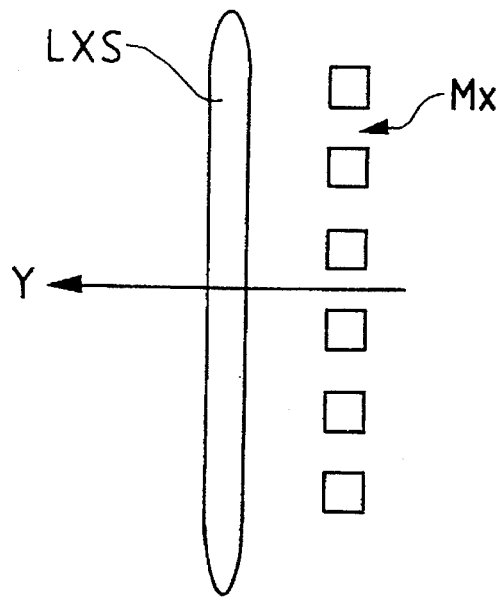
FIG. 11A
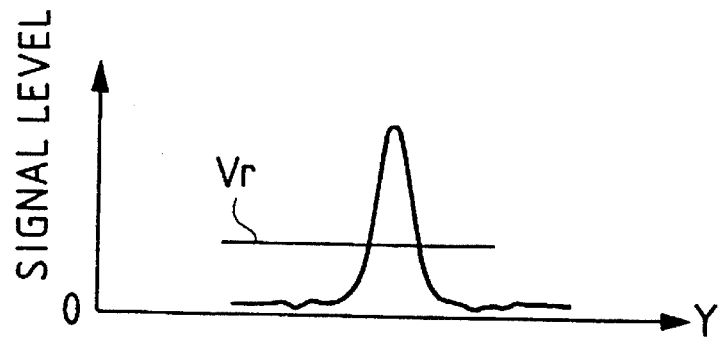
FIG. 11B
FIG. 11C        FIG. 11D        FIG. 11E
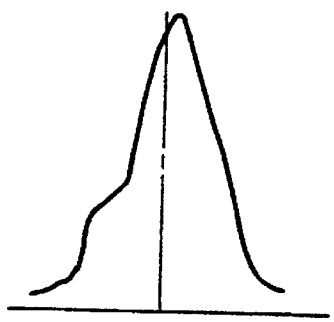
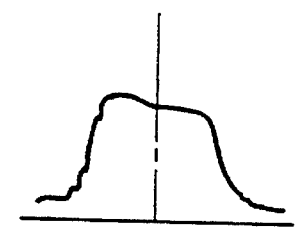
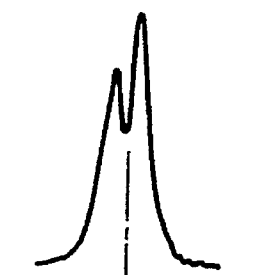

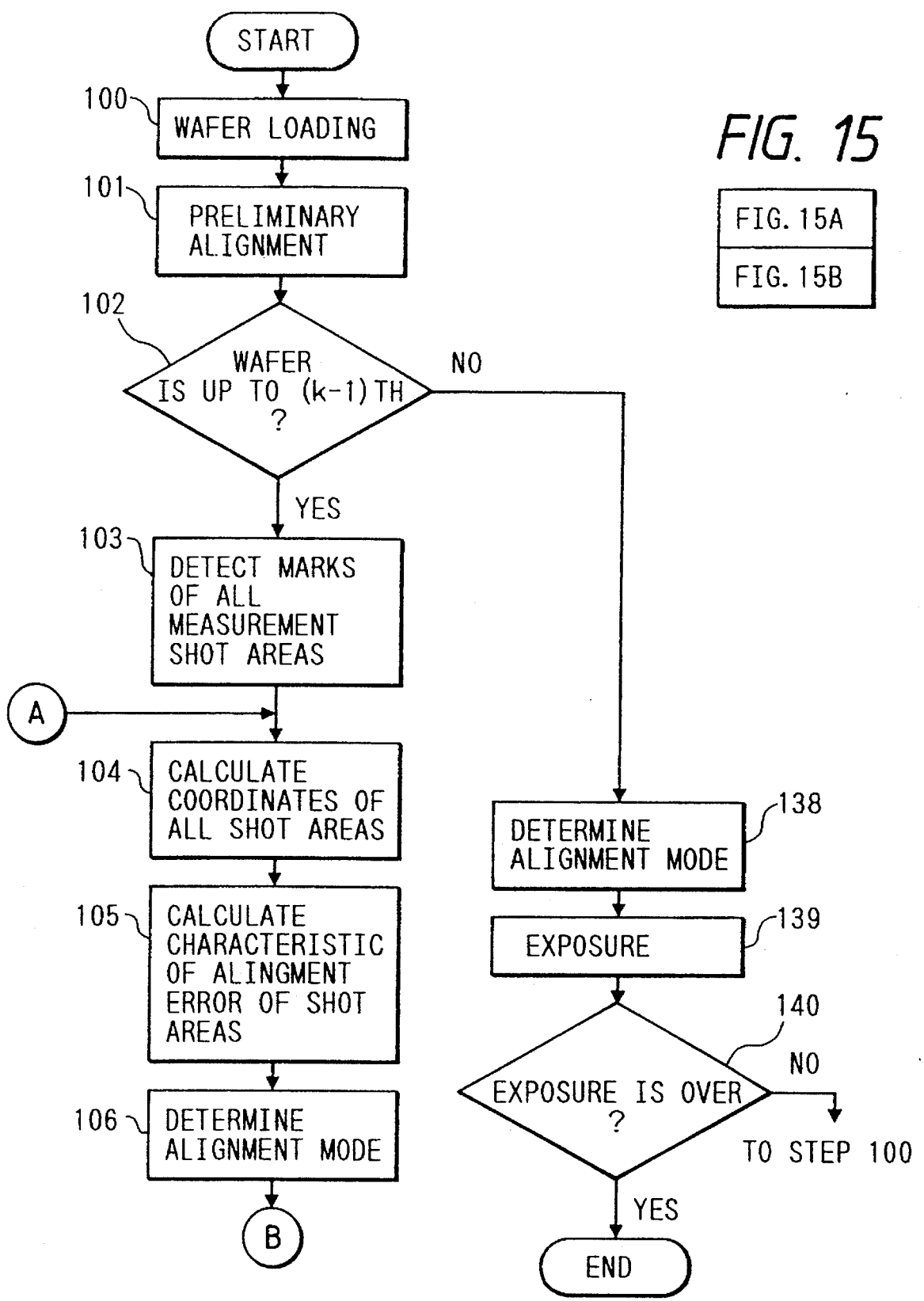

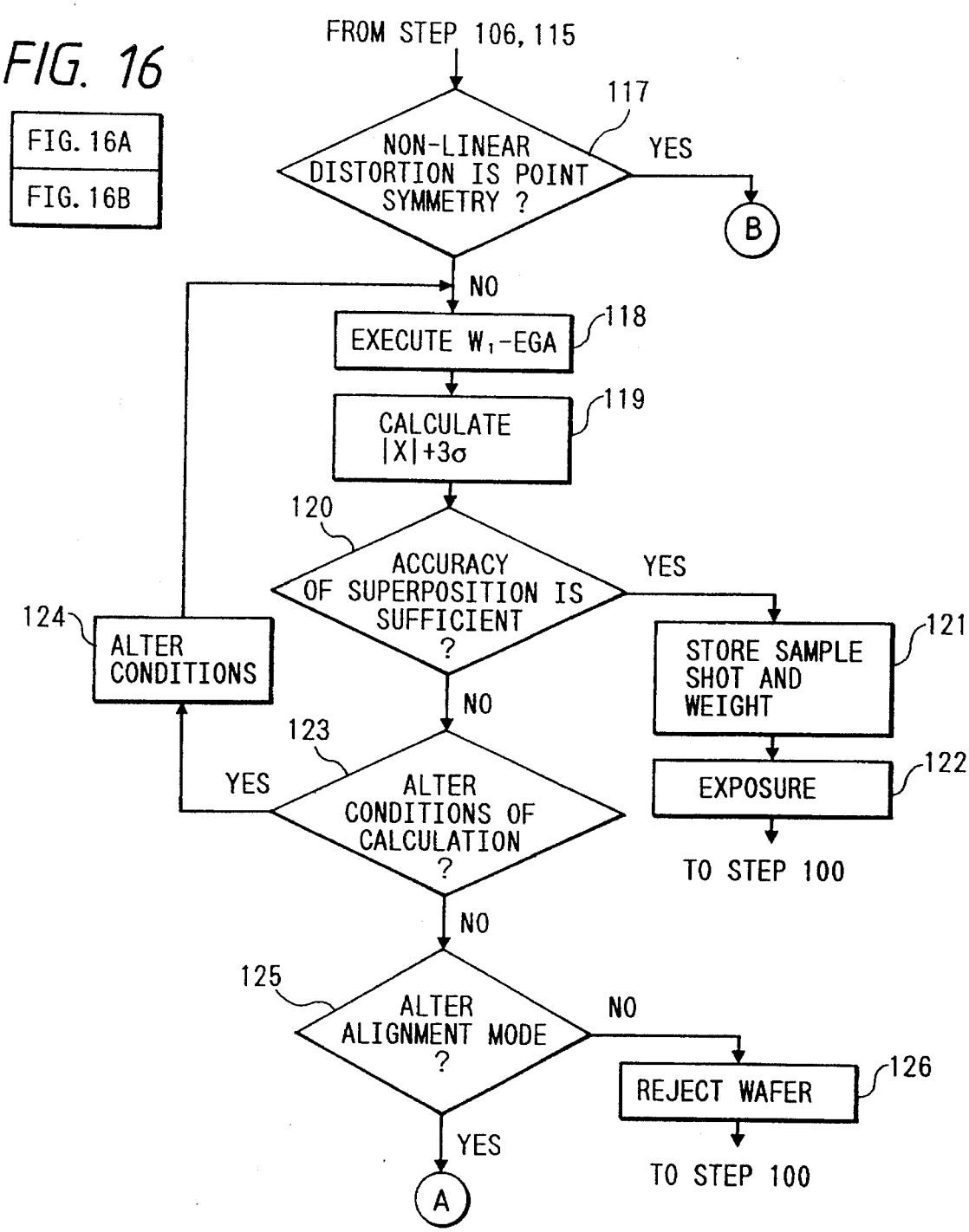

☐ --- FIRST SUMPLE SHOTS GROUP

◯ --- SECOND SUMPLE SHOTS GROUP

△ --- THIRD SUMPLE SHOTS GROUP

☐ --- FIRST SUMPLE SHOTS GROUP

◯ --- SECOND SUMPLE SHOTS GROUP

△ --- THIRD SUMPLE SHOTS GROUP

☐ --- FIRST SUMPLE SHOTS GROUP

◯ --- SECOND SUMPLE SHOTS GROUP

△ --- THIRD SUMPLE SHOTS GROUP

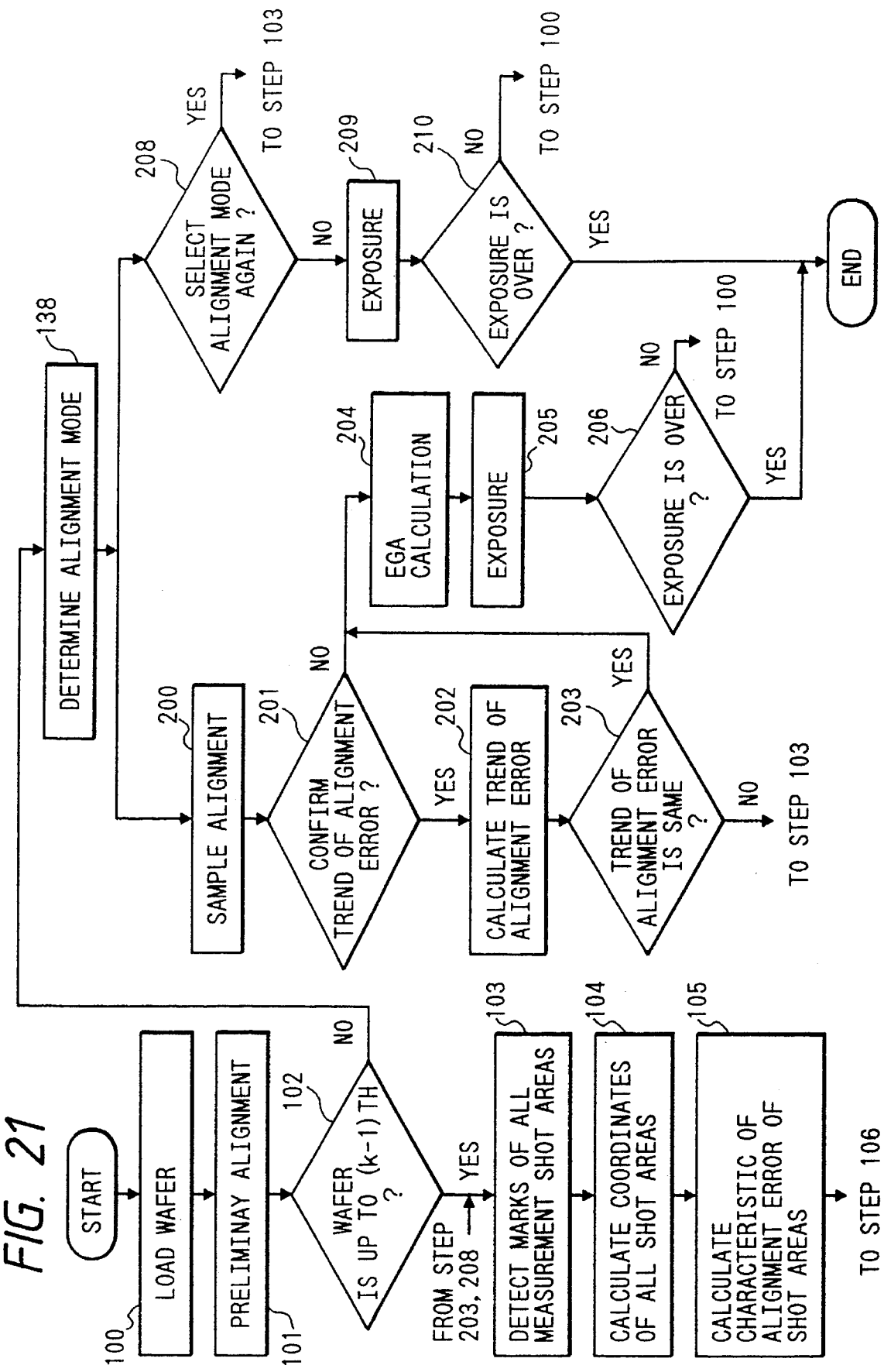

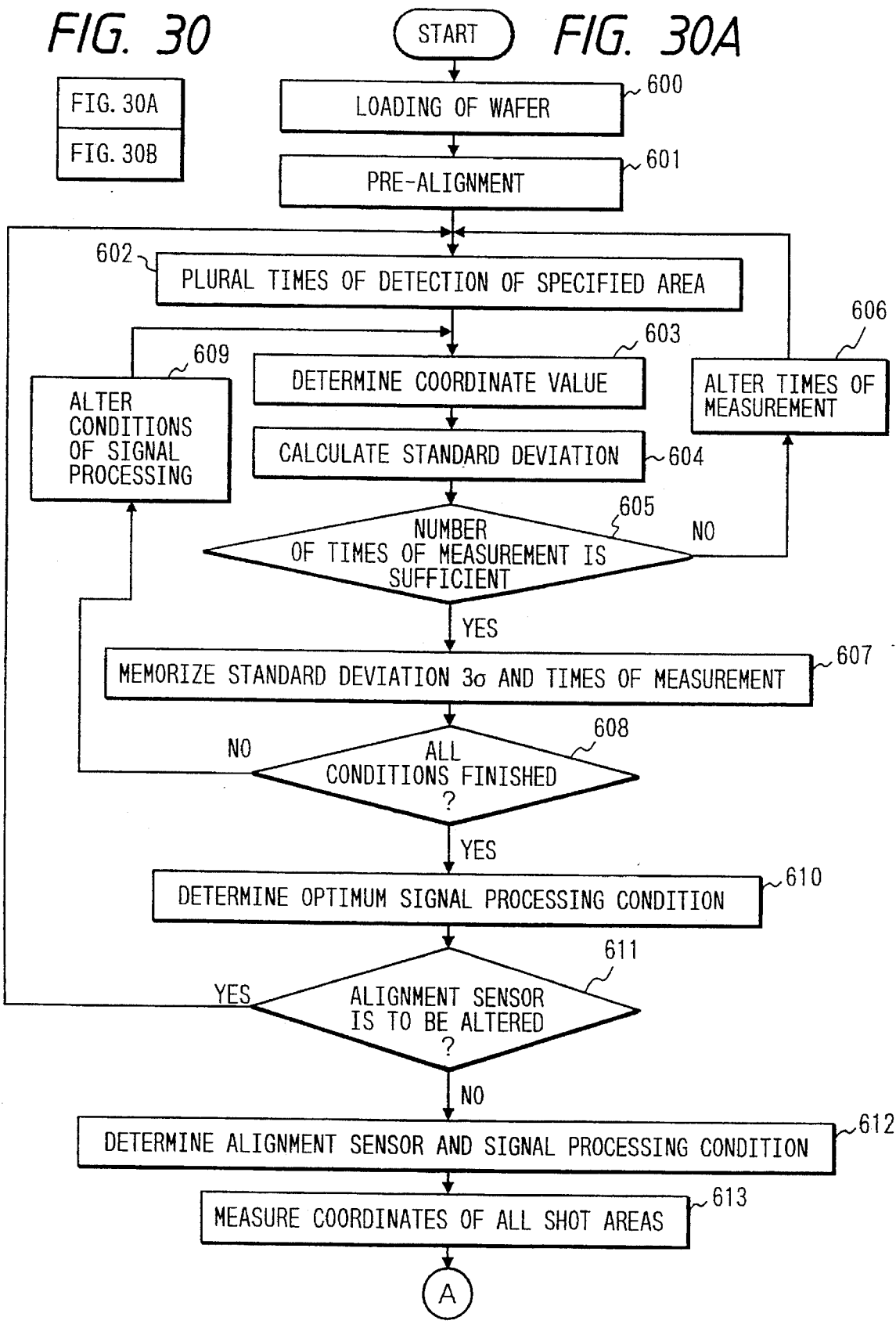

WEIGHTING FACTOR : X 50
Y 50

5,525,808

ALIGNMENT METHOD AND ALIGNMENT APPARATUS WITH A STATISTIC CALCULATION USING A PLURALITY OF WEIGHTED COORDINATE POSITIONS

This application is a continuation-in-part of application Ser. No. 08/174,080 filed Dec. 27, 1993 (abandoned); which is a continuation-in-part of application Ser. No. 8/134,870 filed Oct. 12, 1993 (abandoned); which is a continuation of application Ser. No. 08/005,146 filed Jan. 15, 1993 (abandoned).

BACKGROUND OF THE INVENTION

1. Field of the Invention

The present invention relates to a method and apparatus for aligning each of a plurality of processing areas (shot areas, chip patterns) aligned on a substrate to a predetermined reference position and, more particularly, to an alignment method and apparatus suitable for an exposure apparatus used in a lithography process in the manufacture of semiconductor elements and liquid crystal display elements.

2. Related Background Art

In a step-and-repeat exposure apparatus, a step-and-scan exposure apparatus, a wafer prober, a laser repair apparatus, or the like, each of a plurality of chip pattern areas (shot areas) aligned on a substrate must be aligned to a predetermined reference point (e.g., a process point of each apparatus) on a static coordinate system for defining the moving position of the substrate with a very high accuracy. In particular, in the exposure apparatus, when a substrate (a semiconductor wafer, a glass plate, or the like) is aligned to an exposure position of a pattern formed on a mask or a reticle (to be referred to as a reticle hereinafter), a high accuracy of alignment must be stably maintained so as to prevent a decrease in yield caused by production of a defect of a chip in a manufacturing process.

Normally, in a lithography process, 10 or more layers of circuit patterns (reticle patterns) are superposed and exposed on a wafer. In this case, if an accuracy of alignment (superposition) between two each adjacent layers is low, circuit characteristics deteriorate. More specifically, a chip cannot satisfy required characteristics. In the worst case, the chip becomes a defective product, and decreases the yield. Thus, in an exposure process, an alignment mark is provided to each of a plurality of shot areas on the wafer, and the mark position (coordinate value) is detected with reference to a reticle pattern to be superposition-exposed. Thereafter, wafer alignment for aligning one shot area on the wafer to the reticle pattern is performed on the basis of the mark position information.

The wafer alignment can be roughly classified to two methods. One method is a die-by-die (D/D) alignment method for detecting an alignment mark for each shot area on a wafer and performing alignment. The other method is a global alignment method for obtaining a shot alignment rule by detecting alignment marks of some shot areas on a wafer, and performing alignment of the shot areas. In the current state, a device manufacturing line mainly adopts the global alignment method in consideration of throughput. In particular, in the current state, as disclosed in, e.g., U.S. Pat. No. 4,780,617, an enhanced global alignment (EGA) method for specifying a shot alignment rule on a wafer by a statistic technique with a high accuracy is popular.

In the EGA method, the coordinate positions of only a plurality of shot areas (three or more areas are required, normally about 10 to 15 areas) selected as specific shot areas on a single wafer are measured. After the coordinate positions (shot alignment) of all the shot areas on the wafer are calculated from these measurement values using statistic calculation processing (method of least squares), stepping of a wafer stage is uniquely executed according to the calculated shot alignment. The EGA method requires only a shot measurement time, and an averaging effect for random measurement errors can be expected.

The statistic processing method used in the EGA method will be briefly described below. Designed alignment coordinates of m (m is an integer satisfying $m \geq 3$) specific shot areas (sample shots) on a wafer are represented by $(X_n, Y_n)$ ($n=1, 2, \ldots, m$), and a linear model given by the following equation is assumed for a shift $(\Delta X_n, \Delta Y_n)$ from the designed alignment coordinates.

$$\begin{bmatrix} \Delta X_n \\ \Delta Y_n \end{bmatrix} = \begin{bmatrix} a & b \\ c & d \end{bmatrix} \begin{bmatrix} X_n \\ Y_n \end{bmatrix} + \begin{bmatrix} e \\ f \end{bmatrix} \quad (1)$$

Furthermore, if actual alignment coordinates (measurement values) of the m sample shots are represented by $(\Delta x_n, \Delta y_n)$, a square sum E of residuals obtained upon application of this model is expressed by:

$$E = \Sigma\{(\Delta x_n - \Delta X_n)^2 + (\Delta y_n - \Delta Y_n)^2\} \quad (2)$$

Thus, parameters $a$, b, c, d, e, and f for minimizing this equation need only be obtained. In the EGA method, the alignment coordinates of all shot areas on a wafer are calculated on the basis of the parameters $a$ to f calculated as described above and the designed alignment coordinates.

As described above, the EGA method processes shot alignment errors on a wafer as linear errors. In other words, the EGA calculation is a linear approximation. For this reason, the EGA method cannot cope with a variation in local alignment errors on a wafer, i.e., non-linear factors. In order to solve this problem, as disclosed in, e.g., U.S. Pat. No. 4,833,621, a so-called block-EGA (B-EGA) method has been proposed. In this method, at least three shot areas present in a local partial block on a wafer are designated as sample shots, and their coordinate positions are measured. Then, the EGA calculation (statistic calculation) is performed using these plurality of coordinate positions, thereby calculating coordinate positions (shot alignment) of all shot areas in the block. The B-EGA method is characterized in that sample shots to be used in the EGA calculation are changed in units of shot areas to be aligned. For example, three or more shot areas are designated as sample shots in the order of areas close to a shot area to be aligned, and the measurement values of the designated sample shots are used. Thus, the variation (non-linearity) in local alignment errors on a wafer can be coped with.

However, in the above-mentioned prior art, when processing for selecting sample shots to be used in the EGA calculation in units of shot areas to be aligned is executed by a computer, it requires a huge calculation amount. Also, it is difficult to optimize selection of sample shots in units of shot areas in a block. Therefore, although the B-EGA method can cope with a variation in local alignment errors (non-linear distortion), but an accuracy of alignment obtained by this method cannot sufficiently satisfy a required. accuracy. Furthermore, in the B-EGA method, since sample shots are changed in units of shot areas, the number of sample shots per wafer is considerably increased, and the processing time per wafer is prolonged, resulting in a decrease in throughput.

When a wafer is placed on a wafer stage via a holder (holding member), if the wafer is largely warped due to, e.g., a heat treatment, the peripheral portion of the wafer is chucked by the holder, but its central portion cannot be checked by the holder and is lifted therefrom. Therefore, shot areas on the wafer suffering from the above-mentioned phenomenon, in particular, shot areas near the central portion of the wafer, are apparently laterally shifted (displaced) in a direction away from the center of the wafer relative to the corresponding shot areas on a wafer whose entire surface is chucked by the holder.

When the B-EGA method is applied to a wafer which suffers from a non-linear distortion caused by the above-mentioned phenomenon, if a lifted portion of the wafer is accurately determined, a decrease in accuracy of alignment can be prevented to some extent in correspondence with the non-linear distortion. However, in this case, the same problems (increases in calculation amount and the number of sample shots, and the like) as described above are posed, and it is difficult to specify the lifted (bulged) portion of the wafer in practice. More specifically, in the B-EGA method, since a plurality of shot areas on a wafer cannot be optimally grouped into blocks, it is difficult to obtain a desired accuracy of alignment even when the B-EGA method is applied.

If, for example, a non-linear approximation using a high-order function is applied to a wafer suffering from a non-linear distortion in place of the linear approximation as in the EGA method, a decrease in accuracy of alignment can be prevented. However, in this case, the number of sample shots must be considerably increased as compared to the EGA method, and the mark measurement time is prolonged, resulting in a decrease in throughput.

A projection exposure apparatus can use various methods as well as the above-mentioned D/D method, EGA method, and B-EGA method. Therefore, in future, a plurality of methods (to be referred to as alignment modes hereinafter) should be selectively used in consideration of their features (merits). Thus, prior to actual exposure, test printing (superposition exposure) is performed on pilot wafers using each of the plurality of alignment modes, and an optimal alignment mode is selected (determined) on the basis of the test printing result (accuracy of superposition). However, this method requires pilot wafers, and test printing and measurement of the accuracy of superposition require much time, resulting in a low throughput of the apparatus.

Furthermore, in the projection exposure apparatus, marks on a wafer are detected by using an alignment sensor, and mark positions are determined by performing waveform processing with respect to the detection signals under predetermined processing conditions. In this case, a desired accuracy of superposition (alignment) cannot be obtained unless the signal processing condition is optimized in units of process wafers in accordance with the material of a wafer, the type of photoresist or underlayer, the formation conditions (e.g., shape and degree of unevenness) of alignment marks, and the like. Conventionally, an operator determines signal processing conditions for each wafer, by trial and error, on the basis of his/her experience. For this reason, it takes much time for optimization, and the load on the operator is heavy.

Especially in the EGA scheme, a desired accuracy of superposition cannot be obtained unless the arrangement (the number and positions) of sample shots is optimized. In order to solve such problems, test printing (superposition exposure) may be performed on pilot wafers in various sample shot arrangements by the EGA scheme, thus obtaining the optimal sample shot arrangement on the basis of the test results. However, this method requires a large number of pilot wafers, and takes much time to achieve optimization.

In addition, assume the accuracy of measurement of the alignment sensor is poor owing to the roughness and the like of a wafer surface. In this case, even if superposition exposure is performed by using the EGA scheme after the sample shot arrangement is optimized in the above-described manner, a desired accuracy of superposition cannot be obtained. That is, a sample shot arrangement determined on the basis of coordinate positions (measurement values) with poor reliability is not always optimized with respect to a wafer (shot arrangement), and hence a desired accuracy of superposition cannot be obtained with an apparently optimized sample shot arrangement.

In order to obtain a desired accuracy of superposition with an alignment sensor exhibiting low repeatability of measurement with respect to wafers, the averaging effect of the EGA scheme must be improved, that is, the averaging effect must be optimized such that the number of sample shots is increased as compared with a normal operation. However, in the above-described optimization method, a sample shot arrangement satisfying a desired accuracy of superposition is simply selected regardless of the repeatability of measurement of an alignment sensor. In some case, therefore, the arrangement is simply optimized by a small number of sample shots regardless of the fact that an alignment sensor with poor repeatability of measurement is used. This operation is equivalent to apparent optimization of a sample shot arrangement. That is, in the conventional method, it is impossible to optimize a sample shot arrangement also in consideration of the repeatability of measurement of an alignment sensor. Even if, therefore, the repeatability of measurement of the alignment sensor deteriorates depending on a wafer, the resultant deterioration in accuracy of superposition cannot be prevented.

Although it is considered that all the wafers of the same lot have substantially the same surface state, the repeatability of measurement of an alignment sensor may change in the use of wafers of different lots. For this reason, test printing needs to be performed in units of lots to optimize a sample shot arrangement or the above-mentioned signal processing condition, resulting in a great increase in operation time and load. Moreover, optimization cannot be performed in consideration of the repeatability of measurement of an alignment sensor without using process wafers. Therefore, process wafers specially used for measurement are required, resulting in a great reduction in yield and throughput.

SUMMARY OF THE INVENTION

It is a first object of the present invention to provide an alignment method, which requires only a small number of sample shots even for a wafer suffering from local alignment errors (non-linear distortion), and can align shot areas on a wafer with a high accuracy at high speed while suppressing the calculation amount.

It is a second object of the present invention to provide an alignment method and apparatus, which can accurately selectively use a plurality of alignment modes according to a characteristic of a wafer without decreasing the throughput, and can align all shot areas on a wafer with a high accuracy at high speed.

It is the third object of the present invention to provide an alignment method and apparatus which can optimize various processing conditions of alignment modes also in consideration of the type of substrate or the repeatability of measurement of an alignment sensor, and can align all the shot areas on a substrate with a high accuracy and at a high speed.

In a first alignment method of the present invention, which can achieve the first object, the coordinate positions, on a static coordinate systems, of at least three shot areas, which are selected in advance as specific shot areas (sample shots) from a plurality of shot areas on a wafer, are measured. Furthermore, each of the coordinate positions, on the static coordinate system, of the three specific shot areas is weighted according to the distance between a shot area (center point) of interest and each of the three sample shots in units of shot areas on the wafer, and a statistic calculation (a method of least squares, averaging processing, or the like) is executed using the plurality of weighted coordinate positions, thereby determining the coordinate positions, on the static coordinate system, of the plurality of shot areas on the wafer.

In particular, in the first alignment method, when the coordinate position, on the static coordinate system, of a given shot area on the wafer is determined, as the distance between a sample shot and the given shot area is shorter, alignment data (coordinate position) of the sample shot is weighted with a larger coefficient. The weighting coefficient to be multiplied with alignment data of each sample shot is changed according to the deformation state of the wafer, i.e., the non-linear distortion amount.

In a second alignment method, the coordinate positions, on a static coordinate systems, of at least three shot areas, which are selected in advance as sample shots from a plurality of shot areas on a wafer, are measured. Furthermore, each of the coordinate positions, on the static coordinate system, of the three sample shots is multiplied with a weighting coefficient according to the distance (first information) between a shot area of interest and a predetermined point of interest defined in advance on the wafer, and the distance (second information) between the point of interest and each of the three sample shots in units of shot areas on the wafer, and a statistic calculation is executed using the plurality of weighted coordinate positions, thereby determining the coordinate positions, on the static coordinate system, of the plurality of shot areas on the wafer.

In particular, in the second alignment method, when the coordinate position, on the static coordinate system, of a shot area of interest on the wafer is determined, as the distance between a sample shot and the point of interest is closer to the distance between the point of interest and the shot area of interest, alignment data (coordinate position) of the sample shot is weighted with a larger coefficient. The point of interest is set at a center point of deformation (a center point of symmetry) of the wafer. For example, when the wafer is thermally deformed with reference to the center of the wafer, or when the wafer is chucked on a holder while its central portion is lifted (bulged) from the holder, the center point of the wafer is determined as the point of interest. The weighting coefficient to be multiplied with alignment data of each sample shot is changed according to the deformation state of the wafer, i.e., the non-linear distortion amount.

In the second method, the weighting and statistic calculation for alignment data of the sample shots are performed in units of shot areas. In this case, a plurality of shot areas separated by an equal distance from the point of interest, i.e., a plurality of shot areas located on a single circle having the point of interest as the center, have the same weighting coefficient to be multiplied with the coordinate position of each sample shot. For this reason, when a plurality of shot areas are located on a single circle having the point of interest as the center, the above-mentioned weighting and statistic calculation need only be performed for one of these areas to calculate parameters ($a$ to $f$). Then, the coordinate positions of the remaining shot areas can be determined using the calculated parameters ($a$ to $f$). Therefore, when a plurality of shot areas are located on a single circle, the coordinate positions of all the shot areas may be calculated using the same parameters ($a$ to $f$). In this case, the calculation amount for determining the coordinate positions can be advantageously decreased.

A third alignment method is effective for a case wherein, for example, a wafer is held by a holder to be locally lifted (bulged) from the holder. In the third alignment method, the coordinate positions, on a static coordinate systems, of at least three shot areas, which are selected in advance as sample shots from a plurality of shot areas on the wafer, are measured. Furthermore, each of the coordinate positions, on the static coordinate system, of the three sample shots is corrected on the basis of a flatness of the wafer, and a statistic calculation is executed using the plurality of corrected coordinate positions, thereby determining the coordinate positions, on the static coordinate system, of the plurality of shot areas on the wafer. The moving position of the wafer is controlled in accordance with the calculated coordinate positions and the flatness of the wafer, thereby sequentially aligning each of the plurality of processing regions to a reference position.

Furthermore, a fourth alignment method is also effective for a case wherein, for example, a wafer is held by a holder to be locally lifted (bulged) from the holder. In the fourth alignment method, at least three shot areas are selected as sample shots from a plurality of shot areas on a wafer. Furthermore, when the surfaces of the selected sample shots are almost parallel to a moving plane (a static coordinate system, i.e., a plane including an orthogonal coordinate system defined by two interferometers), the coordinate position, on the static coordinate system, of each of the three sample shots is obtained. In this case, the inclination amount of the surface of a sample shot of interest with respect to the moving plane of the wafer upon measurement of the coordinate position of the sample shot of interest is detected using, e.g., a surface position detection system, and the coordinate position of the sample shot of interest can be corrected using the detection value. Alternatively, after the surface of the sample shot of interest is set to be substantially parallel to the moving plane of the wafer using the surface position detection system, the coordinate position of the area of interest may be measured, or shot areas whose surfaces are substantially parallel to the moving plane of the wafer are selected as sample shots, and the coordinate positions of the selected shot areas may be measured. Furthermore, a statistic calculation is executed using the plurality of detected coordinate positions, thereby calculating the coordinate positions, on the static coordinate system, of the plurality of shot areas on the wafer. Then, the moving position of the wafer is controlled in accordance with the calculated coordinate positions and the inclination amount of each shot area with respect to the moving plane of the wafer, thereby sequentially aligning each of the plurality of processing regions to a reference position.

As described above, the first object of the present invention is to provide an alignment method, which can align all shot areas of even a wafer suffering from a "non-linear distortion" to a predetermined reference position with a high accuracy. Thus, an explanation about the "non-linear distortion" as a target upon improvement of accuracy by the alignment method for achieving the first object will be given below with reference to FIGS. 10A to 10C. FIGS. 10A to 10C are graphs showing position measurement results (indicated by ○ in FIGS. 10A to 10C) of a plurality of (four in this case) specific shot areas (sample shots) on a wafer. The amount of displacement is plotted along the ordinate, and the position from the center of the wafer is plotted along the abscissa. For the sake of simplicity, assume that only scaling (expansion/contraction) is present in the wafer.

In FIG. 10A, upon formation of a linear approximation formula from alignment data (coordinate positions) of the sample shots using the method of least squares, the formula represents a solid line in FIG. 10A. In the case of FIG. 10A, since the alignment data are sufficiently approximated by a linear function (line), it is considered that the wafer suffers from linear scaling errors (distortion). The conventional EGA method adopts such an approximation method. In contrast to this, in FIG. 10B, since alignment data (○) are plotted on a slow dotted curve, it is considered that the wafer suffers from a "regular non-linear distortion". In FIG. 10C, since alignment data (○) have no rule, it is considered that the wafer suffers from an "irregular non-linear distortion".

When the conventional EGA method is directly applied to FIGS. 10B and 10C to obtain linear approximation formulas as in FIG. 10A, the formulas represent solid lines in FIGS. 10B and 10C. As can be seen from FIGS. 10B and 10C, there are shot areas having poor accuracy of alignment in either case. In other words, there are shot areas which cannot be approximated by the linear function. More specifically, it is theoretically impossible for the conventional EGA method to correct a non-linear distortion. Thus, the alignment method for achieving the first object of the present invention particularly aims at correcting the "regular non-linear distortion" (FIG. 10B) of non-linear distortions, and can accurately align all shot areas on a wafer to a reference position even when the wafer suffers from the "regular non-linear distortion".

The first alignment method is effective for the "regular non-linear distortion", and pays attention to the fact that "alignment errors in local areas on a wafer are almost equal to each other even when the wafer suffers from the regular non-linear distortion". Therefore, in the first alignment method, when the coordinate position, on the static coordinate system, of one processing area (shot area) of interest on a wafer is determined, alignment data (coordinate position) of each of at least three specific shot areas (sample shots) is weighted according to the distance between the shot area of interest and each sample shot. More specifically, as the distance between a sample shot and the shot area of interest is shorter, alignment data (coordinate position) of the sample shot is weighted with a larger coefficient.

For this reason, even when a wafer has local alignment errors (regular non-linear distortion), the coordinate positions (shot alignment) of all shot areas on the wafer can be accurately determined. In addition, since alignment data (the coordinate positions of at least three sample shots) to be used in units of shot areas are common to all shot areas, alignment data to be used need not be selected in units of shot areas, and the calculation amount can be decreased. Furthermore, when a weighting function is arbitrarily selected (or is optimized according to a wafer), the degree of weighting for alignment data can be easily changed (or weighting can be optimized). More specifically, the coordinate positions of all the shot areas can be determined under optimal processing conditions (calculation parameters) in units of wafers.

The second alignment method is effective for a "regular, especially, point-symmetric non-linear distortion", and pays attention to the fact that "the magnitudes of alignment errors at positions separated by an equal distance from the center point of symmetry on a wafer are almost equal to each other even when the wafer has a regular, i.e., point-symmetric non-linear distortion". Therefore, in the second alignment method, when the coordinate position, on the static coordinate system, of one processing area (shot area) of interest on a wafer is determined, alignment data (coordinate position) of each of at least three specific shot areas (sample shots) is weighted according to the distance between the shot area of interest and a point of interest (center point of symmetry) regulated in advance on the wafer, and the distance between the point of interest and each sample shot. More specifically, as the distance between a sample shot and the point of interest is closer to the distance between the point of interest and the shot area of interest, the alignment data of the sample shot is weighted with a larger coefficient. In particular, when the wafer is thermally deformed with reference to the center of wafer, or when the wafer is chucked by a holder while its central portion is lifted (bulged) from the holder, the center point of the wafer as the center point of symmetry is determined as the point of interest.

For this reason, when the second alignment method is applied to a wafer having point-symmetric local alignment errors (regular non-linear distortion), e.g., for a wafer which is held by a holder while its central portion is lifted from the holder, the coordinate positions of all the shot areas on the wafer can be accurately determined without increasing the number of sample shots, and the same effect as in the first alignment method can be obtained. When the degree of weighting for alignment data is appropriately changed by arbitrarily selecting a weighting function, the coordinate positions of all the shot areas can be determined under optimal processing conditions (calculation parameters) in units of wafers.

Furthermore, the third alignment method is effective for a case wherein, for example, a wafer is held by a holder to be locally lifted (bulged) from the holder. In the third alignment method, when the wafer is chucked by a holder while its arbitrary portion is lifted from the holder, the coordinate positions, on the static coordinate system, of at least three sample shots are corrected (coordinate-converted) on the basis of the flatness of the wafer, and a statistic calculation is executed using the plurality of corrected coordinate positions, thereby calculating the coordinate positions, on the static coordinate system, of a plurality of shot areas on the wafer. When each of the plurality of shot areas is to be aligned to a reference position, the previously calculated coordinate positions and the flatness of the wafer are used. That is, the calculated coordinate positions are re-corrected (coordinate-converted) on the basis of the flatness of the wafer, and the moving position of the wafer is controlled in accordance with the corrected coordinate positions. For this reason, even when the wafer has an arbitrary bulged portion, the coordinate positions of all the shot areas on the wafer can be accurately determined, and the accuracy of alignment can be improved without increasing the number of sample shots.

Also, the fourth alignment method is effective for a case wherein a wafer is held by a holder to be locally lifted (bulged) from the holder as in the case of the third alignment method. In the fourth alignment method, when the surface of each of at least three sample shots is almost parallel to the moving plane of the wafer, the coordinate position of each sample shot is detected. For example, after the surface of a sample shot of interest is set to be substantially parallel to the moving plane of the wafer using the surface position detection system, the coordinate position of the area of interest may be measured. Furthermore, a statistic calculation is executed using the plurality of detected coordinate positions, thereby calculating the coordinate positions, on the static coordinate system, of the plurality of shot areas on the wafer. When each of the plurality of shot areas is to be aligned to a reference position, the previously calculated coordinate positions and the inclination amount of each shot area with respect to the moving plane of the wafer are used. That is, the coordinate position of each shot area is corrected based on the inclination amount of the area, and the moving position of the wafer is controlled in accordance with the corrected coordinate position. For this reason, even when the wafer has an arbitrary bulged portion, the coordinate positions of all the shot areas on the wafer can be accurately determined, and the accuracy of alignment can be improved without increasing the number of sample shots.

As described above, the second object of the present invention to provide an alignment method and apparatus, which can accurately selectively use a plurality of alignment methods (alignment modes) according to the characteristic of a wafer, and can align all shot areas on a wafer with a high accuracy at high speed. The alignment modes to be selectively used, as described above, include the D/D mode, the EGA mode, the above-mentioned first and second alignment methods (to be referred to as a W-EGA mode hereinafter), and the like. The alignment method and apparatus for achieving the second object of the present invention are effective for aligning each of a plurality of shot areas aligned on a wafer to a predetermined reference position on a static coordinate system for defining the moving position of the wafer in units of N (N is an integer satisfying N≧2) wafers.

Thus, in the alignment method for achieving the second object of the present invention, prior to alignment of each of a plurality of shot areas on a k-th (k is an integer satisfying 2≦k≦N) wafer, the coordinate positions, on the static coordinate system, of each of pre-selected shot areas on at least one of first to (k−1)th wafers are measured, and the characteristic of alignment errors (e.g., the presence/absence or the degree of a non-linear distortion) of a plurality of shot areas on the wafer is calculated on the basis of the plurality of coordinate positions. Furthermore, an alignment mode according to the calculated characteristic of the alignment errors is selected from a plurality of alignment modes (D/D, EGA, and W-EGA) for coping with alignment errors of a plurality of shot areas on a wafer, and each of the plurality of shot areas on the k-th wafer is aligned to the reference position using the selected alignment mode.

In particular, for the first one of the first to the (k−1)th wafers, the coordinate positions, on the static coordinate system, of almost all the shot areas on the wafer are measured, and when each of a plurality of shot areas on the first wafer is aligned to the reference position, the previously selected alignment mode is used.

When the EGA or W-EGA mode is selected and used, specific shot areas (sample shots) are selected in advance from a plurality of shot areas on a wafer, i.e., the arrangement (the number and positions) of the sample shots is optimized in advance. At this time, the plurality of shot areas on the wafer are divided into a plurality of groups each including at least three shot areas, and upon selection of at least three sample shots, at least one of the plurality of groups (sample shot groups) is selected.

The alignment apparatus for achieving the second object of the present invention, comprises position measurement means for measuring the coordinate positions of shot areas on a static coordinate system for defining the moving position of a wafer stage, calculation means for calculating a characteristic of alignment errors of a plurality of shot areas on the basis of the coordinate positions, on the static coordinate system, of a plurality of pre-selected shot areas on at least one of first to (k−1)th (2≦k≦N) wafers measured by the position measurement means, selection means for selecting an alignment mode according to the calculated characteristic of the alignment errors from a plurality of alignment modes for coping with alignment errors of a plurality of shot areas on a wafer, and control means for controlling the moving position of the wafer stage according to the selected alignment mode, thereby aligning each of the plurality of shot areas on the wafer to a reference position.

As described above, in the alignment method and apparatus for achieving the second object of the present invention, since the characteristic of a wafer, e.g., the presence/absence or degree of a non-linear distortion, is calculated, an alignment mode for the k-th wafer can be accurately and quickly selected. For this reason, a high accuracy of alignment can always be obtained regardless of the characteristics of wafers, and a decrease in throughput can be minimized. Upon selection of alignment modes, no test printing for pilot wafers are required, and both improvement of the throughput and reduction of the load on operators can be achieved. In particular, in the EGA and W-EGA modes, the calculation conditions, e.g., the arrangement of sample shots, can be optimized as well.

In addition, in another alignment method for achieving the second object of the present invention, the coordinate position, on the static coordinate system, of each of almost all the processing areas on a substrate is measured, and the characteristic (e.g., the presence/absence or degree of a non-linear distortion) of alignment errors of a plurality of shot areas on the wafer is calculated. The plurality of processing areas are then grouped into a plurality of blocks on the basis of the calculated characteristic of the alignment errors. Furthermore, an alignment mode corresponding to the characteristic of the alignment errors of one block of interest, of all the blocks, is selected from a plurality of alignment modes for coping with the alignment errors of the plurality of processing areas on the substrate. Thus, each of the processing areas on the substrate is aligned with a reference position by using the alignment mode selected for each of the plurality of blocks.

As described above, according to this method, a plurality of processing areas arranged on a substrate are grouped into a plurality of blocks in accordance with the characteristic of alignment errors of the processing areas. In addition, an alignment mode corresponding to the characteristic of alignment errors of each block is selected from a plurality of alignment modes. That is, the optimal alignment mode for alignment errors (local substrate distortion) of each block on a substrate can be selected and used. Even if, therefore, a substrate locally having a non-linear distortion is used, all the processing areas on the substrate can be aligned with the reference position with a high accuracy while a decrease in throughput is minimized.

It is the third object of the present invention to optimize various processing conditions in an alignment mode, e.g., a signal processing condition of an alignment sensor and a sample shot arrangement, also in consideration of the type of substrate or the repeatability of measurement of the alignment sensor, and perform alignment of all the shot areas on a substrate with a high accuracy and at a high speed. Therefore, an alignment method for achieving the third object of the present invention is effective in obtaining the coordinate position, on the static coordinate system, of each processing area on a substrate by calculation processing using, e.g., a statistical technique, and aligning each processing area with a predetermined reference position in the static coordinate system by using the obtained coordinate position.

Thus, in the alignment method for achieving the third object of the present invention, when the coordinate positions, on the static coordinate system, of at least three specific processing areas (sample shots) on a substrate are to be measured, the signal processing conditions for measurement signals (i.e., photoelectric signals output from an alignment sensor) obtained from alignment marks attached to the specific processing areas are sequentially changed to obtain the coordinate positions. In addition, statistic calculation processing of the plurality of obtained coordinate positions is performed to obtain conversion parameters ($a$ to f) for each signal processing condition, and deviations (residual errors) between the coordinate positions, of the processing areas, calculated from these conversion parameters and the coordinate positions measured in advance are obtained. The coordinate position, on the static coordinate system, of each of all the processing areas on the substrate is calculated by using one of a plurality of sets of conversion parameters which minimizes this residual error.

As described above, according to this method, since a signal processing condition is optimized to minimize a residual error, each signal condition can be optimized while a superposition error is minimized. In addition, since no test printing is required, a decrease in throughput can be minimized.

Another alignment method for achieving the third object of the present invention includes the first step of measuring a coordinate position of each processing area on a substrate plural times, and determining a first coordinate position by performing statistical calculation processing (e.g., averaging processing) with respect to the plurality of measured coordinate positions, the second step of correcting the first coordinate position in units of specific processing areas (sample shots) in accordance with measurement reliability of each coordinate position, and calculating a second coordinate position of each of a plurality of processing areas by performing statistical calculation processing (e.g., the method of least squares) with respect to the plurality of corrected first coordinate positions, and the third step of determining a processing condition in statistic calculation processing such that a positional offset amount of the first coordinate position of each processing area with respect to the corresponding second coordinate position becomes not more than a predetermined allowable value, wherein statistical calculation processing is performed under the determined processing condition to calculate a coordinate position of each of the plurality of processing areas.

As described above, in this method, the coordinate position of each of a plurality of processing areas on a substrate is measured plural times to determined the first coordinate positions (true coordinate positions) in units of processing areas, and statistical calculation processing is performed after the first coordinate position of each specific processing area (sample shot) is corrected in accordance with the reliability of each coordinate position, thus calculating the second coordinate positions. In addition, processing conditions (a sample shot arrangement, the value of a parameter S, and the like) in statistic calculation processing (EGA or W-EGA calculation processing) such that all the positional offset amounts of the first coordinate positions with respect to the second coordinate positions become a predetermined allowable value or less in all the processing areas. With this operation, processing conditions can be optimized in consideration of even the reliability of each coordinate position (the repeatability of measurement of an alignment sensor). Therefore, a high accuracy of alignment can always be obtained, and a decrease in throughput can be minimized.

BRIEF DESCRIPTION OF THE DRAWINGS

FIGS. 11A to 11E are views for explaining a mark position measurement state by an LSA system;

FIG. 21 is a flow chart showing a modification of the exposure sequence for k-th and subsequent wafers;

DESCRIPTION OF THE PREFERRED EMBODIMENTS

Figure 1:
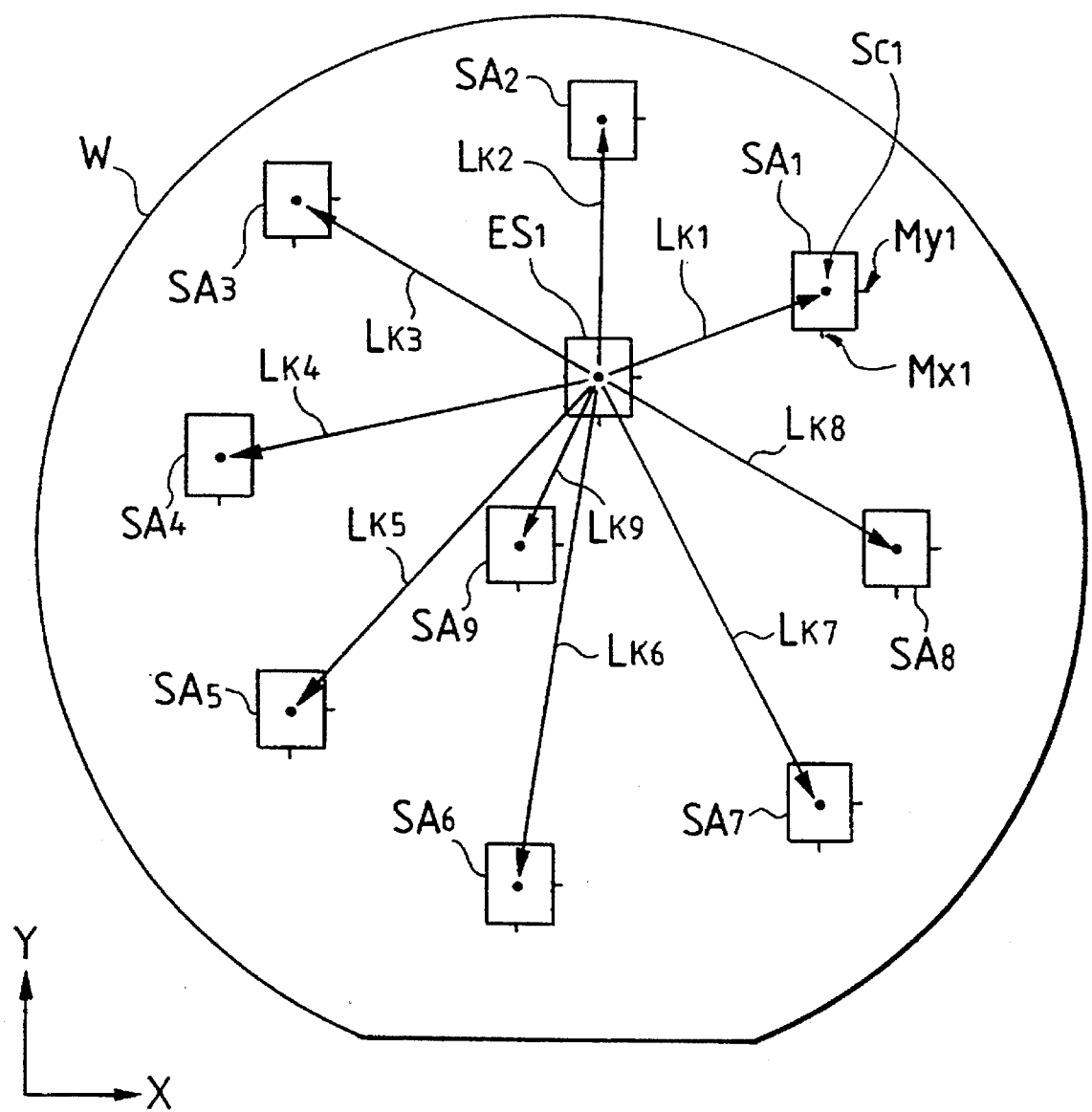
FIG. 1 is a view for explaining an alignment method according to the first embodiment of the present invention.

An alignment method according to the first embodiment of the present invention will be described below with reference to FIG. 1. An alignment method ($W_1$-EGA method) of this embodiment is based on the conventional EGA method, and is characterized in that when the coordinate position of an i-th shot area ESi on a wafer W is determined, alignment data (coordinate positions) of m (m=9 in FIG. 1) sample shots $SA_1$ to $SA_9$ are multiplied with a weighting coefficient $W_{in}$ in accordance with distances $L_{k1}$ to $L_{k9}$ between the area ESi and the nine sample shots $SA_1$ to $SA_9$. In this embodiment, after a pair of alignment marks ($M_{x1}$, $M_{y1}$) of each sample shot are detected using an alignment sensor, a square sum Ei of residuals are evaluated by the following equation (equation (3)) as in equation (2) above, and calculation parameters $\underline{a}$ to f can be determined to minimize equation (3).

In this embodiment, although the same sample shots (alignment data) are used for each shot area, since the distance to each sample shot inevitably varies in correspondence with shot areas, the weighting coefficient $W_{in}$ to be multiplied with the alignment data (the coordinate position of the sample shot) changes in units of shot areas. For this reason, the parameters $\underline{a}$ to f are determined in units of shot areas to calculate the coordinate positions of the shot areas, thereby determining the coordinate positions (shot alignment) of all the shot areas.

$$Ei = \sum_{n=1}^{m} W_{in}\{(\Delta x_n - \Delta X_n)^2 + (\Delta y_n - \Delta Y_n)^2\} \quad (3)$$

In this embodiment, the weighting coefficient $W_{in}$ for alignment data of each sample shot is changed in units of shot areas on the wafer W. For this reason, the weighting coefficient $W_{in}$ is expressed as a function of a distance $L_{kn}$ between the i-th shot area ESi and an n-th sample shot $SA_n$.

$$W_{in} = \frac{1}{\sqrt{2\pi S}} e^{-L_{kn}^2/2S} \quad (4)$$

where S is a parameter for changing the degree of weighting.

As can be seen from equation (4), as the distance $L_{kn}$ between a sample shot and the i-th shot area ESi is shorter, the weighting coefficient $W_{in}$ to be multiplied with the alignment data (coordinate position) of the sample shot is increased.

When the value of the parameter S in equation (4) is sufficiently large, the statistic calculation processing result becomes almost equal to that obtained by the conventional EGA method. On the other hand, when all shot areas to be exposed on a wafer are selected as sample shots, and the value of the parameter S is sufficiently close to zero, the statistic calculation processing result becomes almost equal to that obtained by the D/D method. More specifically, in this embodiment, when the value of the parameter S is appropriately set, an intermediate effect between the EGA method and the D/D method can be obtained.

For example, when the parameter S is set to have a small value for a wafer having a large non-linear component, an effect (accuracy of alignment) substantially equivalent to that of the D/D method can be obtained. More specifically, the alignment method (EGA calculation) according to this embodiment can satisfactorily remove alignment errors caused by non-linear components. When the alignment sensor has poor measurement reproducibility, an effect almost equivalent to that of the EGA method can be obtained by setting the parameter S to have a large value, and alignment errors can be eliminated by an averaging effect.

Furthermore, weighting functions (equation (4)) are respectively prepared for the X-direction alignment mark ($M_{x1}$) and the Y-direction alignment mark ($M_{y1}$), and weighting coefficients $W_{in}$ can be independently set in the X- and Y-directions. For this reason, even when the degree (magnitude) or rule of a non-linear distortion or a step pitch, i.e., the distance between the centers of two adjacent shot areas (a value almost corresponding to a shot size although it depends on the width of a street line on a wafer) of a wafer varies in the X- and Y-directions, shot alignment errors on the wafer can be accurately corrected by independently setting the value of the parameter S. In this case, the parameter S may be set to have different values in the X- and Y-directions, as described above, and the value of the parameter S can be appropriately altered according to the magnitude or rule of a "regular non-linear distortion", the step pitch, the measurement reproducibility of the alignment sensor, or the like even when the parameters S in the X- and Y-directions have either the same value or different values.

As described above, the effect of this embodiment can be changed from the EGA method to the D/D method by appropriately altering the value of the parameter S. Therefore, alignment is flexibly changed in accordance with, e.g., the characteristic (e.g., the magnitude, rule, or the like) of a non-linear component, the step pitch, the measurement reproducibility of the alignment sensor, or the like in correspondence with various layers and components (X- and Y-directions). Thus, alignment can be performed under optimal conditions corresponding to the layers and components.

Figure 9A:
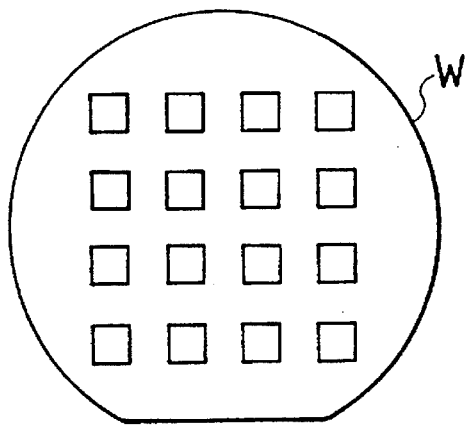
FIGS. 9A and 9B are views showing arrangements of sample shots suitable for the alignment method of the first embodiment.
Figure 9B:
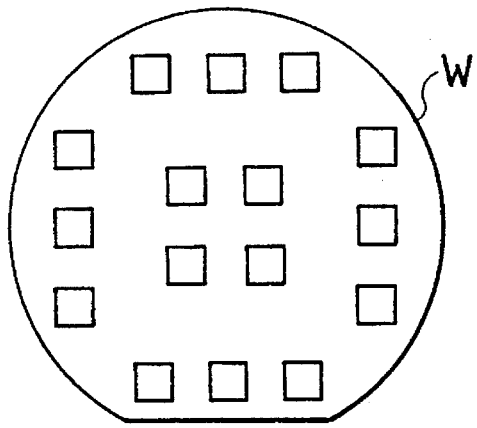
Figure 10A:
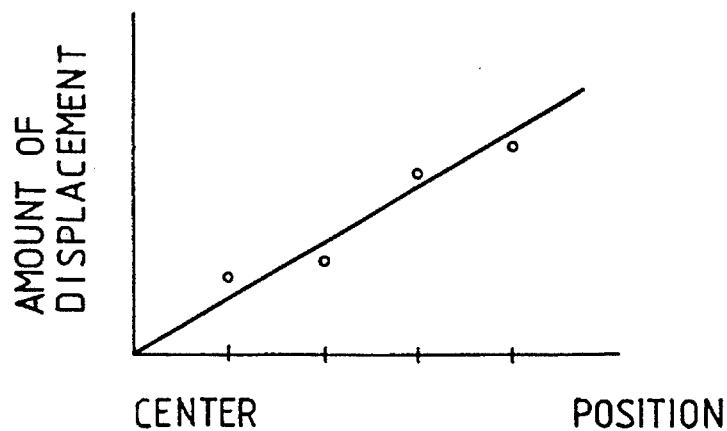
FIGS. 10A to 10C are views for explaining a non-linear distortion to which the alignment methods of the first and second embodiments are to be applied.
Figure 10B:
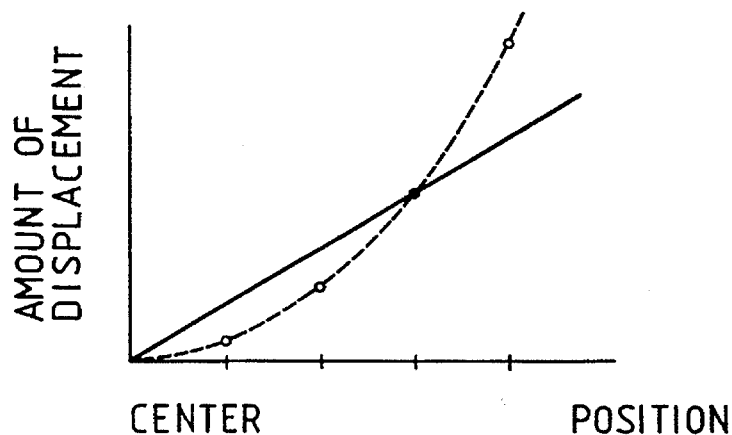
Figure 10C:
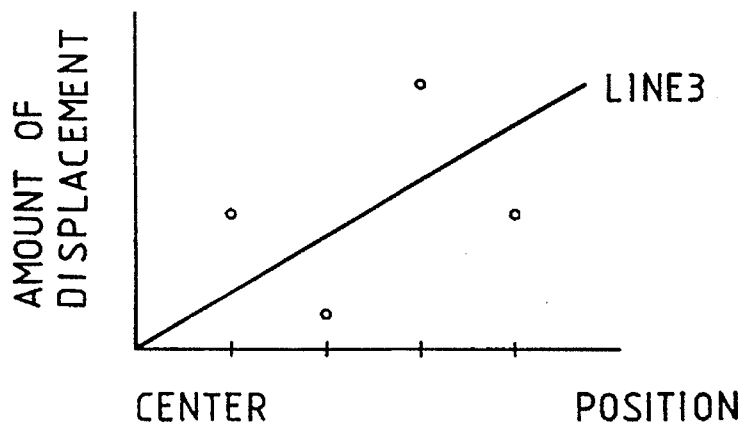

As for the arrangement (the number and positions) of sample shots suitable for this embodiment ($W_1$-EGA method), sample shots can be uniformly set on the entire surface of a wafer, as shown in, e.g., FIG. 9A in place of arranging the sample shots to define a polygon on the peripheral portion of a wafer unlike in the EGA method. In particular, a large number of sample shots may be set in a donut-shaped (ring-shaped) region, as shown in FIG. 9B, so as to increase the density of sample shots on the peripheral portion of the wafer. In FIG. 9B, a plurality of sample shots are set inside the donut-shaped region. In this embodiment, on a wafer, shot areas in a local region where a change in amount of displacement (i.e., the amount of non-linear distortion) is large are preferably selected as sample shots. Furthermore, the number of sample shots set in the local region is preferably set to be larger than other regions.

Figure 4:
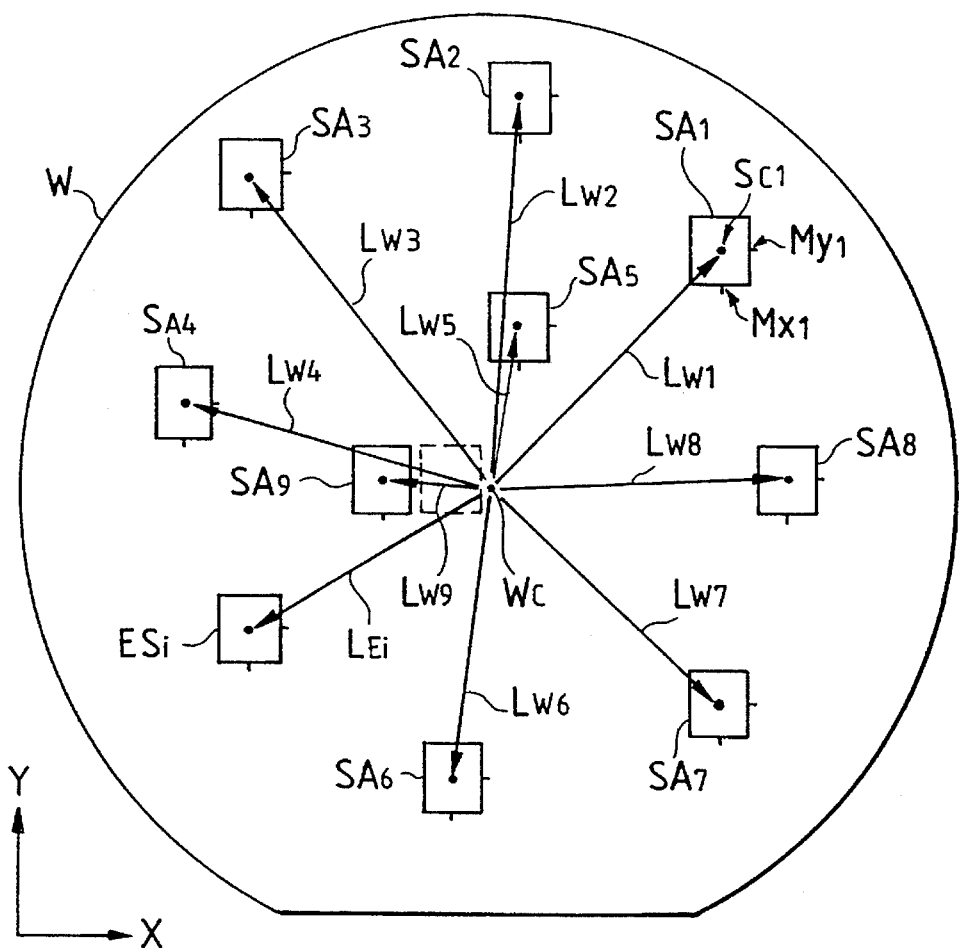
FIG. 4 is a view for explaining an alignment method according to the second embodiment of the present invention.
Figure 5:
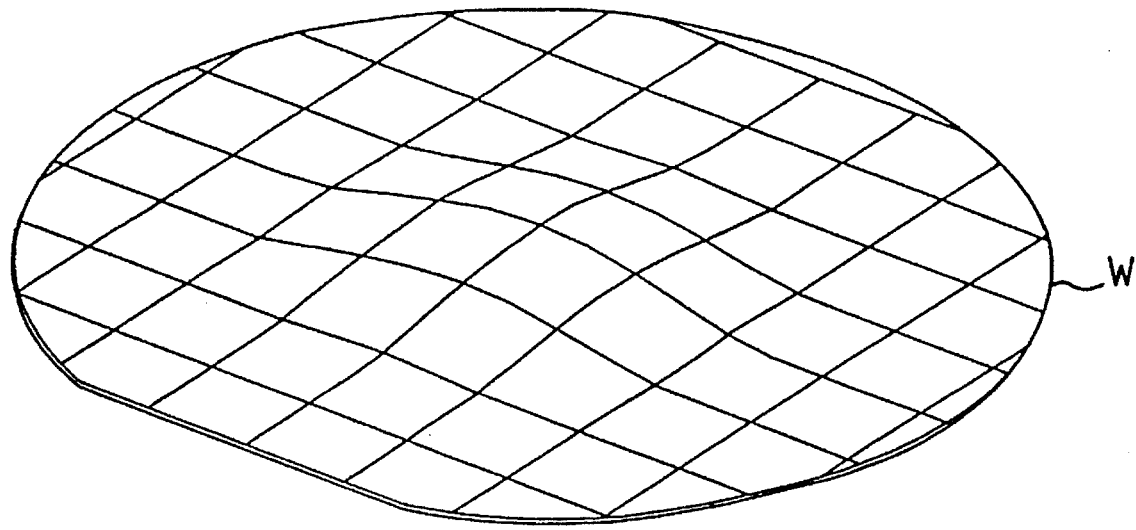
FIG. 5 is a view showing a distorted state of a wafer.
Figure 6:
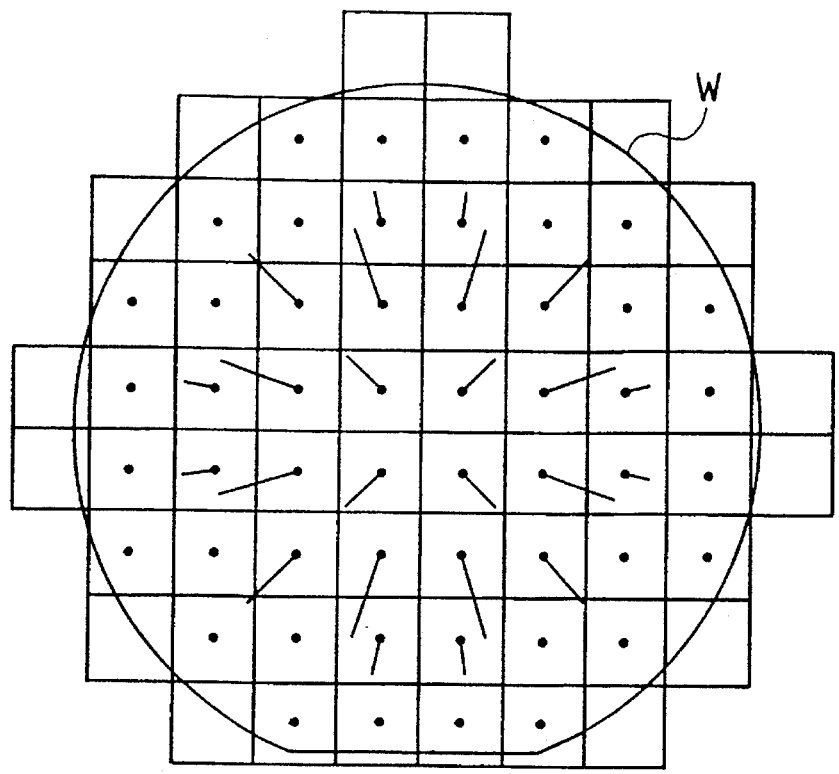
FIG. 6 is a vector map showing the amounts of displacements of shot areas on the wafer shown in FIG. 5 from corresponding ideal gratings.

An alignment method according to the second embodiment of the present invention will be described below with reference to FIG. 4. In this embodiment, an alignment method suitable for a case wherein a wafer W suffers from a regular, especially, point-symmetric non-linear distortion, and more specifically, the wafer W is held by a holder to be bulged with reference to its center $W_c$, as shown in FIG. 5, will be described. FIG. 6 is a vector map showing the amounts of displacements of shot areas on a wafer having a non-linear distortion (FIG. 5) from ideal gratings.

The alignment method ($W_2$-EGA method) of this embodiment is also based on the EGA method, and is characterized in that alignment data of m (m=9 in FIG. 4) sample shots $SA_1$ to $SA_9$ are multiplied with a weighting coefficient $W_{in}'$ according to a distance (radius) $L_{Ei}$ between the center point of deformation (the center point of symmetry) as a point of interest on the wafer, i.e., the wafer center $W_c$ and an i-th shot area ESi on the wafer W and distances (radii) $L_{W1}$ to $L_{W9}$ between the wafer center $W_c$ and the nine sample shots $SA_1$ to $SA_9$. In this embodiment, after a pair of alignment marks ($M_{x1}$, $M_{y1}$) of each sample shot are detected using an alignment sensor, a square sum Ei' of residuals are evaluated by the following equation (equation (5)) as in equation (3) above, and calculation parameters a to f can be determined to minimize equation (5). In this embodiment, since the weighting coefficient $W_{in}'$ to be multiplied with alignment data changes in units of shot areas like in the first embodiment, a statistic calculation is executed in units of shot areas to determine the parameters a to f, thereby determining the coordinate positions of the shot areas.

$$Ei' = \sum_{n=1}^{m} W_{in}'\{(\Delta x_n - \Delta X_n)^2 + (\Delta y_n - \Delta Y_n)^2\} \quad (5)$$

In order to change the weighting coefficient $W_{in}'$ for each sample shot in units of shot areas on the wafer W, the weighting coefficient $W_{in}'$ is expressed as a function of the distance (radius) $L_{Ei}$ between the i-th shot area ESi on the wafer W and the wafer center $W_c$ as follows:

$$W_{in}' = \frac{1}{\sqrt{2\pi S}} e^{-(L_{Ei} - L_{Wn})^2/2S} \quad (6)$$

where S is a parameter for changing the degree of weighting.

As can be seen from equation (6), as the distance (radius) $L_{wn}$ between a sample shot and the wafer center $W_c$ is closer to the distance (radius) $L_{Ei}$ between the wafer center $W_c$ and the i-th shot area ESi on the wafer W, the weighting coefficient $W_{in}'$ to be multiplied with the alignment data is increased. In other words, a largest weighting coefficient $W_{in}'$ is multiplied with alignment data of a sample shot located on a circle having the wafer center $W_c$ as its center and the radius $L_{Ei}$, and the weighting coefficient $W_{in}'$ for alignment data is decreased as the sample shot is radially separated away from the circle.

The value of the parameter S in equation (6) need only be appropriately determined according to a required accuracy of alignment, the characteristic (e.g., the magnitude, rule, or the like) of a non-linear distortion, the step pitch, the measurement reproducibility of the alignment sensor, and the like as in the first embodiment. More specifically, when a non-linear component is relatively large, the parameter S is set to have a small value, thereby eliminating the adverse affect of sample shots having considerably different distances $L_{wn}$ from the wafer center $W_c$. On the other hand, when a non-linear component is relatively small, the parameter S is set to have a large value, thereby preventing a decrease in accuracy of alignment caused by poor measurement reproducibility of the alignment sensor (or layer).

Furthermore, in this embodiment, the weighting of alignment data of sample shots and statistic calculation (i.e., calculation of the parameters a to f) are executed in units of shot areas. However, a plurality of shot areas separated by an almost equal distance from a point of interest (center point of symmetry) on the wafer, i.e., a plurality of shot areas located on a circle having the point of interest as the center have the same weighting coefficients $W_{in}'$ to be multiplied with alignment data of sample shots, as a matter of course. For this reason, when a plurality of shot areas are located on a circle having the point of interest as the center, the above-mentioned weighting and statistic calculation are performed for one of these shot areas so as to calculate the parameters a to f. Then, the coordinate positions of the remaining shot areas can be determined using the calculated parameters a to f. Therefore, when a plurality of shot areas are present on a circle, the coordinate positions of all the shot areas may be determined using the same parameters a to f. In this case, the calculation amount upon determination of the coordinate positions can be decreased.

As for the arrangement of sample shots suitable for this embodiment ($W_2$-EGA method), sample shots are preferably designated to be symmetrical about the center point of symmetry of a non-linear distortion, i.e., the wafer center $W_c$. For example, sample shots can be selected in an X-shaped or cross-shaped pattern with reference to the wafer center $W_c$. Alternatively, a sample shot arrangement as in the first embodiment (FIGS. 9A and 9B) may also be used. When the center point of symmetry of a non-linear distortion is offset from the wafer center, sample shots can be selected in an X-shaped or cross-shaped pattern with reference to the center point of symmetry, as a matter of course. In this embodiment, upon determination of the parameters a to f, the weighting functions (equation (5)) may be independently set in the X- and Y-directions like in the first embodiment. In this case, the shot alignment on the wafer can be accurately calculated by independently setting the values of the parameter S even when the magnitude or rule of a non-linear distortion, the step pitch, and the like vary in the X- and Y-directions.

When S=120 was substituted in equation (6), and the alignment method of this embodiment was applied to a wafer shown in FIG. 5, an accuracy of alignment was X+3σ=0.09 μm. In contrast to this, when the alignment was performed by the EGA method while the above-mentioned arrangement of sample shots remained the same, the alignment error was X+3σ=0.21 μm. Thus, improvement of the accuracy of alignment as compared to the conventional method was confirmed.

In the first and second embodiments, the weighting coefficients $W_{in}$ and $W_{in}'$ given by equations (4) and (6) are determined on the basis of the arrangement of sample shots. Furthermore, in the alignment methods (W-EGA method) of the first and second embodiments, the degree of weighting for alignment data of each sample shot can be changed by the parameter S. A method of determining the parameter S will be described below. For example, when an operator sets a weighting parameter D to be a predetermined value, the parameter S, i.e., the weighting coefficient $W_{in}$ or $W_{in}'$, is automatically determined from equation (7):

$$S = \frac{D^2}{8 \cdot \log_e 10} \quad (7)$$

In this case, the weighting parameter D physically means a sample shot zone (to be simply referred to as a zone hereinafter) effective for calculating the coordinate positions of shot areas on a wafer. Therefore, when the zone is wide, since the number of effective sample shots is increased, a result obtained in this case becomes close to that obtained by the EGA method. Conversely, when the zone is narrow, since the number of effective sample shots is decreased, a result obtained in this case becomes close to that obtained by the D/D method. However, the "zone" is merely a criterion upon weighting, and even if all the sample shots are present outside the zone, a statistic calculation is executed while maximizing the weighting coefficient for alignment data of a sample shot closest to a shot area whose coordinate position is to be determined.

Figure 7:
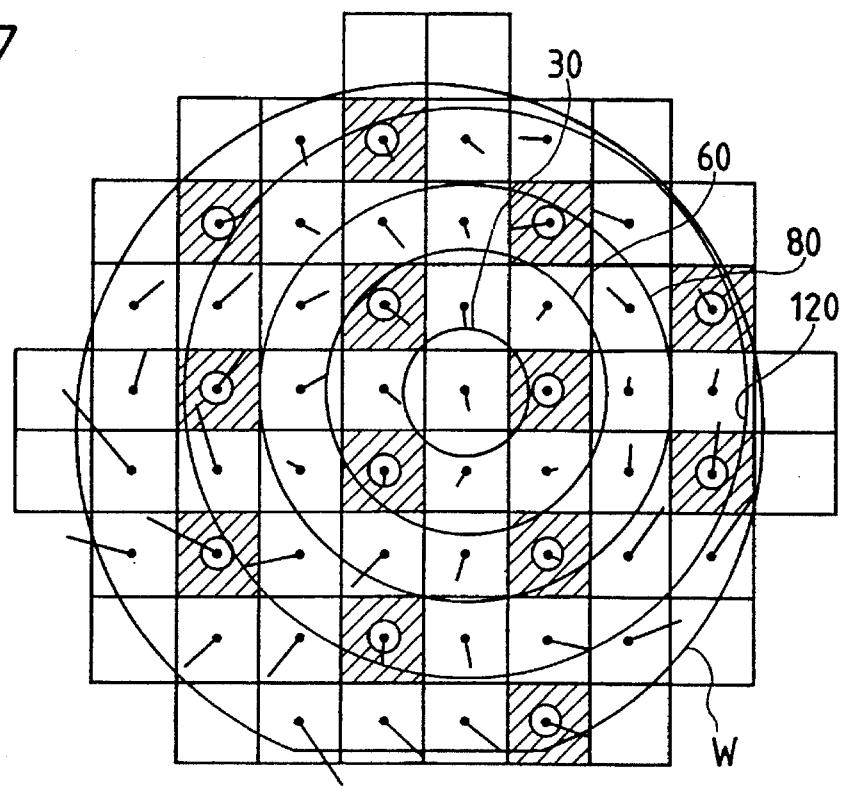
FIG. 7 is a view for explaining a method of determining a parameter S in the first and second embodiments.
Figure 8:
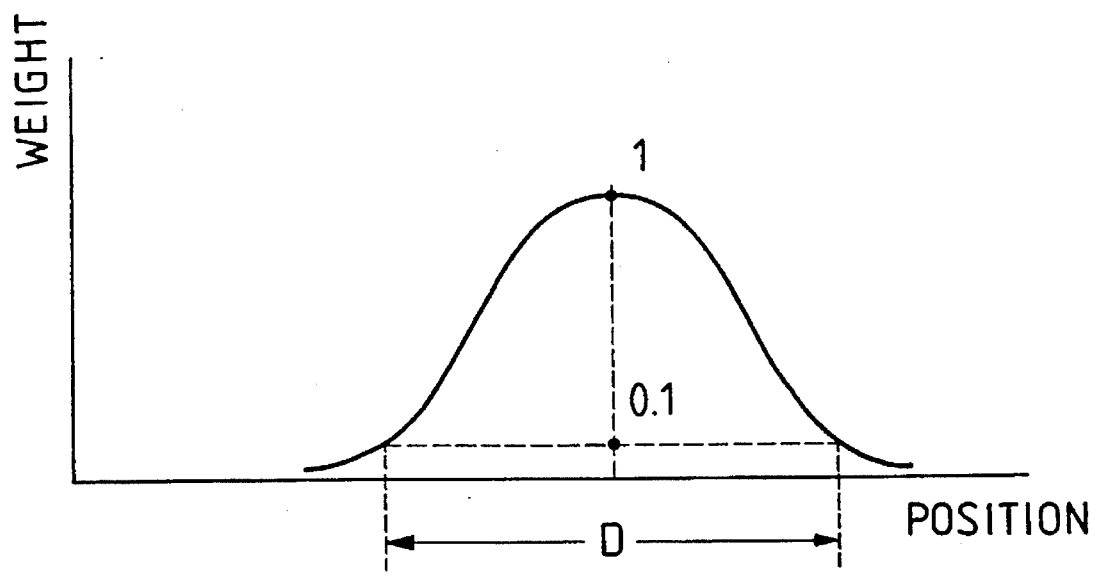
FIG. 8 is a view for explaining another method of determining the parameter S.

FIG. 7 visually shows the sizes of the zone when the weighting parameter D is set to be 30, 60, 90, and 120 [mm]. In this case, the weighting parameter (the diameter of the zone) D defines "the diameter (unit=mm) of a sampling zone whose weighting coefficient value is 0.1 when a weighting coefficient of one shot area, whose coordinate position is to be determined, on a wafer is set to be 1". Note that it was confirmed that an optimal value of the diameter D is normally present in a range from 30 to 150 [mm].

Therefore, in each of the above embodiments, an operator need only input the diameter D of an optimal zone, which is determined by the experience of the operator, or by experiments, or by simulations, to a projection exposure apparatus (main control system 10) via an input device (e.g., a keyboard), thereby determining the degree of weighting for alignment data, i.e., the weighting coefficient $W_{in}$ or $W_{in}'$ given by equation (4) or (6) from equation (7). Therefore, alignment is flexibly changed in accordance with, e.g., the magnitude of a non-linear component, the measurement reproducibility of the alignment sensor, or the like in correspondence with various layers. Thus, alignment can be performed under optimal conditions corresponding to the layers.

In addition to the above-mentioned direct input method of the diameter D of an optimal zone to the projection exposure apparatus by the operator, the following method is available. For example, mark detection of almost all shot areas of the first one of a plurality of wafers stored in a lot is performed. Then, the apparatus itself (or operator) calculates the rule or magnitude of a non-linear distortion of the wafer, and the like on the basis of the detection result so as to determine the diameter D of an optimal zone (the center of distortion of the non-linear distortion as well in the second embodiment). Thus, the weighting coefficient $W_{in}$ or $W_{in}'$ given by equation (4) or (6) can be automatically determined without causing any trouble to an operator. In the second and subsequent wafers, the above-mentioned alignment operation is performed using the weighting function determined using the first wafer.

As for the first wafer, the alignment operation may be performed using the mark detection result, or may be performed by calculating a shot alignment using the weighting function determined as described above. In this case, mark detection (coordinate position measurement) of almost all shot areas is performed for only the first wafer. However, mark detection of almost all shot areas may be performed for several wafers from the first wafer, and the weighting coefficient $W_{in}$ or $W_{in}'$ may be determined by calculating the rule or magnitude of a non-linear distortion using, e.g., averaging processing. Furthermore, the rule or magnitude of a non-linear distortion calculated by the exposure apparatus may be displayed as a vector map, as shown in, e.g., FIG. 6, on a display device (e.g., a CRT), and an operator may determine the diameter D of an optimal zone based on the displayed map and may input the diameter to the apparatus main body.

In the above description, an operator inputs the value of the diameter D of an optimal zone to the apparatus main body. However, the value may be printed in the form of an identification code (e.g., bar codes) on a wafer or on a lot (loader cassette) for storing a plurality of wafers, and the apparatus itself may automatically determine the parameter S from equation (7) by reading the code using a reader (e.g., a bar-code reader). An equation for determining the parameter S is not limited to equation (7), and the following equation (8) may be used.

$$S = \frac{A}{m \cdot C} \quad (8)$$

where A is the area (unit=mm$^2$) of the wafer, m is the number of sample shots, and C is a correction coefficient (positive real number).

In equation (8), since a change in wafer size (area) or the number of sample shots is reflected in determination of the parameter S, an optimal value of the correction coefficient C to be used in determination is prevented from being varied largely. When the correction coefficient C is small, since the value of the parameter S is increased, a result obtained in this case becomes close to that obtained by the EGA method as in the case of equation (7). Conversely, when the correction coefficient C is large, since the value of the parameter S is decreased, a result obtained in this case becomes close to that obtained by the D/D method as in the case of equation (7). Therefore, the correction coefficient C, which is determined in advance by experiments or by simulations, need only be input to the exposure apparatus via an operator or an identification code reader, thereby automatically determining the degree of weighting to alignment data, i.e., the weighting coefficient $W_{in}$ or $W_{in}'$ given by equation (4) or (6) from equation (8). For this reason, alignment is flexibly changed in accordance with, e.g., the characteristic (e.g., the magnitude, rule, or the like) of a non-linear component, the step pitch, the measurement reproducibility of the alignment sensor, or the like in correspondence with various layers and components (X- and Y-directions). Thus, alignment can be performed under optimal conditions corresponding to the layers and components. In particular, when equation (8) is used, even when the wafer size, the step pitch (shot size), the number of sample shots, or the like is changed, the coordinate positions of all shot areas on a wafer can be accurately determined independently of the change, and alignment can always be performed with a stable accuracy.

In each of the above embodiments, m sample shots are selected from a plurality of shot areas on a wafer, and a statistic calculation is executed using weighted alignment data of the selected sample shots. At this time, when neither of the pair of alignment marks of a certain sample shot can be measured, or credibility of the measurement values of the alignment marks is doubtful (reliability is low), a shot area near this sample shot may be designated as an alternative shot, and alignment data of the designated alternative shot may be used. Alternatively, a sample shot whose alignment marks cannot be measured or are measured with a low reliability may be rejected, or a weighting coefficient to be multiplied with alignment data of such a sample shot may be set to be zero, and alignment data of only the remaining sample shots may be used. When one (e.g., an X mark) of the pair of alignment marks of a certain sample shot cannot be measured, or the measurement value of one alignment mark has a low reliability, the coordinate position of the other alignment mark (Y mark) alone is used. Alternatively, the X mark of a shot area near the corresponding sample shot may be detected, and its coordinate position may be used.

Figure 2:
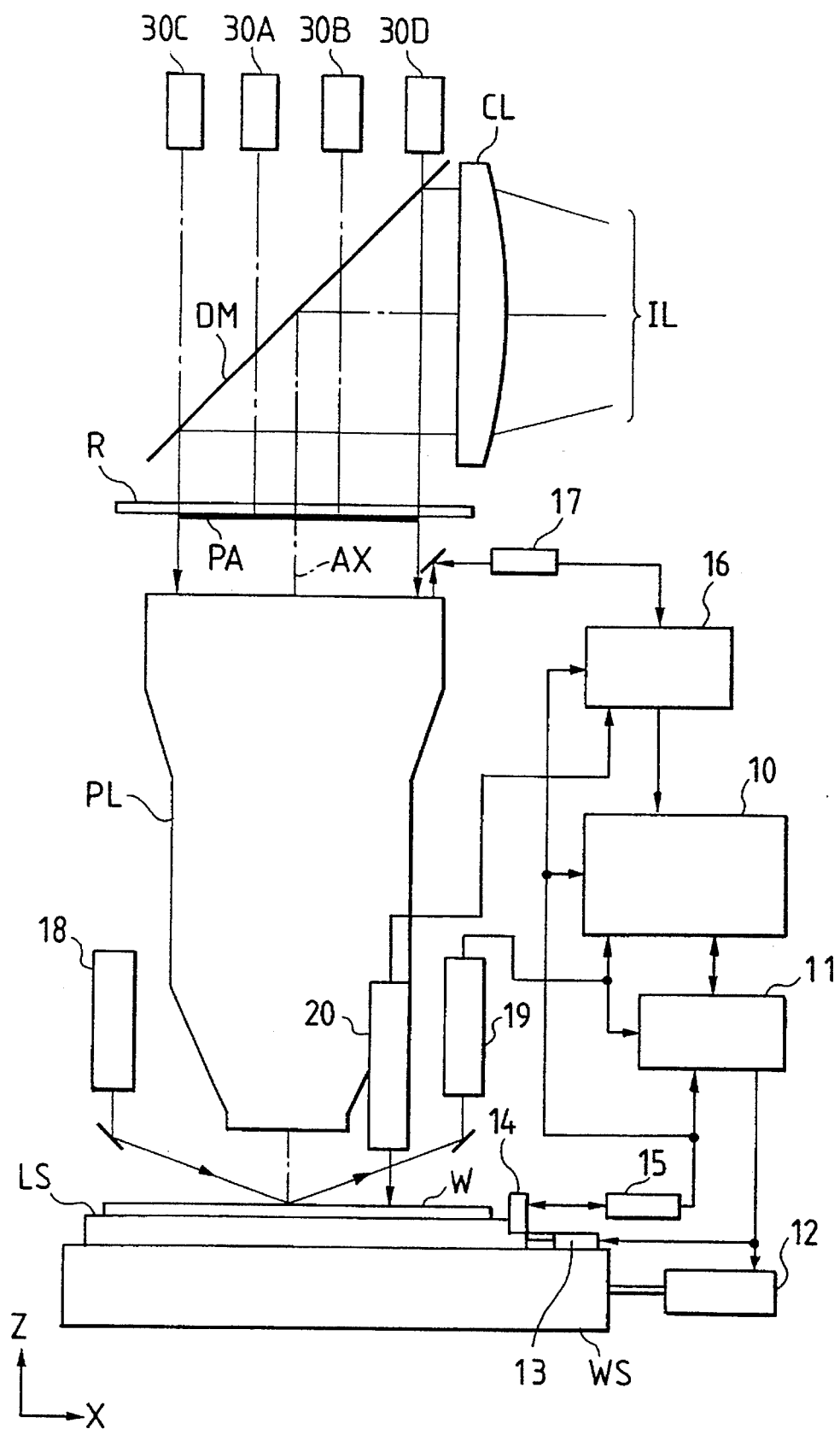
FIG. 2 is a schematic view showing an arrangement of a projection exposure apparatus comprising an alignment apparatus according to an embodiment of the present invention.
Figure 3:
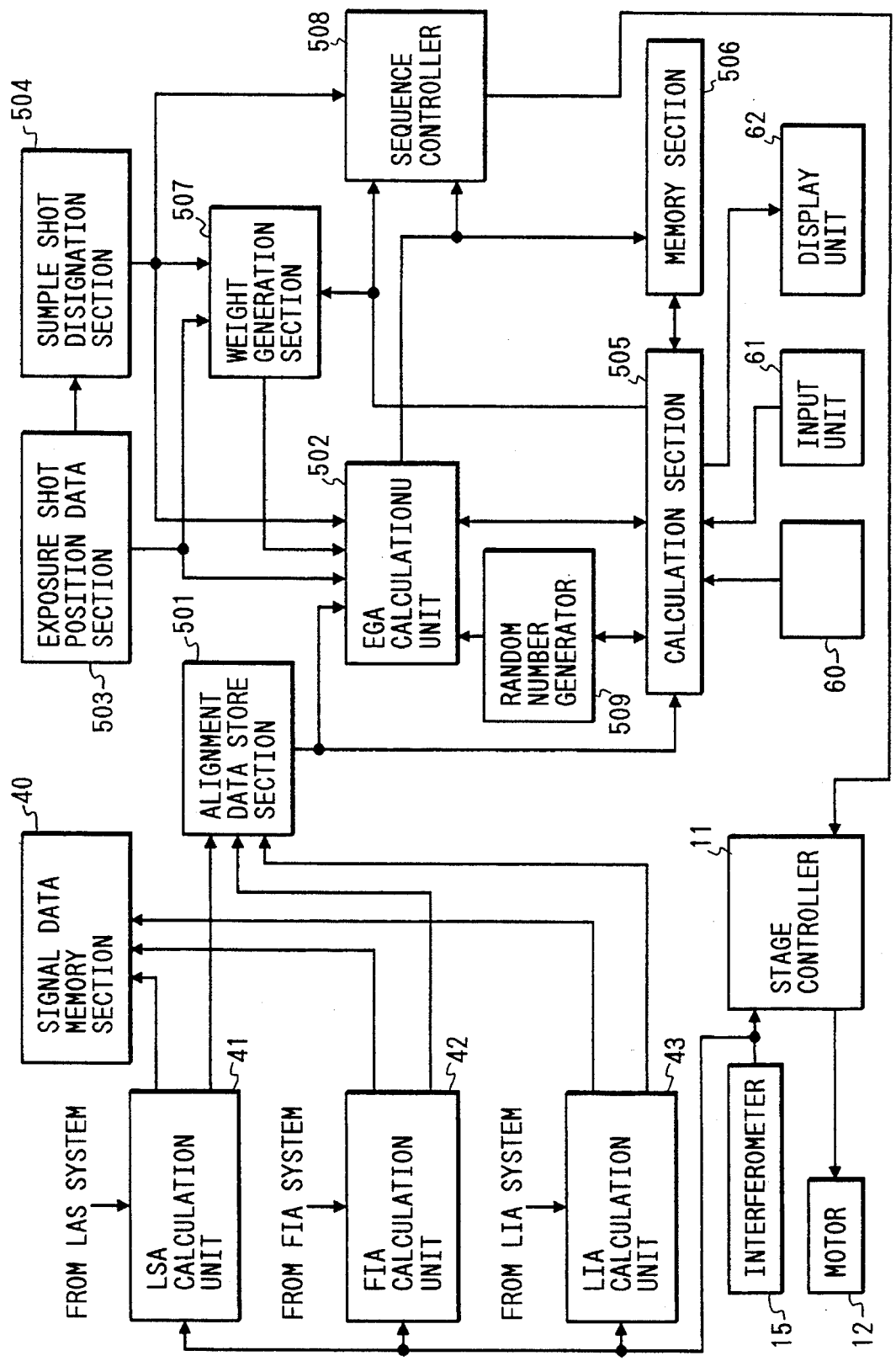
FIG. 3 is a block diagram showing a control system of the projection exposure apparatus shown in FIG. 2.

An alignment apparatus according to an embodiment of the present invention will be described below with reference to FIGS. 2 and 3. FIG. 2 shows a schematic arrangement of a projection exposure apparatus, which comprises an alignment apparatus according to an embodiment of the present invention, and FIG. 3 is a block diagram of a control system of the projection exposure apparatus shown in FIG. 2.

Referring to FIG. 2, illumination light IL (i-line, KrF excimer laser, or the like) emitted from an exposure illumination system (not shown) illuminates a pattern area PA on a reticle R at almost a uniform illuminance via a condenser lens CL and a dichroic mirror DM. The illumination light IL transmitted through the pattern area PA is incident on a projection optical system PL, which is telecentric at both sides, and the projection optical system PL forms and projects an image of a circuit pattern formed on the pattern area PA on a wafer W formed with a resist layer on its surface. The wafer W is placed on a Z stage LS via a wafer holder (not shown), and the Z stage LS is finely moved in a direction of an optical axis AX (Z-direction) of the projection optical system PL by a driving system 13 and can be inclined in an arbitrary direction. The Z stage LS is placed on a wafer stage WS, which is two-dimensionally movable by a driving system 12 in the X- and Y-directions in a step-and-repeat mode. The positions, in the X- and Y-directions, of the wafer stage WS are always detected by a laser interferometer 15 at a resolution of, e.g., about 0.01 μm. A movable mirror 14 for reflecting a laser beam emitted from the laser interferometer 15 is fixed to an end portion of the interferometer 15. The movable mirror 14 preferably comprises a corner cube.

In FIG. 2, three types of alignment sensors, i.e., TTR (Through The Reticle) type LIA (Laser Interferometric Alignment) systems 30A to 30D, a TTL type (Through The Lens) LSA (Laser Step Alignment) system 17, and an off-axis type FIA (Field Image Alignment) system 20 are arranged.

The TTR type LIA systems 30A to 30D simultaneously detect alignment marks on the reticle R and those provided to a shot area on the wafer W, thereby detecting the amount of relative displacement therebetween. In this embodiment, four systems are arranged in correspondence with four sides of the pattern area PA. The TTR type LIA systems 30A to 30D are disclosed in, e.g., U.S. Pat. Nos. 5,070,250 and 5,138,176. Photoelectric signals from the four LIA systems 30A to 30D are input to an alignment signal processing circuit 16 (an LIA calculation unit 43 in FIG. 3). The amount of relative displacement between the reticle R and the shot area is detected, and this position information is supplied to a main control system 10.

The TTL type LSA system 17 forms an elongated beam spot LXS (FIG. 11A) on the wafer via the projection optical system PL, and photoelectrically detects diffracted light (scattered light) generated by alignment marks (diffraction grating marks) Mx added to a shot area on the wafer when the beam spot LXS and the alignment marks Mx are relatively scanned. The LSA system 17 is disclosed in, e.g., U.S. Pat. No. 4,677,301. FIG. 2 illustrates one LSA system for detecting the positions, in the Y-direction, of the alignment marks. In practice, another LSA system for detecting the positions in the X-direction is arranged. The photoelectric signals from the LSA system 17 are input to the alignment signal processing circuit 16 (an LSA calculation unit 41 in FIG. 3) together with the position signals from the interferometer 15. The positions of the alignment marks are detected by the circuit 16, and the position information is supplied to the main control system 10.

Figure 12A:
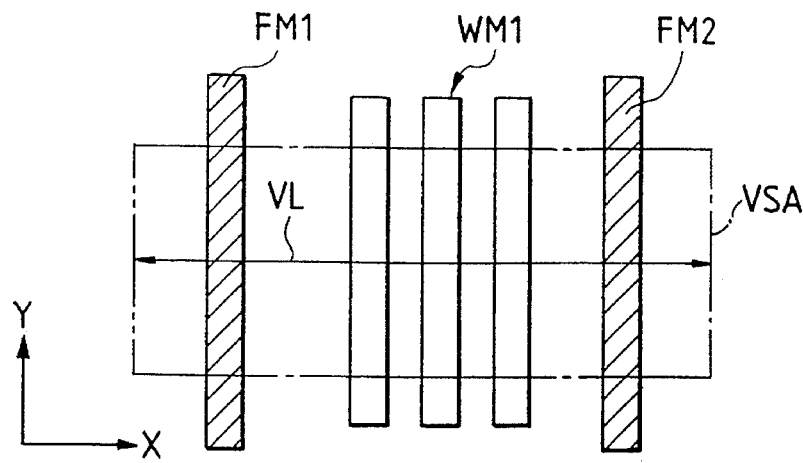
FIGS. 12A and 12B are views for explaining a mark position measurement state by an FIA system.

The FIA system 20 radiates illumination light (e.g., white light) having a predetermined wavelength width to form an image of an alignment mark ($WM_1$) on the wafer and an image of an index mark ($FM_1$) on an index plate arranged in a plane conjugate with the wafer on the light-receiving surface of an image pickup element (e.g., a CCD camera), as shown in FIG. 12A. The FIA system 20 is disclosed in, e.g., U.S. Pat. No. 4,962,318. Image signals from the FIA system 20 are also input to the alignment signal processing circuit 16 (an FIA calculation unit 42 in FIG. 3). The position of the alignment mark is detected by the circuit 16, and this position information is supplied to the main control system 10.

Furthermore, the arrangement shown in FIG. 2 comprises oblique incident light type surface position detection systems 18 and 19. The surface position detection systems 18 and 19 radiate pattern light onto the wafer from an oblique direction, and photoelectrically detect light reflected by the wafer by a synchronous detection method, thereby detecting the height position (the position in the Z-direction) and inclination angle of the wafer surface. The surface position detection systems 18 and 19 are disclosed in, e.g., U.S. Pat. No. 4,558,949. The main control system 10 calculates the coordinate positions of all shot areas on the wafer W, the characteristic of alignment errors of shot areas, and the like, and systematically controls the overall apparatus. A stage controller 11 controls to drive the interferometer 15 according to a driving command from the main control system 10, and controls to drive the wafer stage WS and the Z stage LS via the driving systems 12 and 13 on the basis of various kinds of information from the surface position detection systems 18 and 19.

The detailed arrangement of the control system of the apparatus will be described below with reference to FIG. 3. In this embodiment, components from a signal data memory section 40 to the LIA calculation unit 43 in the order named constitute the signal processing circuit 16 in FIG. 2, and components from an alignment data store section 501 to a sequence controller 508 in the order named constitute the main control system 10.

In FIG. 3, the LSA calculation unit 41 receives photoelectric signals from the LSA system 17 (photoelectric detectors) and position signals from the interferometer 15, and samples the photoelectric signals in synchronism with up-down pulses generated for every unit moving amount of the wafer stage WS. Furthermore, the unit 41 converts sampling values into digital values, and stores the digital values in a memory in an address order. Thereafter, the unit 41 calculates the Y-position of a wafer mark by predetermined calculation processing, and outputs this information to the alignment data store section 501.

The FIA calculation unit 42 calculates the amount of displacement between images of wafer and index marks by predetermined calculation processing on the basis of the waveform of image signals from the FIA system 20 (image pickup element). Furthermore, the unit 42 receives the position signals from the interferometer 15 to obtain the coordinate position of the wafer stage WS when the image of the wafer mark is located at the center between the index marks (i.e., when the amount of displacement becomes zero), and outputs this information to the alignment data store section 501. Note that the FIA system with the above arrangement has two image pickup elements, and the FIA calculation unit 42 can simultaneously detect mark positions in the X- and Y-directions upon reception of image signals from the image pickup elements.

Furthermore, the LIA calculation unit 43 calculates the amount of relative displacement between the reticle R and the wafer W on the basis of a phase difference between the waveforms of a photoelectric signal of interference light of ±1st-order diffracted light components generated from the alignment mark on the wafer and a photoelectric signal of reference interference light separately generated from two output beams, and a phase difference between the waveforms of a photoelectric signal of interference light of ±1st-order diffracted light components generated from a monitor diffraction grating plate and the photoelectric signal of the reference interference light. The unit 43 calculates the coordinate position of the wafer stage WS when the amount of displacement becomes zero, and outputs these pieces of information to the alignment data store section 501. The signal data memory section 40 stores photoelectric signals from the LSA system 17, e.g., digital waveform data converted by the LSA calculation unit 41. Furthermore, the memory section 40 can store image signals from the FIA system 20 and photoelectric signals from the four LIA systems 30A to 30D.

The alignment data store section 501 can receive mark position information from each of the three calculation units 41 to 43. An EGA calculation unit 502 performs an EGA calculation (statistic calculation) using the position information from the three calculation units 41 to 43 in accordance with an alignment mode determined by a calculation section 505, and supplies the calculation result (calculation parameters, alignment coordinate values, and the like) to the calculation section 505, a memory section 506, and the sequence controller 508.

For example, when the EGA mode is selected, the EGA calculation unit 502 calculates alignment coordinate values of all shot areas on the wafer W by the statistic calculation (equation (2)) on the basis of the mark position information of a plurality of (three or more; normally 10 to 15) shot areas (sample shots) stored in the store section 501. When the W-EGA mode described in the first and second embodiments is selected, the unit 502 calculates alignment coordinate values of all shot areas on the wafer W by the statistic calculation (equations (3) and (5)) on the basis of the position information of the plurality of sample shots and weighting coefficients determined by a weight generation section 507. Since the EGA calculation unit 502 calculates the calculation parameters $a$ to f by the statistic calculation, these parameters are also stored in the memory section 506.

Although not shown in FIG. 3, information from each of the three calculation units 41 to 43 is input to the alignment data store section 501 via a selection switch, and can also be selectively input to the store section 501 and the sequence controller 508 by the selection switch. When the calculation section 505 determines an alignment mode, the sequence controller 508 switches the selection switch according to the determined mode. More specifically, when the EGA or W-EGA mode is selected, the sequence controller 508 switches the selection switch to input the information to the store section 501; when the D/D mode is selected, the sequence controller 508 switches the selection switch to input the information to the sequence controller 508.

The weight generation section 507 stores the weighting functions (equations (4) and (6)) and equations for determining the parameter S (equation (7) or (8)). Therefore, the weight generation section 507 determines the weighting coefficients to be multiplied with alignment data of the sample shots on the basis of the weighting parameter D or the correction coefficient C determined by the calculation section 505, the designed coordinate positions of shot areas stored in an exposure shot position data section 503, and the arrangement of the sample shots stored in a sample shot designation section 504.

The calculation section 505 calculates the characteristic (the presence/absence, magnitude, rule, and the like of a non-linear distortion) of alignment errors of shot areas on the wafer, selects (determines) a mode suitable for the wafer from the plurality of alignment modes, and sets the determined mode in the EGA calculation unit 502 and the sequence controller 508. When the determined mode is the W-EGA mode, the section 505 also determines the weighting parameter D or the correction coefficient C, and the center point of symmetry of a non-linear distortion (if necessary), and outputs this information to the weight generation section 507.

Furthermore, when the calculation section 505 selects one of three modes other than the D/D mode, it calculates an accuracy of calculation (accuracy of superposition $|X|+3\sigma$ to be described later) of a shot alignment using the coordinate positions (calculated values) of all shot areas on the wafer calculated by the EGA calculation unit 502 using the selected mode, and the coordinate positions (measurement values) of almost all the shot areas stored in the store section 501. If the calculated accuracy does not satisfy a required accuracy, the calculation section 505 supplies an instruction to the sample shot designation section 504 and the three calculation units 41 to 43 to alter the arrangement (the number and positions) of sample shots and/or the signal processing conditions of the calculation units. Therefore, the EGA calculation unit 502 calculates the coordinate positions of shot areas on the wafer using the previously determined mode under the new condition.

The exposure shot position data section 503 stores the designed alignment coordinate values (alignment model) of all shot areas on the wafer, and these coordinate values are supplied to the EGA calculation unit 502, the weight generation section 507, and the sample shot designation section 504. The sample shot designation section 504 determines the arrangement (the number and positions) of sample shots to be used in the EGA calculation on the basis of the shot position information from the data section 503, and supplies this information to the EGA calculation unit 502, the weight generation section 507, and the sequence controller 508. As will be described in detail later, a plurality of sample shot groups suitable for the EGA mode and the $W_1$-EGA or $W_2$-EGA mode are prestored in the designation section 504. Therefore, when the arrangement of the sample shots is altered, as described above, at least one of the plurality of sample shot groups is selected. The sequence controller 508 determines a sequence for controlling movement of the wafer stage WS in an alignment operation or in a step-and-repeat exposure operation on the basis of the various data described above, and systematically controls the overall apparatus.

Furthermore, in FIG. 3, a reader 60 for reading an identification code (e.g. bar codes) printed on a cassette (lot) for storing a plurality of (about 25) wafers or on each wafer, an input unit (e.g., a keyboard) 61 with which an operator inputs various processing conditions to the main control system 10 (calculation section 505), and a display unit (e.g., a cathode ray tube) 62 for informing the calculation result (e.g., the characteristic of alignment errors of shot areas) of the calculation section 505, the currently active alignment mode of the apparatus, and the like to the operator, are arranged. The main control system 10 selects an alignment sensor suitable for detecting the alignment mark on the wafer on the basis of the information described in the identification code, and mark detection is performed using the selected alignment sensor. The identification code can describe information associated with a formation condition (i.e., the type and thickness of a substrate, an undercoating layer, and a resist layer) of wafers stored in the lot, and a pattern and step of the alignment mark. Note that the identification code may describe only an alignment sensor name. Furthermore, an operator may set an alignment sensor in the main control system 10 via the input unit 61 without using the identification code.

An accuracy of alignment may often be improved even when the alignment method (W-EGA mode) of the first or second embodiment is applied. This is because the W-EGA mode especially aims at correcting a regular non-linear distortion of non-linear distortions. Therefore, when the accuracy of alignment cannot be improved, it is considered that a wafer has many irregular non-linear components. In general, it is difficult to improve an accuracy of alignment even when either alignment method is applied to a wafer having an irregular non-linear distortion. Thus, two cases will be examined below for a wafer, which has an irregular non-linear distortion, in other words, with which an accuracy of alignment cannot be improved, wherein the measurement reproducibility of the alignment sensor is good or poor.

When the alignment sensor has poor measurement reproducibility, a result as if a wafer were one suffering from an irregular non-linear distortion may be obtained although the wafer itself does not suffer from an irregular non-linear distortion. In this case, an alignment sensor which can obtain good measurement reproducibility for the wafer and/or its signal processing conditions can be selected and used. For example, when alignment marks on the wafer have a low step, the LIA systems 30A to 30D can be used; when a metal layer is formed on the wafer surface, the FIA system 20 can be used.

Alternatively, the signal processing conditions of the alignment sensor may be altered without altering the sensor so as to improve measurement reproducibility. The signal processing conditions in the LSA system (LSA calculation unit 41) include a waveform analysis algorithm, an algorithm slice level, a processing gate width, and the like. Note that the processing gate width is determined to have the designed mark position as the center. As the waveform analysis algorithm, for example, three algorithms to be described below are available.

In the first algorithm, after a signal waveform is smoothed in a period determined by the predetermined processing gate width, the smoothed signal waveform is sliced at a level set by the algorithm slice level. When intersections are found at the right and left portions of the signal waveform, as shown in FIG. 11B, the central point between the two intersections is detected as a mark position. In the second algorithm, after a signal waveform is smoothed in a period exceeding a predetermined level $L_1$ (voltage value), a plurality of slice levels are set at predetermined intervals between the level $L_1$ and a level $L_2$ close to a peak value, and intersections and a length (an interval between two intersections) are obtained in units of slice levels. Then, a slice level corresponding to the maximum inclination of the signal waveform in a portion below a level set by the algorithm slice level is selected on the basis of the lengths at the respective slice levels, and a central point between intersections at the selected level is detected as a mark position. In the third algorithm, a signal waveform is sliced at a level set by the algorithm slice level, and a central point between the sliced points is obtained as a reference position. After the signal waveform is smoothed in a period exceeding a predetermined level $L_1$ (voltage value), a plurality of slice levels are set at predetermined intervals between the level $L_1$ and a level $L_2$ close to a peak value, and a central point between two intersections at each slice level, and a central point difference (i.e., a difference between the central points at adjacent slice levels) are obtained. An area where the central points at the slice levels are not largely separated from the previously obtained reference position, and are stable (i.e., an area where the central point differences are very small, and the corresponding slice level continuously appears across the largest interval) is selected, and a central point in the selected area is detected as a mark position.

The signal processing conditions in the FIA and LIA calculation units 42 and 43 will be briefly described below with reference to FIGS. 12A and 12B and FIG. 13. FIG. 12A shows a state of the wafer mark $WM_1$ detected by the FIA system, and FIG. 12B shows the waveform of an image signal obtained at that time.

As shown in FIG. 12A, the FIA system 20 (image pickup element) electrically scans images of three bar marks of the wafer mark $WM_1$ and index marks $FM_1$ and $FM_2$ along a scanning line VL. In this case, since an image signal obtained by only one scanning line is disadvantageous in terms of an S/N ratio, the levels of image signals obtained by a plurality of horizontal scanning lines falling within a video sampling area VSA (alternate long and short dashed line) may be added and averaged in units of pixels in the horizontal direction.

Figure 12B:
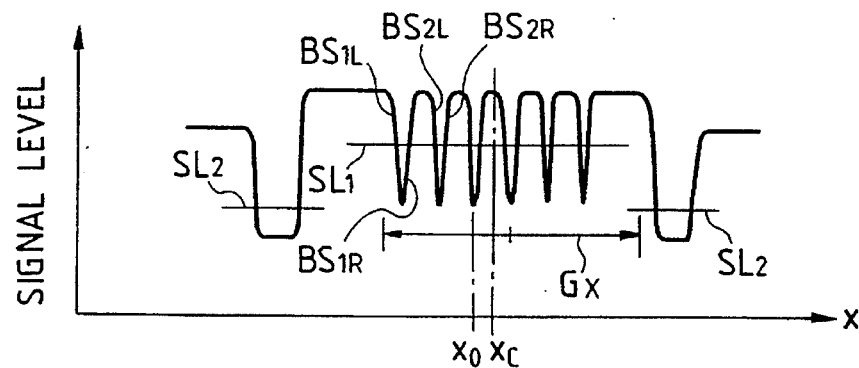
Figure 13:
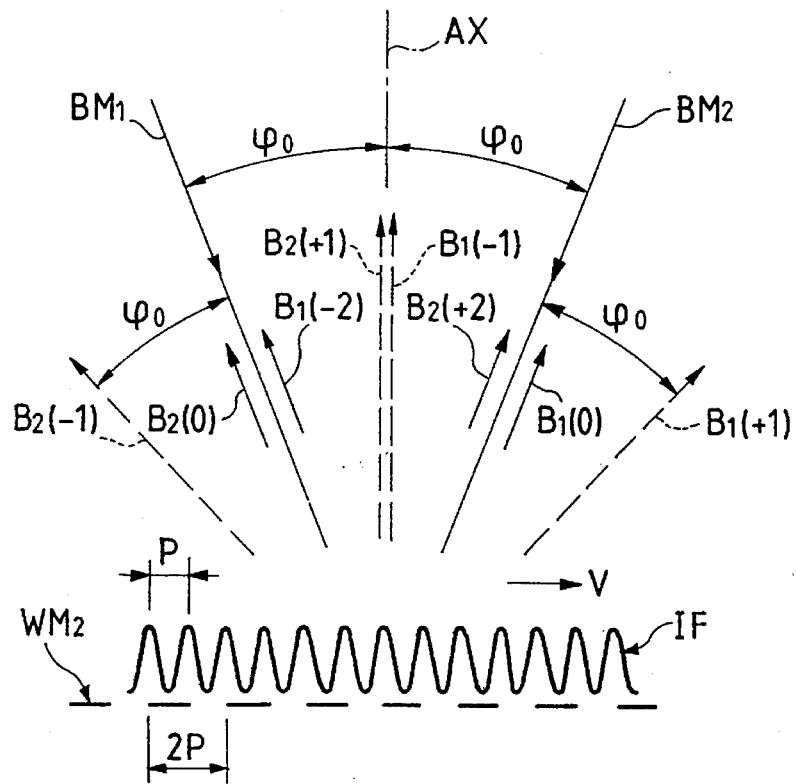
FIG. 13 is a view for explaining a mark position measurement state by an LIA system.

As shown in FIG. 12B, the image signal has waveform portions corresponding to the index marks $FM_1$ and $FM_2$ at two sides. The FIA calculation unit 42 processes these waveform portions with a slice level $SL_2$ to obtain the central positions (the pixel positions) of the marks, thereby obtaining a central position $x_0$ between the index marks $FM_1$ and $FM_2$. In place of obtaining the central positions of the index marks $FM_1$ and $FM_2$, the central position $x_0$ may be obtained by obtaining the positions of the right edge of the index mark $FM_1$ and the left edge of the index mark $FM_2$.

In the image signal shown in FIG. 12B, a waveform portion corresponding to the wafer mark $WM_1$ has bottoms at positions corresponding to the left and right edges of the bar marks. Thus, the FIA calculation unit 42 executes waveform processing with a slice level $SL_1$ to obtain the central positions of the bar marks, and then adds and averages these positions to calculate a central position $x_c$ of the wafer mark $WM_1$. Furthermore, the unit 42 calculates a difference $\Delta x$ ($=x_0-x_c$) between the previously obtained position $x_0$ and the mark measurement position $x_c$, and outputs, as mark position information, a value obtained by adding the difference $\Delta x$ to the position of the wafer stage WS obtained when the wafer mark $WM_1$ is aligned within an observation area of the FIA system 20.

Therefore, the signal processing conditions which can be altered in the FIA calculation unit 42 include the waveform analysis algorithm, the slice level $SL_1$ (voltage value), a contrast limit value, and a processing gate width Gx (the central position of the width Gx on a pixel, and its width). Furthermore, as filed in Ser. No. 722,157 (Jun. 27, 1991) now abandoned, upon calculation of the central positions of the bar marks in the waveform analysis algorithm, of waveform portions $BS_{1L}$, $BS_{1R}$, $BS_{2L}$, and $BS_{2R}$ corresponding to the left and right edges of the bar marks, ① a mode using only outer slopes $BS_{1L}$ and $BS_{2R}$, ② a mode using only inner slopes $BS_{1R}$ and $BS_{2L}$, and ③ a mode using the outer slopes $BS_{1L}$ and $BS_{2R}$ and the inner slopes $BS_{1R}$ and $BS_{2L}$ are available.

The signal processing conditions in the LIA system (especially, heterodyne type) will be described below with reference to FIG. 13. As shown in FIG. 13, when two coherent beams (parallel beams) $BM_1$ and $BM_2$ having a frequency difference $\Delta f$ therebetween are incident on a linear diffraction grating mark $WM_2$ on the wafer at a crossing angle $(2\phi_0)$, a linear interference fringe IF having a pitch P (a grating pitch 2P) is formed on the mark $WM_2$. The interference fringe IF is moved in the pitch direction of the diffraction grating mark $WM_2$ in correspondence with the frequency difference $\Delta f$, and its speed V is expressed by a relation $V=\Delta f \cdot P$. As a result, diffracted light components $B_1(-1)$, $B_2(+1)$, . . . are generated from the diffraction grating mark $WM_2$, as shown in FIG. 13. Note that suffices 1 and 2 represent correspondences to the incident beams $BM_1$ and $BM_2$, and numerical values in parentheses represent the number of diffraction order. Normally, the LIA system detects a displacement by obtaining a phase difference between a photoelectric signal of interference light of ±1st-order diffracted light components $B_1(-1)$ and $B_2(+1)$, which propagate along the optical axis AX, and a photoelectric signal of reference interference light separately generated from two output beams. Alternatively, the amount of displacement may be calculated by adding and averaging the amount of displacement detected based on a phase difference between a photoelectric signal of interference light of 0th- and -2nd-order diffracted light components $B_2(0)$ and $B_1(-2)$ and the reference photoelectric signal, and the amount of displacement detected based on a phase difference between a photoelectric signal of interference light of 0th- and -2nd-order diffracted light components $B_1(0)$ and $B_1(+2)$ and the reference photoelectric signal.

Therefore, the signal processing condition which can be altered in the LIA calculation unit 43 is only selection of interference light (the number of order of diffracted light) to be photoelectrically converted. More specifically, a first mode using ±1st-order diffracted light components $B_1(-1)$ and $B_2(+1)$, a second mode using 0th- and -2nd-order diffracted light components $B_2(0)$ and $B_1(-2)$, and 0th- and -2nd-diffracted light components $B_1(0)$ and $B_2(+2)$, and a third mode for comparing the intensity values of interference light in the first and second modes, and selecting and using a mode having a larger intensity value, are available. Therefore, in optimization of the signal processing conditions of the LIA calculation unit 43, a simulation is performed by changing these three modes.

As described above, when the alignment sensor has poor measurement reproducibility, mark detection is performed under an optimal condition for layers by altering the alignment sensor and/or its signal processing conditions. When neither the alignment sensor nor the signal processing conditions are altered, a plurality of times of measurements may be performed for a single alignment mark.

On the other hand, when the alignment sensor has good measurement reproducibility, two cases can be examined wherein the measurement value is reliable or not reliable. When reliability of alignment data of sample shots is high, and the alignment data include an irregular non-linear distortion, it is considered that the wafer actually suffers from an irregular non-linear distortion. In this case, the number of sample shots may be increased, the diameter D of the zone in equation (7) may be decreased, or the correction coefficient C in equation (8) may be increased. When an accuracy of alignment cannot be improved after the parameter S or the arrangement (the number and positions) of sample shots is optimized, it is considered that the alignment sensor cannot accurately measure mark positions due to the adverse affect of, e.g., coverage, i.e., reliability of alignment data is low. In this case, alignment is performed using the FIA system, which is not easily adversely affected by, e.g., coverage.

The cases have been described wherein the wafer has an irregular non-linear distortion. For a wafer having a regular non-linear distortion, alignment can be performed under optimal conditions for layers by altering at least one of the parameter S (i.e., the diameter D of the zone or the correction coefficient C), the number and arrangement (positions) of sample shots, the alignment sensor, and the signal processing conditions of the alignment sensor. In other words, after the alignment sensor and its signal processing conditions suitable for layers are selected, other conditions such as the parameter S and the number and arrangement (positions) of sample shots are preferably optimized.

In the EGA mode, as for an alignment rule of shot areas on a single wafer, scaling amounts Rx and Ry, in the X- and Y-directions, of the wafer, offset amounts Ox and Oy, in the X- and Y-directions, of the wafer, a residual rotation error $\theta$ of the alignment coordinate system of the shot areas, and an inclination amount (degree of orthogonality) $\omega$ of the alignment coordinate 5 system are introduced as variable elements. More specifically, these six elements are expressed by the following equations using the calculation parameters a to f:

Rx=a

Ry=d

Ox=e

Oy=f $\theta$=c/d $\omega$=−(b/a+c/d)

When the coordinate positions of shot areas on a single wafer are determined upon application of the first or second embodiment, the two types of alignment sensors, e.g., the LSA and FIA systems, are used. More specifically, the coordinate positions of all sample shots are measured using the LSA and FIA systems, respectively, and the calculation parameters a to f are calculated using the method of least squares. Thereafter, the coordinate position of one shot area is determined using the two sets of calculation parameters a to f.

More specifically, the above-mentioned six variable elements are determined from the calculation parameters a to f calculated based on the measurement results of the LSA system, and the six variable elements, in particular, scaling parameters Rx and Ry, are determined from the calculation parameters a to f calculated based on the measurement results of the FIA system. Then, the scaling parameters of the LSA system are substituted with those of the FIA system. Furthermore, the calculation parameters a to f are determined using the scaling parameters Rx and Ry of the FIA system, and the remaining four variable elements (Ox, Oy, $\theta$, and $\omega$) of the LSA system. Thereafter, the coordinate position of one shot area is determined using these parameters.

When the calculation parameters a to f are determined by selectively using the two types of alignment sensors, as described above, the accuracy of calculation of the coordinate position of each shot area can be improved as compared to the above embodiments. Assume that both the LSA and FIA systems use the same arrangement (the number and positions) of sample shots. Also, assume that these systems use the same degree of weighting (the value of the parameter S). In this case, the LSA and FIA systems are used. However, the number, a combination, and the like of alignment sensors to be used may be arbitrarily determined.

In the above description, mark detection of sample shots is performed using the LSA and FIA systems in units of shot areas, and the calculation parameters are calculated by the method of least squares. In this case, when a difference between the calculation parameters calculated based on the measurement results of the LSA and FIA systems is large, one of the LSA and FIA systems may have a large measurement error, and this may make it difficult to accurately calculate the coordinate position of a shot area. In this case, the main control system 10 informs this state to an operator by means of an alarm, screen display, or the like. When the difference exceeds a predetermined allowable value, re-measurement is automatically performed. Upon execution of re-measurement, the types or combination of alignment sensors may be altered, or a new alignment sensor may be added. On the other hand, when the difference is equal to or smaller than the allowable value, the coordinate position of each shot area may be determined using the parameters a to f determined after some variable elements are substituted, as described above, one of the two sets of calculation parameters, the average values of the two sets of calculation parameters, or parameters determined after the two sets of calculation parameters are weighted.

When only one type of alignment sensor is used, two sets of weighting functions having different degrees of weighting (different values of the parameter S) may be used. More specifically, after the coordinate positions of all the sample shots are measured, calculation parameters are calculated by a statistic calculation using the two sets of weighting functions. At this time, the values of the parameter S are set to be a value for obtaining a result equivalent to that obtained by, e.g., the EGA mode, and a value for obtaining a result equivalent to that obtained by, e.g., the D/D mode. Then, one set of calculation parameters are determined using the offset amounts 0x and Oy of the six variable elements calculated under the EGA-like weighting function, and the remaining four variable elements calculated under the D/D-like weighting function, and the coordinate position of each shot area is calculated using the determined parameters. Note that the two parameters S may have arbitrary values, and may be appropriately determined according to the types of layers, the characteristic of a non-linear distortion, and the like.

An alignment method according to the third embodiment of the present invention will be described below. The alignment method of this embodiment is suitable for a wafer (FIG. 5) having a regular non-linear distortion. This embodiment is characterized in that the flatness of a wafer surface is calculated in place of weighting data in units of sample shots. For example, a bulge of a wafer is detected using the surface position detection systems 18 and 19, and alignment is performed by utilizing this data.

When predetermined measurement points (e.g., alignment marks) are provided at pitches Px and Py in the X- and Y-directions, and a height h(i, j) at an arbitrary position (i, j) on a wafer is measured, inclinations (e.g., inclinations with respect to the moving plane of the wafer, i.e., to an orthogonal coordinate system XY defined by the interferometer) IncX and IncY in the X- and Y-directions are respectively given by:

$$IncX=\{h(i+1, j)-h(i-1, j)\}/2Px$$

$$IncY=\{h(i, j+1)-h(i, j-1)\}/2Py \quad (9)$$

Figure 14:
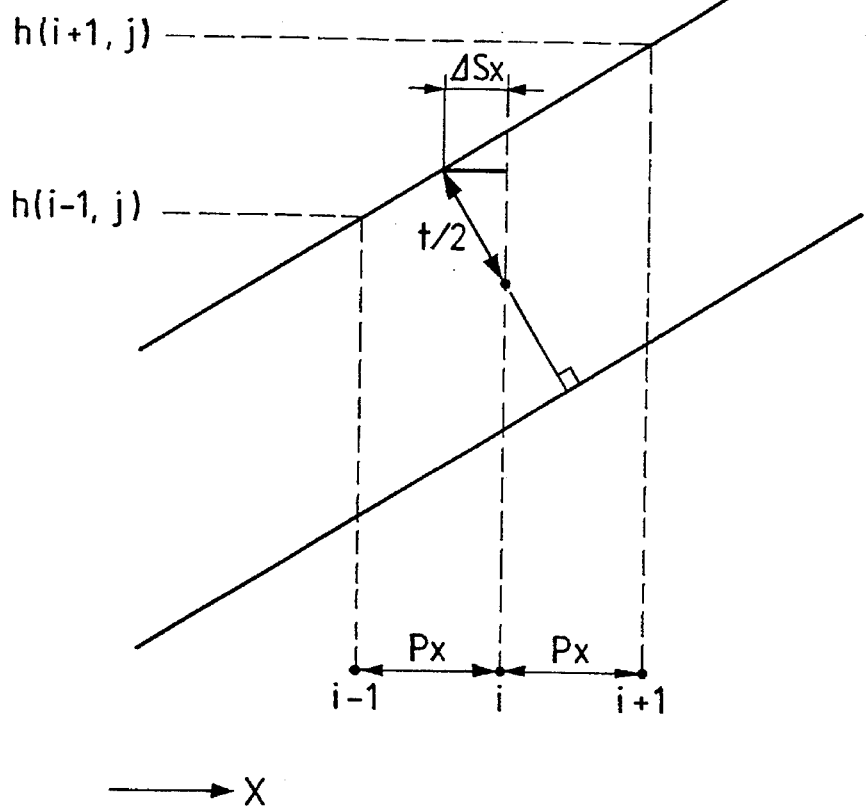
FIG. 14 is a view for explaining the principle of an alignment method according to the third embodiment of the present invention.

FIG. 14 is an enlarged partial sectional view of a wafer portion (bulged portion) having a local bulge. If the thickness of the wafer is represented by t, and if it is assumed that no displacement occurs in the central portions of the upper and lower surfaces of the wafer, displacement amounts (lateral shift amounts) $\Delta Sx$ and $\Delta Sy$ in the X- and Y-directions at a position (i, j) are respectively given by:

$$\Delta Sx=IncX \times t/2$$

$$\Delta Sy=IncY \times t/2 \quad (10)$$

Therefore, a non-linear distortion caused by a bulge (warp) of a wafer can be obtained on the basis of the flatness of the wafer (shot areas) and the thickness t of the wafer. The inclinations IncX and IncY in the X- and Y-directions at a position (i, j) may be directly measured using the surface position detection systems 18 and 19, and $\Delta Sx$ and $\Delta Sy$ may be calculated from equations (10) using the measurement results.

The alignment operation of this embodiment will be described below. In this embodiment, assume that a wafer center is most bulged, the flatness of the wafer, e.g., differences between the heights of shot areas on the wafer and the wafer center, are measured in advance using the surface position detection systems 18 and 19, and the measurement data are stored in the memory section 506. The memory section 506 also stores information associated with the thickness t of the wafer. It is also assumed that the surface position detection systems 18 and 19 are calibrated in advance, so that a plane including, e.g., the moving coordinate system (orthogonal coordinate system XY) of the wafer stage WS serves as a zero-point reference. Note that the alignment method of this embodiment can utilize the apparatus shown in FIGS. 2 and 3. However, since this embodiment requires no weighting, the weight generation section 507 can be omitted.

In the apparatus shown in FIGS. 2 and 3, after the coordinate positions of a plurality of sample shots, which are selected in advance, are measured by the LSA system 17, the lateral shift amounts $\Delta Sx$ and $\Delta Sy$ of each sample shot are calculated from equations (9) and (10) using the measurement values. The coordinate position of each sample shot is corrected using the lateral shift amounts $\Delta Sx$ and $\Delta Sy$. More specifically, the coordinate positions of the sample shots in a state wherein the wafer is chucked by a holder apparently in almost a flat state are calculated. Thereafter, the EGA calculation unit 502 executes an EGA calculation (equations (1) and (2)) using the plurality of corrected coordinate positions in the EGA mode, thereby calculating the coordinate positions (first shot alignment) of all shot areas on the wafer. Then, the lateral shift amounts, in the X- and Y-directions, of each shot area are calculated (inversely calculated) from equations (9) and (10) using the calculated coordinate positions, and the previously calculated coordinate positions (first shot alignment) of the shot areas are corrected using the lateral shift amounts. Thus, the coordinate positions (second shot alignment) of all the shot areas are obtained. Therefore, when the moving position of the wafer W (wafer stage WS) is controlled on the basis of the second shot alignment, each shot area can be sequentially aligned to a reference position (exposure position) with high accuracy.

As described above, according to this embodiment, even when a wafer is locally bulged, the coordinate positions of all shot areas can be accurately calculated at high speed without increasing the number of sample shots and without executing a weighted EGA calculation, thus improving an accuracy of alignment on the entire surface of the wafer. In this embodiment, a case has been described wherein almost the central portion of the wafer is bulged (FIG. 5). When an arbitrary portion of a wafer is bulged, this embodiment can be applied without any modifications so as to obtain the same effect as described above.

An alignment method according to the fourth embodiment of the present invention will be described below. In this embodiment as well, an alignment method suitable for a wafer (FIG. 5) having a regular non-linear distortion will be described. However, a difference from the third embodiment is that no flatness measurement of a wafer is performed.

In the apparatus shown in FIGS. 2 and 3, the coordinate positions of a plurality of samples are measured using the LSA system 17. At this time, the Z stage LS is inclined, so that the surface of each sample shot becomes almost parallel to a plane including the orthogonal coordinate system XY using the surface position detection systems 18 and 19, and thereafter, the coordinate position of each sample shot is measured. The coordinate positions obtained as a result of this operation are almost equal to the coordinate positions of the sample shots in a state wherein a wafer is chucked by a holder apparently in almost a flat state. Thereafter, the EGA calculation unit 502 executes an EGA calculation (equations (1) and (2)) using the plurality of corrected coordinate positions in the EGA mode, thereby calculating the coordinate positions of all shot areas on the wafer.

Then, the moving position of the wafer stage WS is controlled according to the calculated coordinate positions, thereby aligning each shot area to an exposure position. At this time, each shot area is aligned to be shifted from the exposure position due to the bulge of the wafer. In particular, the shift amount of a shot area located at the central portion of the wafer is large. Thus, after each shot area is aligned according to the previously calculated coordinate position, inclinations (i.e., inclinations with respect to the orthogonal coordinate system XY) of the surface of this area are detected using the surface position detection systems 18 and 19. Furthermore, lateral shift amounts, in the X- and Y-directions, of the shot area are calculated (inversely calculated) from equations (9) and (10) using the detection values. The wafer stage WS is aligned to be shifted from the previously calculated position by the lateral shift amounts, so that the shot area can be accurately aligned to the exposure position.

In the subsequent operation, the lateral shift amounts are detected in units of shot areas, and the previously calculated coordinate positions are corrected using the detection values as offsets. When the wafer stage WS is aligned according to the corrected coordinate position, each shot area can be accurately aligned to the exposure position.

As described above, according to this embodiment, even when a wafer is locally bulged, the coordinate positions of all shot areas can be accurately calculated at high speed without increasing the number of sample shots and without executing a weighted EGA calculation. Furthermore, since no flatness measurement of a wafer need be performed in advance, the accuracy of alignment on the entire surface of a wafer can be improved without decreasing the throughput. In this embodiment, a case has been described wherein almost the central portion of the wafer is bulged (FIG. 5). When an arbitrary portion of a wafer is bulged, this embodiment can be applied without any modifications so as to obtain the same effect as described above.

When reticle patterns are superposition-exposed on each shot area, the best focal plane of the projection optical system PL must be caused to accurately coincide with the surface of the shot area. Normally, in the projection exposure apparatus, the inclinations (inclinations with respect to the best focal plane) of each shot area are detected using the surface position detection systems 18 and 19, and the Z stage LS is inclined on the basis of the detection values. In this case, the shot area is laterally shifted relative to the exposure position in the orthogonal coordinate system XY upon inclination of the Z stage LS, and a final accuracy of alignment is lowered although the coordinate position of each shot area is accurately calculated. However, in this embodiment, since the inclinations of each shot area are detected using the surface position detection systems 18 and 19, the shift amounts in the X- and Y-directions upon inclination of the Z stage LS are predicted using the detection values, and the final coordinate position of each shot area is preferably determined in consideration of the lateral shift amounts and the predicted shift amounts as well.

Since the surface position detection systems 18 and 19 are calibrated, so that the plane including the orthogonal coordinate system XY serves as a zero-point reference, the detection values of the systems 18 and 19 cannot be directly used in calculation of the predicted shift amounts. For this reason, the inclinations of the best focal plane of the projection optical system PL with respect to the plane including the orthogonal coordinate system XY are obtained in advance, and are added, as offsets, to the detection values of the surface position detection systems 18 and 19. Then, the shift amounts in the X- and Y-directions upon inclination of the Z stage LS are preferably predicted using the corrected values. In this embodiment, the coordinate position of each sample shot is measured in a state wherein the shot surface is set to be substantially parallel to the plane including the orthogonal coordinate system XY. Alternatively, the coordinate position may be measured in a state wherein the shot surface is inclined relative to the plane including the orthogonal coordinate system XY. In this case, the coordinate position is corrected on the basis of the inclination amounts detected by the surface position detection systems 18 and 19 upon measurement of the coordinate position, and the corrected value is used in the EGA calculation. Furthermore, when the bulge of a wafer can be clearly specified, all the sample shots are preferably selected from flat areas (an outer peripheral portion of the wafer in FIG. 5) free from the influence of the bulge. Thus, the coordinate conversion (correction of the coordinate position based on the lateral shift amounts) using the inclination amounts of the shot surface caused by the bulge need not be performed, thus eliminating various errors, which may be caused upon coordinate conversion, and shortening the measurement and calculation times.

In each of the above embodiments, a non-linear distortion caused by a bulge formed upon chucking of a wafer is discussed as a problem to be solved. However, each of the above embodiments can be applied to a non-linear distortion due to other causes, and the same effect as in each of the above embodiments can be expected. Furthermore, the alignment sensors used in each of the above embodiment are not particularly limited. More specifically, any one of TTR, TTL, and off-axis type sensors may be adopted, and either of detection methods, i.e., an image processing method as in the LSA system and the FIA system 20, or a two-beam interference method as in the LIA systems, may be adopted. Each of the above-mentioned alignment methods may be realized by either hardware or software, and may be applied to exposure apparatuses (e.g., an inspection apparatus, a repair apparatus, a wafer prober, and the like) other than step-and-repeat, step-and-scan, or proximity type exposure apparatuses (a stepper, an aligner, and an X-ray exposure apparatus).

Figure 17:
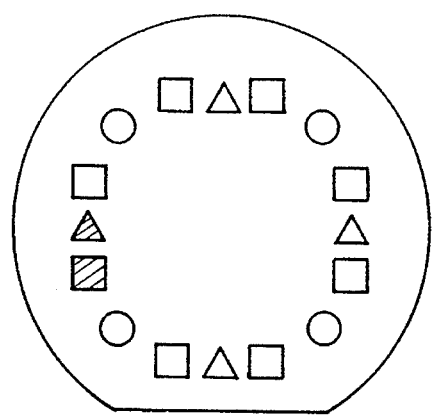
FIG. 17 is a view showing sample shot groups suitable for an EGA mode.
Figure 18:
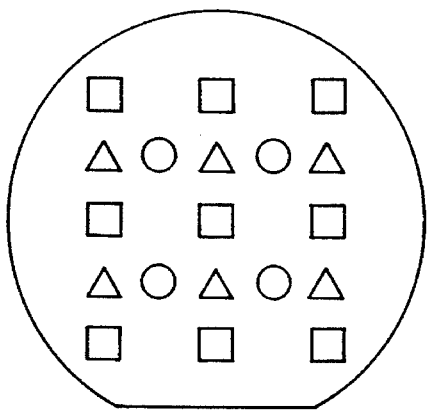
FIG. 18 is a view showing sample shot groups suitable for a W-EGA mode.

Prior to a description of an exposure sequence of the projection exposure apparatus having a plurality of alignment modes, sample shot arrangements used in the EGA mode and $W_1$-EGA and $W_2$-EGA modes will be described below with reference to FIGS. 17 to 19. In the following description, the $W_1$-EGA and $W_2$-EGA modes will be referred to as a W-EGA mode unless otherwise specified.

In an exposure sequence to be described later, an accuracy of superposition ($|X|+3\sigma$) in the EGA or W-EGA mode is calculated. If the accuracy of superposition does not satisfy a required accuracy, the arrangement (the number and positions) of sample shots is altered, the alignment coordinates of all shot areas are calculated again, and thereafter, the accuracy of superposition is calculated. The above-mentioned calculation is repeated until the required accuracy is satisfied, thereby optimizing the arrangement of sample shots. In this case, every time the calculation is performed, the designation section 504 may arbitrarily alter the arrangement of sample shots. However, in an embodiment to be described below, a plurality of sample shot groups are prepared for each of the EGA and W-EGA mode, and the arrangement (the number and positions) of sample shots is altered by altering the number and/or a combination of sample shot groups to be selected among the plurality of sample shot groups.

Normally, in the EGA mode, at least three sample shots are arranged to define a polygon on a peripheral portion of a wafer. Thus, in the EGA mode, three sample shot groups shown in FIG. 17 are stored in the designation section 504, and the arrangement of sample shots can be altered by altering the number and/or combination of sample shot groups to be selected. When the arrangement of sample shots is altered, a first sample shot group having, e.g., eight sample shots (shot areas indicated by □ in FIG. 17) is selected in advance. When the accuracy of superposition using the first sample shot group does not satisfy a required accuracy, a second sample shot group (four sample shots indicates by ○ in FIG. 17) is added to the first sample shot group, thus altering the arrangement of sample shots. Furthermore, when the accuracy of superposition does not satisfy a required accuracy even using a total of 12 sample shots of the first and second sample shot groups, a third sample shot group (four sample shots indicated by Δ in FIG. 17) is further added to alter the arrangement of sample shots. In this case, the second and third sample shot groups are added in turn to the first sample shot group. For example, only a combination of sample shot groups to be selected may be altered to alter the arrangement of sample shots. That is, the second and third sample shot groups may be selected in advance, and when the arrangement of sample shots is altered, the first and second sample shot groups may be selected.

The number of sample shot groups to be stored in the designation section 504 need only be two or more, and the number of sample shots in each group can be arbitrarily determined. However, when the number of sample shots in each group is two or less, two or more sample shot groups must always be selected. More specifically, the number of sample shot groups to be selected is determined according to the number of sample shots in each group, so that the total number of sample shots becomes three or more. In practice, the number of sample shots in each group is preferably at least three, so that a shot alignment can be calculated by an EGA calculation even when only one sample shot group is selected. The above description has been made under a condition that the second and third sample shot groups are added in turn to the first sample shot group. For this reason, the number of sample shots in each of the second and third sample shot groups is set to be four in FIG. 17. However, the number of sample shots may be increased in consideration of the above-mentioned accuracy of superposition. For example, the number of sample shots in each of the second and third sample shot groups may be set to be eight or more.

On the other hand, in the W-EGA mode, sample shots are evenly arranged on the entire surface of a wafer in place of arranging sample shots to define a polygon on the peripheral portion of the wafer unlike in the EGA mode. Thus, in the W-EGA mode, three sample shot groups shown in FIG. 18 are stored in the designation section 504, and the arrangement of sample shots can be altered by altering the number and/or combination of sample shot groups to be selected. When the arrangement of sample shots is to be altered, for example, a second sample shot group (four sample shots indicates by ○ in FIG. 18) and a third sample shot group (six sample shots indicated by Δ in FIG. 18) can be added in turn to a first sample shot group (nine sample shots indicated by □ in FIG. 18). In place of simply adding sample shot groups, a combination of sample shot groups to be selected from the first to third sample shot groups may be altered.

In the W-EGA mode, the number of sample shot groups is two or more. Furthermore, the number of sample shots in each group is not particularly limited as long as the number of sample shot groups to be selected is determined according to the number of sample shots in each group, so that the total number of selected sample shots becomes three or more. In this case, the W-EGA mode requires a larger number of sample shots than that of the EGA mode. For this reason, the total number of selected sample shots is preferably always set to be 10 or more regardless of the number of sample shot groups although it depends on a required accuracy of superposition.

In particular, in the $W_1$-EGA mode, it is effective to select shot areas in a local region suffering from a large change in non-linear distortion as sample shots. For this purpose, at least one of a plurality of sample shot groups is preferably set to include shot areas in the local regions as sample shots. Furthermore, in the $W_2$-EGA mode, it is also effective to adopt an X-shaped or cross-shaped sample shot arrangement with reference to a center point of symmetry of a non-linear distortion. For this purpose, one of the plurality of sample shot groups is preferably set to have the X-shaped or cross-shaped sample shot arrangement, or two or more sample shot groups are preferably selected in a combination for attaining the X-shaped or cross-shaped sample shot arrangement.

In each of the above embodiments, when a desired accuracy of superposition cannot be obtained even after the sample shot arrangement is optimized, and the signal processing conditions in the calculation units 41 to 43 are optimized in the EGA mode, the alignment mode is switched to the W-EGA mode. For this reason, the sample shot groups used for optimizing the sample shot arrangement are altered from the arrangement shown in FIG. 17 to that shown in FIG. 18 upon switching of the alignment mode. When the EGA mode employs a sequence in which the sample shot arrangement is not optimized, and a desired accuracy of superposition cannot be obtained using the first sample shot group shown in, e.g., FIG. 17, or when an accuracy of superposition obtained using the first sample shot group is far from a required accuracy even in a sequence (FIG. 17) in which the sample shot arrangement is optimized, the alignment mode is immediately switched to the W-EGA mode.

Figure 19:
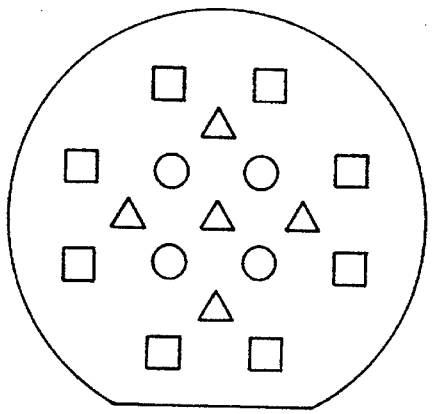
FIG. 19 is a view showing sample shot groups suitably used when the EGA mode is switched to the W-EGA mode.

In this case, three sample shot groups shown in FIG. 19 are stored in the designation section 504, and the arrangement of sample shots can be altered by altering the number and/or combination of sample shot groups to be selected. When the sample shot arrangement is to be altered, if a desired accuracy of superposition cannot be obtained in the EGA mode using, e.g., a first sample shot group (eight sample shots indicated by □ in FIG. 19), the alignment mode is switched to the W-EGA mode, and a second sample shot group (four sample shots indicates by ○ in FIG. 19) and a third sample shot group (five sample shots indicated by Δ in FIG. 19) are added in turn to the first sample shot group.

In the above description, when a sample shot (defective shot), for which neither of two alignment marks can be measured, or credibility of the measurement values of the alignment marks is doubtful (low reliability), is found, a shot area near the defective shot is designated as an alternative shot, and alignment data of the alternative shot can be used. More specifically, a sample shot closest to the defective shot is preferably selected as an alternative shot from sample shot groups other than a sample shot group including the defective shot. For example, in the EGA mode, if a hatched sample shot of the first sample shot group (□) in FIG. 17 is a defective shot, a shot area closest to the defective shot in the second and third sample shot groups, i.e., a hatched sample shot in the third sample shot group (Δ) in FIG. 17, can be designated as an alternative shot.

In place of designating an alternative shot, a defective shot may be merely rejected, i.e., alignment data of the defective shot may be merely inhibited from being used in the EGA calculation. In the W-EGA mode, alignment data is rejected by merely setting a weighting coefficient to be multiplied with the alignment data of the defective shot to be zero, and the EGA calculation is performed using only the remaining alignment data. When a sample shot, for which one (e.g., an X mark) of the two alignment marks cannot be measured or its measurement value has low reliability, is found, alignment data of the other alignment mark (Y mark) alone is used. An X mark of a shot area near the defective shot may be detected, and its alignment data may be used.

In this case, the number of alignment marks to be attached to each of the shot areas on a wafer is not limited to two. For example, four alignment marks (two X marks and two Y marks) may be arranged in correspondence with the respective sides of each shot area. In this case, if at least one pair of alignment marks (X and Y marks) of a given sample shot cannot be measured or are measured with poor reliability, at least one of the remaining pair of alignment marks (X and Y marks) may be detected, and the detected coordinate position may be used, instead of designating an adjacent shot area as a substitute. Alternatively, four alignment marks may be detected per sample shot to determine the X- and Y-directions of each sample shot by using the detected four coordinate positions. In this case, the coordinate position of each sample shot in the X-direction may be determined by performing average processing of the coordinate positions of two X marks, or providing weights for the two coordinate positions, adding the resultant values, and dividing the addition value by the sum of the weights. Note that the coordinate position of each sample shot in the Y-direction may be determined by average processing or the like using the coordinate positions of two Y marks in the same manner as described above.

In addition, an alignment mark to be attached to each shot area on a wafer need not be a one-dimensional mark, but may be a two-dimensional mark. For example, one alignment mark may be constituted by an X-direction mark Mx in FIG. 11A and a Y-direction mark which has the same arrangement as that of the mark Mx and is perpendicular thereto. When a two-dimensional mark is to be used, at least one alignment mark may be arranged in each shot area. However, as described above, four alignment marks may be arranged in correspondence with the respective sides of each shot area, or an alignment mark may be arranged at each of the four corners of each shot area. Note that if a plurality of two-dimensional alignment marks are arranged in each sample shot, alignment marks arranged at the same position in each of a plurality of sample shots on a wafer may be detected. This is because the coordinate position of each shot area on the wafer cannot be accurately obtained owing to a distortion of each shot area which is caused by a distortion of the projection optical system of the projection exposure apparatus which has performed printing of a circuit pattern of a preceding layer, or by deformation (elongation) of the wafer upon heat treatment. Assume that an alignment mark at the same position in each sample shot cannot be detected. In this case, the coordinate position of a sample shot in which an alignment mark at a different position is detected may be corrected by using the aforementioned distortion amount of the shot area, i.e., a distortion of the projection optical system, and the corrected coordinate position may be used. Assume that the coordinate positions of a sample shot in the X- and Y-directions are obtained by detecting only one alignment mark. In this case, if the mark cannot be measured or is measured with poor reliability, at least one of the remaining three alignment marks may be detected to use the detected coordinate position. Furthermore, two or more alignment marks may be detected, and averaging processing or weighting processing of a plurality of coordinate positions may be performed to determine the coordinate positions of each sample shot in the X- and Y-directions. This operation is based on the premise that the distortion amount of each shot area on a wafer is sufficiently small. If this distortion amount cannot be neglected, the coordinate positions of a corresponding sample shot must be corrected by using a distortion of the projection optical system or the like, as described above.

In the EGA or W-EGA mode, whether to reject alignment data (a coordinate position) of a sample shot may be performed as follows. The deviation between the coordinate position measured by, e.g., an alignment sensor and stored in the data store section 501 and the design coordinate position stored in the data section 503 is obtained. The alignment data is rejected only when the deviation exceeds a predetermined allowable value. Alternatively, before sample alignment, the alignment marks of some (e.g., two) shot areas on a wafer may be detected to obtain the coordinate positions of the shot areas. The aforementioned design coordinate position is corrected by using the obtained coordinate positions. The deviation between the corrected coordinate position and the coordinate position measured in the above described manner may be compared with an allowable value for each sample shot, thereby determining whether to reject the alignment data. Instead of comparing the aforementioned deviation with the allowable value, the above deviation may be obtained for, e.g., each sample shot to calculate the standard deviation ($\sigma$ or $3\sigma$), and whether to reject the alignment data may be determined by using this standard deviation. Furthermore, the above allowable value need not be constant, but may be changed for each sample shot. Especially, in the W-EGA mode, as the weights $W_{in}$ and $W_{in}'$ provided by equations (4) and (6) decrease, the allowable values for the alignment data may be increased, and vice versa. With this operation, the influences of alignment data with poor reliability can be reduced while the averaging effect is maintained, thereby accurately obtaining the coordinate positions of each shot area on a wafer. In this case, the allowable values for each sample shot may be determined by using the weights $W_{in}$ and $W_{in}'$. That is, the allowable values for each sample shot may be set to be values proportional to the reciprocals of the weights $W_{in}$ and $W_{in}'$. When the allowable values for each sample shot are set by using the weights $W_{in}$ and $W_{in}'$, since the weights $W_{in}$ and $W_{in}'$ provided for each sample shot change for each shot area on a wafer in the W-EGA mode, the allowable values for each sample shot also change for each shot area. In the W-EGA mode, a coordinate position of each shot area (or only each sample shot) on a wafer may be obtained by the EGA mode using alignment data of each sample shot after the design coordinate position is corrected in the above-described manner. The deviation between the obtained coordinate position and the previously measured coordinate position is compared with an allowable value to determine whether to reject the alignment data for each sample shot.

The fifth embodiment of the present invention will be described below with reference to FIGS. 15 and 16. In this embodiment, an exposure sequence of the projection exposure apparatus shown in FIGS. 2 and 3, i.e., an apparatus having a plurality of alignment modes, will be explained. Assume that the projection exposure apparatus is set to have four alignment modes, i.e., the D/D mode, the EGA mode, the $W_1$-EGA mode, and the $W_2$-EGA mode. In this embodiment, a plurality of (e.g., 25) wafers stored in a single lot are simultaneously processed, and all the wafers in the lot are subjected to various treatments under the same conditions and same processes.

In the projection exposure apparatus shown in FIG. 2, the main control system 10 loads the first wafer in a lot onto the wafer stage WS (step 100). At this time, the main control system 10 receives information (e.g., the type and thickness of a wafer, an undercoating layer, and a resist layer, a pattern and step of an alignment mark, and the like) described in an identification code on the lot or the wafer via the reader 60, and selects an alignment sensor suitable for detection of the alignment marks on the wafer on the basis of the received information. In this embodiment, assume that the LSA system is selected, and preliminary alignment of the wafer is executed using the LSA system (step 101). Note that a single alignment mark on a single wafer may be detected a plurality of number of times using a plurality of alignment sensors to obtain standard deviations in units of alignment sensors, and an optimal alignment sensor may be selected on the basis of the standard deviations, i.e., measurement reproducibility.

In step 101, at least two alignment marks, which are located on a peripheral portion to be almost symmetrical about the center of the wafer, are detected. Thereafter, a residual rotation error of the wafer W is calculated from the coordinate positions of the two marks, and a wafer holder (not shown) is finely rotated, so that the rotation error becomes almost zero. In this manner, the preliminary alignment of the wafer W is completed, and the flow advances to step 102. In step 102, it is checked if the wafer W on the wafer stage WS is one of the first to (k−1)th wafers (k is an integer equal to or larger than 2). In this case, since k=6 is set in advance, and the wafer W is the first one, the flow advances to step 103.

In step 103, the main control system 10 detects alignment marks of all measurement shots on the wafer W using the LSA system, and the LSA system outputs photoelectric signals obtained from these marks to the LSA calculation unit 41. In this case, the measurement shots represent shot areas necessary for obtaining the characteristic of alignment errors of shot areas on the wafer to be described later. The number and positions of shot areas to be designated as measurement shots are determined in advance according to the type of wafer (e.g., expansion/contraction characteristics), the accuracy of measurement of the characteristic, the throughput, and the like, and this information is stored in the memory section 506. In this embodiment, all shot areas on the wafer W are designated as measurement shots, for the sake of simplicity. However, the number of measurement shots may become half or less the total number of shot areas depending on wafers.

In step 104, the LSA calculation unit 41 converts the photoelectric signals from the LSA system into digital values, outputs obtained waveform data to the memory section 40, and executes waveform processing under signal processing conditions determined by the calculation section 505 or an operator, thereby obtaining the coordinate positions of the marks. The mark positions, i.e., the coordinate positions of the shot areas, are stored in the alignment data store section 501, and the calculation section 505 calculates the characteristic of alignment errors of the shot areas on the wafer W using the coordinate positions of all the shot areas (step 105).

Figure 20A:
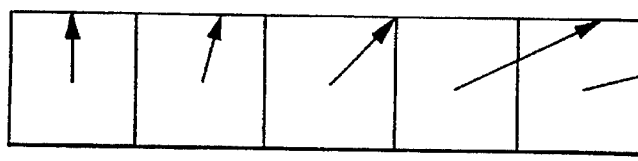
FIGS. 20A to 20C are views for explaining characteristics of alignment errors used upon selection of alignment modes.
Figure 20B:
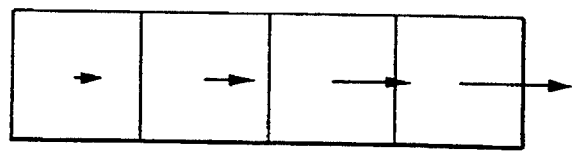

More specifically, in step 105, the calculation section 505 calculates alignment errors of all the shot areas, i.e., differences (shift amounts) between the previously measured coordinate positions of the shot areas and designed coordinate positions. FIG. 20A shows alignment errors of five shot areas as vectors. Thereafter, the calculation section 505 calculates a change amount per unit length of alignment errors of adjacent shot areas on the entire surface of the wafer. FIG. 20B shows the change amounts of the five shot areas in FIG. 20A as vectors. Furthermore, the calculation section 505 calculates a change amount (FIG. 20C) of the above-mentioned change amounts, and then calculates a standard deviation of the change amounts (FIG. 20C) on the entire surface of the wafer. With the above-mentioned calculation processing, the calculation section 505 can recognize the characteristic of alignment errors of the shot areas on the wafer W. The calculated characteristic, i.e., the alignment errors, the change amounts of the alignment errors, the standard deviation (a change amount of the change amounts), and the like are stored in the memory section 506.

When the above-mentioned alignment errors are to be calculated, the origin of an alignment coordinate system of the shot areas obtained in step 104 is caused to coincide with the origin of a designed alignment coordinate system of shot areas in advance using the mark positions obtained in step 101 or 104. In FIG. 20B, the change amount of alignment errors between each two adjacent shot areas aligned in the right-and-left direction in the plane of drawing is always calculated with reference to the alignment error of the shot area at the left-hand side. More specifically, the change amount of alignment errors between each two adjacent shot areas aligned in a predetermined direction must always be calculated with reference to the alignment error of the shot area at a predetermined side.

In step 106, the calculation section 505 determines an alignment mode suitable for the shot alignment on the wafer W using the characteristic of the alignment errors of the shot areas obtained in step 105, i.e., the change amounts and standard deviation of the alignment errors, as shown in FIG. 20B. More specifically, the calculation section 505 pays attention to the change amounts of the alignment errors shown in FIG. 20B, and checks if the directions and magnitudes of the change amounts (vectors in FIG. 20B) on the entire surface of the wafer are almost equal to each other. If it is determined that the directions and magnitudes of the change amounts are almost equal to each other, it is considered that the wafer W has a linear distortion, and the calculation section 505 selects the EGA mode as an optimal alignment mode. The flow then advances to step 107.

On the other hand, when either or both of the directions and magnitudes of the change amount vary, the calculation section 505 pays attention to the standard deviation, and checks if the standard deviation exceeds a predetermined value. If the standard deviation is equal to or smaller than the predetermined value, it is considered that the wafer W has a regular non-linear distortion, and the calculation section 505 selects the W-EGA mode as an optimal alignment mode. The flow then advances to step 117. On the other hand, if the standard deviation exceeds the predetermined value, it is considered that the wafer W has random errors (irregular non-linear distortion), and the calculation section 505 selects the D/D mode as an optimal alignment mode. The flow then advances to step 137. In this case, assume that it is determined that the wafer has a linear distortion, the EGA mode is selected, and the flow advances to step 107.

Figure 20C:
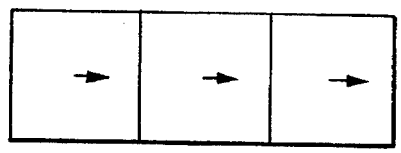

In step 105, the change amounts and standard deviation of alignment errors of shot areas in the right-and-left direction (e.g., X-direction), as shown in FIGS. 20A to 20C, are obtained as the characteristic of alignment errors of the shot areas on the wafer, for the sake of simplicity. However, the shot areas are aligned in a direction (e.g., Y-direction) perpendicular to the above-mentioned direction, and when the change amounts and standard deviation of alignment errors of the shot areas in the Y-direction are obtained as well, the characteristic of the alignment errors of the shot areas on the entire surface of the wafer can be more accurately recognized. As described above, the change amount of alignment errors between each two adjacent shot areas in the Y-direction (up-and-down direction in the plane of drawing) must always be obtained with reference to the alignment error of an upper or lower shot area. Therefore, in this embodiment, assume that an optimal alignment mode for the shot alignment on the wafer is determined after the change amounts and standard deviations of the alignment errors in both the X- and Y-directions are calculated. In this case, if the change amounts of alignment errors in only the X-direction are almost equal to each other, and the change amounts of alignment errors in only the Y-direction are almost equal to each other, it is considered that the wafer has a linear distortion. In this case, if the change amounts in the X- and Y-directions are different from each other, it can be determined that the wafer has a linear distortion.

If the EGA mode is selected in step 106, the calculation section 505 designates the EGA mode in the EGA calculation unit 502 in step 107. The EGA calculation unit 502 receives arrangement information of the first sample shot group (FIG. 17) stored in the sample shot designation section 504, and then reads out alignment data (coordinate positions) of sample shots constituting the first sample shot group from the store section 501. Thereafter, the EGA calculation unit 502 determines the calculation parameters $\underline{a}$ to f from equation (2) using the method of least squares, calculates the coordinate positions of all the shot areas on the wafer W using these parameters $\underline{a}$ to f, and stores the calculated coordinate positions in the memory section 506.

Then, the calculation section 505 calculates a difference (residual error) between the coordinate position (calculated value) of each shot area stored in the memory section 506 and the coordinate position (measurement value) of the corresponding shot area stored in the store section 501 in units of shot areas. The calculation section 505 then calculates an accuracy of superposition ($|X|+3\sigma$) on the basis of the residual errors in units of shot areas (step 108). Furthermore, the calculation section 505 checks if the accuracy of superposition ($|X|+3\sigma$) satisfies a required accuracy (step 109).

If it is determined that the accuracy of superposition satisfies a required accuracy, the flow advances to step 110, and the first sample shot group used in step 107 is stored (registered) in the designation section 504 as an optimal arrangement. The sequence controller 508 starts superposition exposure of reticle patterns for each shot area of the first wafer W according to the coordinate positions (calculated values) of all the shot areas stored in the memory section 506 in step 107 (step 111). Upon completion of the superposition exposure, the flow returns to step 100, and the sequence controller 508 replaces the wafer to load the second wafer in the lot onto the wafer stage WS.

On the other hand, if it is determined that the accuracy of superposition does not satisfy a required accuracy, the flow advances to step 112, and the calculation section 505 checks if the sample shot arrangement is to be altered. In this case, it is determined that the accuracy of superposition does not satisfy a required accuracy since the sample shot arrangement is not optimized, and the flow advances to step 113. In step 113, the sample shot designation section 504 alters the sample shot arrangement, i.e., adds the second sample shot group to the first sample shot group in this embodiment. Furthermore, the EGA calculation unit 502 reads out the coordinate positions of sample shots constituting the second sample shot group from the store section 501 on the basis of arrangement information of the second sample shot group (FIG. 17) stored in the designation section 504. Thereafter, the EGA calculation unit 502 executes an EGA calculation using the coordinate positions of the sample shots in the first and second sample shot groups, thereby calculating the coordinate positions of all the shot areas on the wafer W (step 107).

The calculation section 505 checks if the accuracy of superposition calculated in step 108 satisfies a required accuracy (step 109). If it is determined that the accuracy of superposition satisfies a required accuracy, steps 110 and 111 are executed, as described above, and the flow then returns to step 100. The fact that the accuracy of superposition satisfies a required accuracy by adding the second sample shot group means that the sample shot arrangement is optimized. On the other hand, if it is determined that the accuracy of superposition does not satisfy a required accuracy, the flow advances to step 112 to check if the sample shot arrangement is to be altered.

In this embodiment, the alteration of the sample shot arrangement and the EGA calculation are repetitively executed until the accuracy of superposition satisfies a required accuracy in the EGA mode. In this embodiment, however, the sample shot arrangement is altered by sequentially adding the sample shot groups stored in the designation section 504. For this reason, even if the accuracy of superposition does not satisfy a required accuracy, alteration of the sample shot arrangement may eventually be disabled. More specifically, when no further sample shot group to be added remains, the flow advances to step 114. When the accuracy of superposition does not satisfy a required accuracy after the plurality of sample shot groups are sequentially added, it can be determined that the EGA mode cannot cope with the shot alignment on the wafer. In this case, since the third sample shot group still remains, it is determined that the sample shot arrangement is to be altered, and the flow advances to step 113. In step 113, the third sample shot group is added to alter the sample shot arrangement.

Thereafter, steps 107 to 109 are executed, as described above, and if the accuracy of superposition satisfies a required accuracy, steps 110 and 111 are executed, and the flow returns to step 100. Conversely, if the accuracy of superposition does not satisfy a required accuracy, the flow advances to step 112. In this case, since no more sample shot group to be added remains, the flow immediately advances to step 114 to check if the above-mentioned signal processing conditions in the LSA calculation unit 41 are to be altered. The calculation section 505 checks based on, e.g., the pattern of the waveform data stored in the memory section 40, if the signal processing conditions are to be altered. If it is determined that the signal processing conditions need not be altered, the flow advances to step 115.

On the other hand, if it is determined that the signal processing conditions are to be altered, the flow returns to step 104, and the calculation section 505 alters the signal processing condition, e.g., the waveform analysis algorithm. Thereafter, the EGA calculation unit 502 reads out waveform data of all the alignment marks from the memory section 40, calculates the mark positions upon execution of waveform processing under the altered signal processing condition, and stores the position information in the alignment data store section 501. Note that waveform data stored in the memory section 40 may be displayed on the display unit 62, and an operator may determine an optimal signal processing condition on the basis of the displayed waveform data. In this case, the determined signal processing condition is set in the EGA calculation unit 502 via the input unit 61.

The calculation section 505 executes steps 105 and 106 using the new position information stored in the store section 501 in the same manner as above, and determines an alignment mode. In this case, it is assumed that the EGA mode is selected, and the flow advances to step 107. The EGA calculation unit 502 executes an EGA calculation using the first sample shot group, thereby calculating the coordinate positions of all the shot areas on the wafer. Thereafter, the alteration of the sample shot arrangement and the EGA calculation are repetitively executed until the accuracy of superposition satisfies a required accuracy. If the accuracy of superposition does not satisfy a required accuracy under the new signal processing condition, the signal processing conditions are optimized by repeating the above-mentioned operation until the required accuracy is satisfied. Then, the superposition exposure can be executed in the EGA mode.

If the accuracy of superposition does not satisfy a required accuracy after the signal processing conditions are altered repetitively, the flow advances to step 115. If an alignment mode (W-EGA mode or D/D mode) other than the EGA mode is selected in step 106, the flow need only advance to the selected mode (step 117 or 137). In FIG. 15, steps 105 and 106 are executed again to determine an alignment mode after the signal processing conditions are altered, and mark positions are calculated again. However, after the mark positions are calculated under the new signal processing conditions, the flow may immediately advance to the EGA mode (step 107).

In step 115, it is checked if the alignment mode is altered for the wafer for which a required accuracy of superposition cannot be obtained in the EGA mode after the sample shot arrangement and the signal processing conditions are altered. Whether or not the alignment mode is altered is determined by the calculation section 505 according to a predetermined program, or may be determined by an operator by informing an exposure disable state in the EGA mode to the operator by means of, e.g., a buzzer. When the mode is to be altered, the flow advances to the W-EGA mode, i.e., step 117; otherwise, the first wafer is rejected without executing superposition exposure therefor, i.e., the first wafer is unloaded from the wafer stage WS (step 116). Thereafter, the first wafer is stored in the original lot or an unloading lot, and the sequence controller 508 loads the second wafer onto the wafer stage WS simultaneously with the unloading operation. In the above description, both the sample shot arrangement and the signal processing conditions are altered in the EGA mode. Alternatively, a sequence which alters one of the sample shot arrangement and the signal processing conditions, or a sequence which alters neither of them, may be adopted.

An exposure sequence in the W-EGA mode will be described below with reference to FIG. 16. If the W-EGA mode is selected in step 106, or if the alignment mode is altered from the EGA mode to the W-EGA mode in step 115, the flow immediately advances to step 117. 0 In step 117, the calculation section 505 checks based on the characteristic of alignment errors stored in the memory section 506, in particular, the change amounts of alignment errors, if a regular non-linear distortion is a point-symmetric distortion. If the non-linear distortion is not a point-symmetric distortion, the flow advances to the $W_1$-EGA mode, i.e., step 118; otherwise, the flow advances to the $W_2$-EGA mode, i.e., step 127. In this case, it is assumed that the non-linear distortion is not a point-symmetric distortion, and an exposure sequence in the $W_1$-EGA mode will be described below.

In step 118, the calculation section 505 designates the $W_1$-EGA mode in the EGA calculation unit 502, and the EGA calculation unit 502 receives arrangement information of the first sample shot group (FIG. 18) stored in the sample shot designation section 504. Thereafter, the EGA calculation unit 502 reads out the coordinate positions of sample shots constituting the first sample shot group from the store section 501. The calculation section 505 or an operator determines the value of the parameter S (i.e., the weighting parameter D or the correction coefficient C) in equation (4), as described above, and supplies it to the weight generation section 507. The weight generation section 507 calculates weighting coefficients to be multiplied with the coordinate positions of the nine sample shots in units of shot areas using the weighting function (equation (4)) determined based on the value of the parameter S, and outputs the calculated weighting coefficients to the EGA calculation unit 502. Thereafter, the EGA calculation unit 502 multiplies the coordinate positions of the sample shots with the weighting coefficients from the weight generation section 507 in units of shot areas, and thereafter, determines the calculation parameters a to f from equation (3) by the method of least squares. Then, the unit 502 calculates the coordinate positions of all the shot areas using the calculated parameters a to f. The calculated coordinate positions of all the shot areas are stored in the memory section 506 together with the value of the parameter S.

The calculation section 505 then calculates an accuracy of superposition ($|X|+3\sigma$) in the $W_1$-EGA mode (step 119) like in the EGA mode (step 108), and checks if the accuracy of superposition satisfies a required accuracy (step 120). If it is determined that the accuracy of superposition satisfies a required accuracy, the flow advances to step 121, the first sample shot group is designated as an optimal arrangement in the designation section 504, and the weighting function determined in the weight generation section 507 is set as an optimal function. The sequence controller 508 executes superposition exposure of reticle patterns on each shot area on the first wafer W according to the coordinate positions (calculated values) of all the shot areas stored in the memory section 506 in step 118 (step 122). Upon completion of the superposition exposure, the flow returns to step 100, and the sequence controller 508 replaces the wafer to load the second wafer in the lot onto the wafer stage WS.

On the other hand, if it is determined that the accuracy of superposition does not satisfy a required accuracy, the flow advances to step 123, and the calculation section 505 checks if a condition of calculation, i.e., the sample shot arrangement and/or the value of the parameter S are/is altered. In this case, it is determined that the value of the parameter S is not optimized, and the flow advances to step 124. In step 124, the calculation section 505 (or an operator) alters the value of the correction coefficient C (or the weighting parameter D), and supplies the new value to the weight generation section 507. In step 118, the weight generation section 507 alters the parameter S, i.e., the weighting function (equation (4)) according to the value of the correction coefficient C (or the weighting parameter D) from the calculation section 505 (or the operator). Furthermore, the EGA calculation unit 502 multiplies the coordinate positions of the nine sample shots constituting the first sample shot group with the weighting coefficients from the weight generation section 507 in units of shot areas, and then executes an EGA calculation, thereby calculating the coordinate positions of all the shot areas on the wafer W.

The calculation section 505 checks if the accuracy of superposition calculated in step 119 satisfies a required accuracy (step 120). If the accuracy of superposition satisfies a required accuracy, steps 121 and 122 are executed, and the flow returns to step 100. On the other hand, if the accuracy of superposition does not satisfy a required accuracy, the flow advances to step 123 to check if the value of the parameter S is altered again, or the sample shot arrangement is altered as well. In this case, it is determined that the value of the parameter S is to be altered, and the flow advances to step 124. In step 124, the value of the correction coefficient C or the weighting parameter D is altered. Thereafter, steps 118 to 120 are executed. If the accuracy of superposition satisfies a required accuracy, steps 121 and 122 are executed, and the flow returns to step 100. Conversely, if the accuracy of superposition does not satisfy a required accuracy, the flow advances to step 123.

In this embodiment, the EGA calculation is repetitively executed while sequentially altering at least one of the value of the parameter S and the sample shot arrangement until the accuracy of superposition-in the $W_1$-EGA mode satisfies a required accuracy. In the $W_1$-EGA mode, the sample shot arrangement is also altered by sequentially adding the sample shot groups (FIG. 18) stored in the designation section 504. For this reason, even when the accuracy of superposition does not satisfy a required accuracy, when alteration of the sample shot arrangement is disabled, i.e., when no more sample shot group to be added remains, the flow advances to step 125. In the $W_1$-EGA mode, it is preferable that the EGA calculation is executed while sequentially altering the value of the parameter S with a predetermined sample shot arrangement, and the sample shot arrangement is altered when it is determined that the accuracy of superposition does not satisfy a required accuracy by altering only the value of the parameter S.

If the accuracy of superposition does not satisfy a required accuracy after the value of the parameter S and the sample shot arrangement are altered, it is determined in step 124 that the condition is not changed, and the flow advances to step 125 to check if the alignment mode is altered from the $W_1$-EGA mode to the D/D mode. Whether or not the alignment mode is altered is determined by the calculation section 505 according to a predetermined program, or may be determined by an operator by informing an exposure disable state in the $W_1$-EGA mode to the operator by means of, e.g., the display unit 62 or a buzzer. When the mode is to be altered, the flow advances to the D/D mode, i.e., step 137; otherwise, the first wafer is rejected without executing superposition exposure therefor (step 126). Thereafter, the first wafer is stored in the original lot or an unloading lot, and the sequence controller 508 loads the second wafer onto the wafer stage WS simultaneously with the unloading operation. In the above description, the value of the parameter S and the sample shot arrangement are altered. Alternatively, a sequence which alters one of these conditions, or a sequence which alters neither of them, may be adopted. Furthermore, the signal processing conditions of the LSA calculation unit 41 may also be altered like in the EGA mode.

An exposure sequence in the $W_2$-EGA mode will be described below. In this case, since the $W_2$-EGA mode is substantially the same as the $W_1$-EGA mode except that the coordinate positions of sample shots are weighted using the center point of symmetry of a regular non-linear distortion as well, the difference will be briefly described below. If it is determined in step 117 that the regular non-linear distortion is a point-symmetrical distortion, the flow immediately advances to the $W_2$-EGA mode, i.e., step 127. The calculation section 505 calculates the coordinate position of the center point of symmetry of the non-linear distortion using the characteristic of alignment errors of the shot areas calculated in step 105, and supplies the calculated coordinate position to the weight generation section 507. In this case, an operator may determine the coordinate position of the center point of symmetry of the non-linear distortion by displaying the characteristic of alignment errors of the shot areas on the display unit 62, and may input the determined coordinate position to the weight generation section 507.

In step 128, the calculation section 505 designates the $W_2$-EGA mode in the EGA calculation unit 502. The EGA calculation unit 502 reads out the coordinate positions of sample shots from the store section 501 on the basis of arrangement information of the first sample shot group (FIG. 18). The calculation section 505 or an operator determines the value of the parameter S (the weighting parameter D or the correction coefficient C) in equation (6), as described above, and supplies it to the weight generation section 507. The weight generation section 507 determines the weighting function (equation (6)) on the basis of the value of the parameter S and the coordinate position of the center point of symmetry, calculates weighting coefficients to be multiplied with the coordinate positions of the nine sample shots in units of shot areas using the determined function, and outputs the calculated weighting coefficients to the EGA calculation unit 502. Thereafter, the EGA calculation unit 502 multiplies the coordinate positions of the sample shots with the weighting coefficients from the weight generation section 507 in units of shot areas, and thereafter, determines the calculation parameters $\underline{a}$ to f from equation (5) by the method of least squares. Then, the unit 502 calculates the coordinate positions of all the shot areas using the calculated parameters $\underline{a}$ to f. The calculated coordinate positions of all the shot areas are stored in the memory section 506 together with the value of the parameter S and the coordinate position of the center point of symmetry.

The calculation section 505 calculates an accuracy of superposition (|X|+3σ) in the $W_2$-EGA mode (step 129), and checks if the accuracy of superposition satisfies a required accuracy (step 130). If it is determined that the accuracy of superposition satisfies a required accuracy, the flow advances to step 131, the first sample shot group is designated as an optimal arrangement in the designation section 504, and the weighting function determined in the weight generation section 507 is set as an optimal function. The sequence controller 508 executes superposition exposure of reticle patterns on each shot area on the first wafer W according to the coordinate positions (calculated values) of all the shot areas stored in the memory section 506 in step 128 (step 132).

On the other hand, if the accuracy of superposition does not satisfy a required accuracy, the flow advances to step 133, and the calculation section 505 checks if a condition of calculation, i.e., at least one of the coordinate value of the center point of symmetry, the value of the parameter S, and the sample shot arrangement is altered. The reason why the coordinate value of the center point of symmetry is designated as the condition of calculation is that the accuracy of calculation (accuracy of superposition) of a shot alignment is lowered if the coordinate value of the center point of symmetry determined in step 127 is deviated from the actual center point. In this case, it is determined that the coordinate value of the center point of symmetry is not accurate, and the flow advances to step 134. The calculation section 505 (or an operator) re-calculates the coordinate position of the center point of symmetry of the non-linear distortion, and supplies it to the weight generation section 507. In step 128, the weight generation section 507 alters the weighting function (equation (6)) according to the corrected coordinate position of the center point of symmetry, and thereafter, calculates weighting coefficients to be multiplied with the coordinate positions of sample shots in units of shot areas using the altered function. Furthermore, the EGA calculation unit 502 executes the EGA calculation after the coordinate positions of sample shots are weighted in units of shot areas, thereby calculating the coordinate positions of all the shot areas on the wafer W.

The calculation section 505 checks if the accuracy of superposition calculated in step 129 satisfies a required accuracy (step 130). If the accuracy of superposition satisfies a required accuracy, steps 131 and 132 are executed, and the flow then returns to step 100. On the other hand, if the accuracy of superposition does not satisfy a required accuracy, the flow advances to step 133 to check if the coordinate value of the center point of symmetry is altered again, or the parameter S and/or the sample shot arrangement are/is altered as well. In this case, it is determined that the value of the parameter S is altered, and the flow advances to step 134 to alter the value of the correction coefficient C or the weighting parameter D as in the above-mentioned $W_1$-EGA mode. Thereafter, steps 128 to 130 are executed. If the accuracy of superposition satisfies a required accuracy, steps 131 and 132 are executed, and the flow then returns to step 100. On the other hand, if the accuracy of superposition does not satisfy a required accuracy, the flow advances to step 133.

In this case, in the $W_2$-EGA mode, the EGA calculation is repetitively executed while sequentially altering at least one of the coordinate value of the center point of symmetry, the value of the parameter S, and the sample shot arrangement until the accuracy of superposition satisfies a required accuracy. In the $W_2$-EGA mode, the sample shot arrangement is also altered by sequentially adding the sample shot groups (FIG. 18). For this reason, even when the accuracy of superposition does not satisfy a required accuracy, when alteration of the sample shot arrangement is disabled, i.e., when no sample shot group to be added remains, the flow advances to step 135. In the $W_2$-EGA mode, it is preferable that the EGA calculation is executed while sequentially altering the coordinate value of the center point of symmetry with a predetermined sample shot arrangement and a predetermined value of the parameter S, and the sample shot arrangement and/or the value of the parameter S are/is altered when it is determined that the accuracy of superposition does not satisfy a required accuracy by altering only the coordinate value of the center point of symmetry. Furthermore, when the sample shot arrangement or the value of the parameter S is altered, it is preferable that the sample shot arrangement is altered when it is determined that the accuracy of superposition does not satisfy a required accuracy by altering only the value of the parameter S like in the $W_1$-EGA mode.

If the accuracy of superposition does not satisfy a required accuracy after the coordinate value of the center point of symmetry, the value of the parameter S, and the sample shot arrangement are altered, it is determined in step 134 that conditions are not altered, and the flow advances to step 135 to check if the alignment mode is altered from the $W_2$-EGA mode to the D/D mode. Whether or not the alignment mode is altered is determined by the calculation section 505 according to a predetermined program, or may be determined by an operator by informing an exposure disable state in the $W_2$-EGA mode to the operator by means of, e.g., the display unit 62 or a buzzer. When the mode is to be altered, the flow advances to the D/D mode, i.e., step 137; otherwise, the first wafer is rejected without executing superposition exposure therefor (step 136). Thereafter, the first wafer is stored in the original lot or an unloading lot, and the sequence controller 508 loads the second wafer onto the wafer stage WS simultaneously with the unloading operation. In the above description, the coordinate value of the center point of symmetry, the value of the parameter S, and the sample shot arrangement are altered. Alternatively, a sequence which alters one or two of these conditions, or a sequence which alters neither of them, may be adopted. Furthermore, the signal processing conditions of the LSA calculation unit 41 may also be altered like in the EGA mode.

The $W_1$-EGA mode and the $W_2$-EGA mode have been described. In step 118 or 128, the weight generation section 507 calculates weighting coefficients to be multiplied with the coordinate positions of sample shots in accordance with the distances between one shot area on the wafer and a plurality of sample shots. At this time, the distances are calculated based on the coordinate position of the shot area, and the coordinate positions of the sample shots. In this case, the coordinate positions of the shot area and the sample shots on the wafer may use either the coordinate positions (designed values) stored in the exposure shot position data section 503 or the coordinate positions (measurement values) stored in the store section 501 in step 104. The weighting function is prepared for each of the X-direction alignment mark ($Mx_1$) and the Y-direction alignment mark ($My_1$), and independent weighting coefficients $W_{in}$ can be set in the X- and Y-directions. For this reason, even when the degree (magnitude) or rule of a non-linear distortion on a wafer, or the step pitch varies in the X- and Y-directions, the shot alignment errors on the wafer can be accurately corrected by independently setting the values of the parameter S. Therefore, when the value of the parameter S is altered, as described above, different values may be set in the X- and Y-directions.

In step 117, it is checked if the regular non-linear distortion is a point-symmetrical distortion. In this case, a sequence for directly altering the alignment mode from the EGA mode to the $W_1$-EGA mode may be employed. Furthermore, if the $W_2$-EGA mode is selected in step 117, and the accuracy of superposition in this mode does not satisfy a required accuracy, the flow advances from step 135 to step 137 in FIG. 16, and the alignment mode is altered to the D/D mode. However, a sequence for altering the alignment mode from the $W_2$-EGA mode (step 135) to one of the $W_1$-EGA mode (step 118) and the D/D mode (step 137) may be employed.

In the EGA, $W_1$-EGA, and $W_2$-EGA modes, the accuracy of superposition ($|X|+3\sigma$) is checked, and if this accuracy is low, various conditions are altered. Thus, in these three modes, the sample shot arrangement, the value of the parameter S, the coordinate value of the center point of symmetry, the signal processing conditions, and the like are optimized. Alternatively, if the alignment mode is selected in step 106, superposition exposure may be immediately executed according to the selected alignment mode. Furthermore, in the EGA, $W_1$-EGA, and $W_2$-EGA modes, if the accuracy of superposition satisfies a required accuracy, superposition exposure is executed using the coordinate positions (calculated values) of all the shot areas calculated by the EGA calculation. Alternatively, superposition exposure may be executed using the coordinate values (measurement values) of all the shot areas obtained in step 104.

Figure 15B:
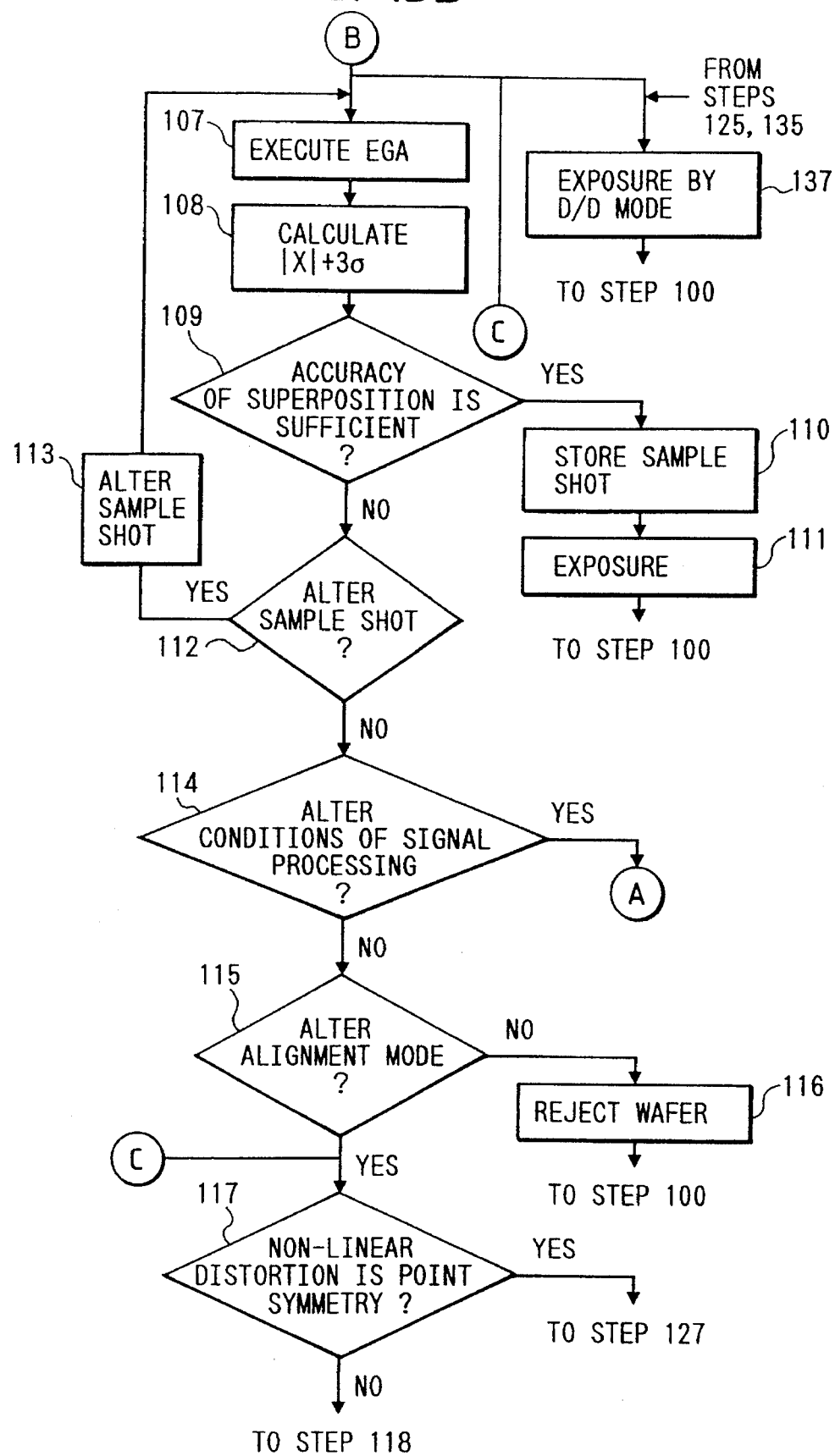
FIG. 15 comprised of FIGS. 15A and 15B and FIG. 16 comprised of FIGS. 16A and 16B are flow charts showing an exposure sequence according to the fifth embodiment of the present invention.
Figure 16B:
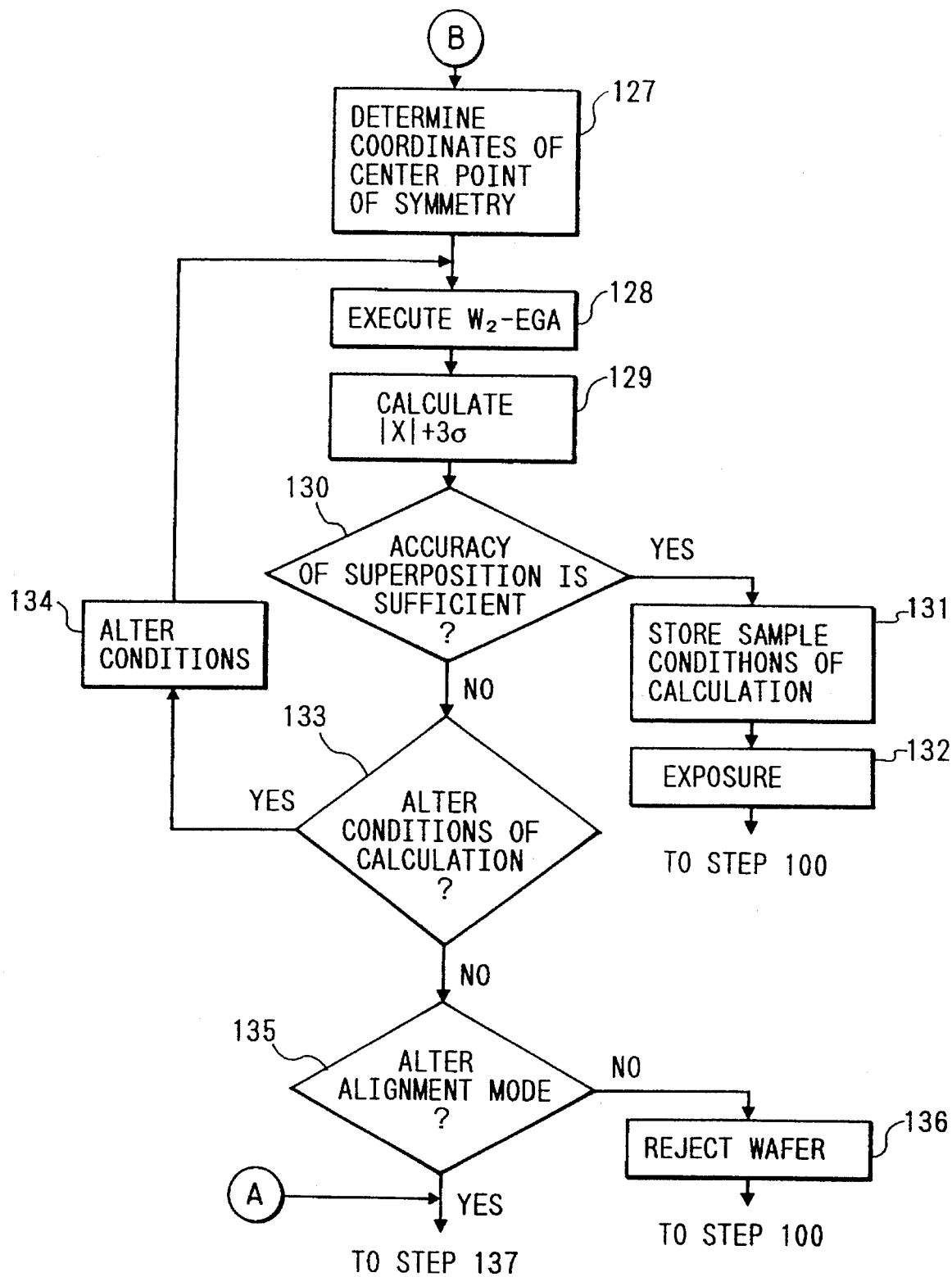

If the D/D mode is selected in step 106, or if the alignment mode is altered from the W-EGA mode to the D/D mode in step 125 or 135, the flow immediately advances to step 137 in FIG. 15. In step 137, the calculation section 505 instructs the sequence controller 508 to execute superposition exposure in the D/D mode. The sequence controller 508 detects the alignment marks using the LSA system in units of shot areas, aligns the wafer stage WS according to the coordinate positions of the marks, and thereafter, executes superposition exposure of reticle patterns. Upon completion of superposition exposure for all the shot areas, the flow returns to step 100, and the sequence controller 508 replaces the wafer to load the second wafer onto the wafer stage WS.

Upon execution of superposition exposure in the D/D mode, the alignment marks may be detected using the LSA system. Alteratively, the wafer stage WS may be aligned according to the coordinate positions stored in the store section 501 in step 104 without executing re-measurement using the LSA system. In FIG. 15, if the accuracy of superposition in the EGA mode does not satisfy a required accuracy, the flow advances from step 115 to step 117 to execute the W-EGA mode. In this case, a sequence for advancing the flow from step 115 to step 137 to execute the D/D mode may be employed. In step 116, 126, or 136, the wafer can be rejected. Even if the accuracy of superposition does not satisfy a required accuracy in at least one of the EGA mode, the $W_1$-EGA mode, and the $W_2$-EGA mode, the flow may always advance to step 137 to execute superposition exposure in the D/D mode without rejecting the wafer. When superposition exposure is executed in the D/D mode, another alignment sensor (the LIA and FIA systems) may be used in place of the alignment sensor (the LSA system in this case) selected in step 100 as long as the alignment marks on the wafer can be detected.

As described above, the first wafer in the lot is subjected to superposition exposure in one of the four alignment modes, and thereafter, the second wafer is loaded onto the wafer stage WS. An exposure operation for the second and subsequent wafers will be described below. In this case, since the formation conditions (the types of an undercoating layer, a pattern of an alignment mark, and the like) of the first and second wafers are the same, the second and subsequent wafers use the alignment sensor (LSA system) used for the first wafer. Therefore, the alignment sensor need not be selected in step 100 for the second and subsequent wafers.

As described above, in this embodiment, since k=6 is set in step 102, the same sequence as for the first wafer is executed for the second to fifth wafers. More specifically, steps 100 to 106 are executed to select an alignment mode, and superposition exposure is executed according to the selected alignment mode. In this case, as for the alignment mode (one of three alignment modes except for the D/D mode) selected for the first wafer, various conditions (the sample shot arrangement, the parameter S, and the like) have already been optimized. Therefore, if the alignment mode determined for the second to fifth wafers is the same as the alignment mode for the first wafer, various conditions of calculation in the determined mode need not be optimized for the second to fifth wafers. More specifically, superposition exposure need only be started in the previously determined alignment mode and under the optimized conditions of calculation. In at least one of the second to fifth wafers, if the accuracy of superposition ($|X|+3\sigma$) does not satisfy a required accuracy under the previously optimized conditions of calculation, optimization is performed while altering the conditions of calculation in units of wafers, which do not satisfy a required accuracy. In this embodiment, assume that the EGA mode is selected for all of the first to fifth wafers, and the accuracies of superposition of these wafers satisfy the required accuracy under the optimized conditions of calculation for the first wafer.

An exposure operation for the sixth and subsequent wafers will be described below. If the sixth wafer is loaded onto the wafer stage WS in step 100, the sequence controller 508 executes preliminary alignment using the LSA system (step 101). Furthermore, the sixth wafer is determined in step 102, and the flow advances to step 138. In step 138, the calculation section 505 determines an alignment mode of the sixth wafer according to the alignment mode selected for the first to fifth wafers. More specifically, since the EGA mode is selected for all the first to fifth wafers, it is determined that the EGA mode is used for the sixth and subsequent wafers.

In step 139, the sequence controller 508 detects alignment marks in units of sample shots using the LSA system according to the sample shot arrangement (and also, the signal processing conditions) optimized in the processing for the first to fifth wafers, and the LSA calculation unit 41 outputs the coordinate positions of the marks to the store section 501. Thereafter, the EGA calculation unit 502 executes the EGA calculation using the coordinate positions stored in the store section 501, thereby calculating the coordinate positions of all shot areas on the sixth wafer. Furthermore, the sequence controller 508 executes superposition exposure according to the coordinate positions of the shot areas calculated by the EGA calculation unit 502.

The sequence controller 508 then checks if superposition exposure is completed for all the wafers in the lot (step 140). In this case, since the exposure is completed only up to the sixth wafer, the flow immediately returns to step 100, and the seventh wafer is loaded onto the wafer stage WS. Furthermore, superposition exposure for the seventh wafer is executed according to the EGA mode (step 139). Thereafter, the superposition exposure is repetitively executed in the EGA mode until the superposition exposure for all the wafers in the lot is completed. Since the alignment mode to be used has already been determined for the seventh and subsequent wafers, the flow immediately advances to step 139 to execute superposition exposure immediately after the preliminary alignment in step 101. With the above-mentioned exposure sequence, reticle patterns can be accurately superposition-exposed on all the wafers in the lot.

In this embodiment, the EGA mode is assumed to be selected for all of the second to fifth wafers. However, if an alignment mode other than the EGA mode is selected for one of these wafers, this wafer is assumed as the first wafer in the lot, and superposition-exposure is performed for this wafer in the selected alignment mode. In particular, if a mode other than the D/D mode is selected, optimization of various conditions of calculation of the selected mode is also executed. In this case, the above-mentioned selection of the alignment mode is performed for each of wafers from the wafer assumed as the first wafer up to the (k−1)th=fifth wafer. For example, if the $W_1$-EGA mode is selected for the fourth wafer, the selection of an alignment mode is performed for five wafers from the fourth wafer, i.e., for the fourth to eighth wafers. If the $W_1$-EGA mode is selected for all of the fourth to eighth wafers, superposition exposure for the ninth and subsequent wafers can be performed in the $W_1$-EGA mode.

When a plurality of lots are continuously processed, if the same alignment mode is selected for all of the first to (k−1)th wafers in the first lot, the value of k in the next lot is set to be smaller than that in the first lot. Thereafter, the value of k in the next lot is decreased as long as the same alignment mode is selected for all of the first to (k−1)th wafers in the lot. Thus, the number of wafers (the total number of wafers in all the lots) to be subjected to selection of the alignment mode can be decreased, and the throughput can be improved while maintaining accuracy of selection of the alignment mode in units of lots.

When the coordinate positions of all the shot areas are calculated by the EGA calculation in step 107, 118, or 128, the characteristic (trend) of alignment errors of one or several shot areas may be largely different from the remaining shot areas, and the shot area (isolated shot) having the different trend may be designated as a sample shot. In this case, the accuracy of calculation (the accuracy of superposition $|X|+3\sigma$) of the shot alignment may be lowered. Whether or not a given shot area is an isolated shot can be determined based on the characteristic of an alignment error obtained in step 105. Therefore, when an isolated shot is included in a sample shot group, alignment data of the isolated shot is rejected in the EGA calculation in the same manner as that for a defective shot described above. As a result, the shot alignment can be accurately calculated by the EGA calculation, and the accuracy of superposition ($|X|+3\sigma$) can be improved. For this reason, the coordinate position of the isolated shot need not be calculated in the EGA calculation. A shot area determined as an isolated shot in the first to (k−1)th wafers is not designated in the k-th and subsequent wafers, and the D/D mode is preferably used for superposition exposure of such wafers.

In this embodiment, the alignment mode of the k-th and subsequent wafers is determined according to the alignment mode selected for all of the first to (k−1)th wafers. Alternatively, the alignment mode of the k-th and subsequent wafers may be determined according to the alignment mode selected for at least one of the first to (k−1)th wafers. At this time, of the first to (k−1)th wafers, selection of the alignment mode (steps 103 to 106) need not be executed for wafers other than a wafer used in selection of the alignment mode, and superposition exposure need only be performed for such wafers according to a predetermined alignment mode.

When the value of (k−1) is small, e.g., about 3 or less, a desired accuracy of superposition cannot often be obtained upon execution of superposition exposure for the k-th and subsequent wafers according to the previously determined alignment mode, although it depends on the material, processing conditions, and the like of wafers. If the value of (k−1) is increased, an optimal alignment mode for wafers in the lot can be accurately selected, and a desired accuracy of superposition can be obtained in any one of the k-th and subsequent wafers. However, in this case, the processing time per lot is prolonged, and the throughput is considerably decreased.

Thus, an exposure sequence, which can minimize a decrease in throughput while maintaining a desired accuracy of superposition for all wafers in a lot, will be described below. In this case, k=3 is set, and an alignment mode is determined in each of the first to (k−1)th wafers, i.e., first and second wafers in the same manner as described above. Since the exposure sequence for the first and second wafers is the same as that in the fifth embodiment, a detailed description thereof will be omitted, and an exposure sequence for k-th (k=3) and subsequent wafers will be described below. Assume that the EGA mode is selected as an alignment mode for each of the first and second wafers. FIG. 21 is a flow chart showing an exposure sequence of this embodiment. The same step numbers in FIG. 21 denote the same steps as in FIG. 15, and a detailed description thereof will be omitted.

Since the EGA mode is selected for each of the first and second wafers, the calculation section 505 determines the EGA mode as an alignment mode for the third wafer (step 138). If the determined alignment mode is one of three modes other than the D/D mode, the flow advances to step 200; only when the D/D mode is selected, the flow advances to step 208. In step 200, the sequence controller 508 performs sample alignment using the alignment sensor selected and used for the first and second wafers, and the optimized sample shot arrangement (and also, signal processing conditions), i.e., obtains the coordinate positions of all sample shots, and stores these coordinate positions in the store section 501.

It is then checked whether or not to confirm that the trend of alignment errors in the third wafer is substantially the same as that in the first and second wafers (step 201). In this case, since the above-mentioned selection of an alignment mode is executed for only the first and second wafers, it is determined that the above-mentioned confirmation is performed for α (e.g., α=3) wafers from the third wafer, i.e., the third to fifth wafers, and the flow advances to step 202. If the maximum number of wafers which can be stored in a single lot is represented by t, the value of α is determined to fall within a range of $1 \leq \alpha \leq (t-(k-1))$. On the other hand, since the above-mentioned confirmation is not performed for the (k+α)th, i.e., sixth and subsequent wafers, the flow immediately advances to step 204.

Figure 22:
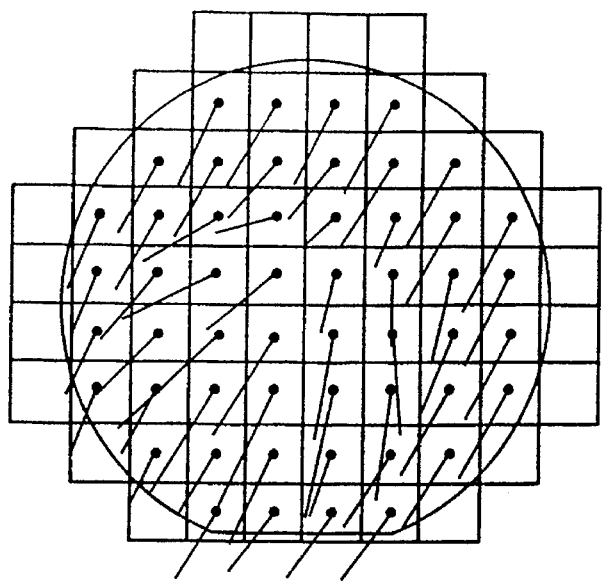
FIG. 22 is a vector map showing alignment errors of shot areas on a first wafer.
Figure 23:
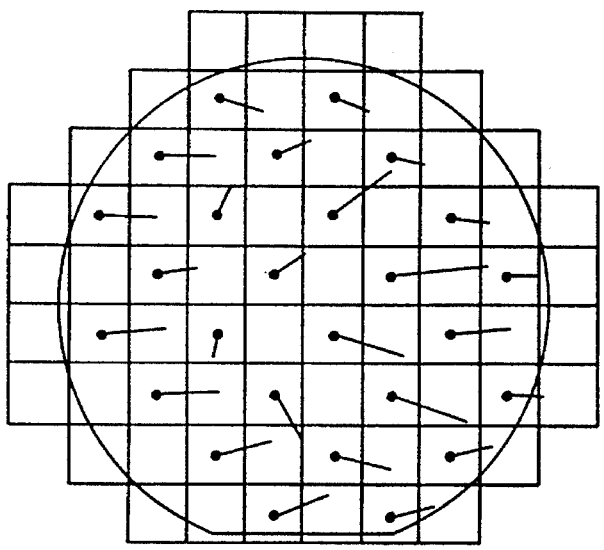
FIG. 23 is a vector map showing alignment errors of sample shots on a k-th wafer.
Figure 24:
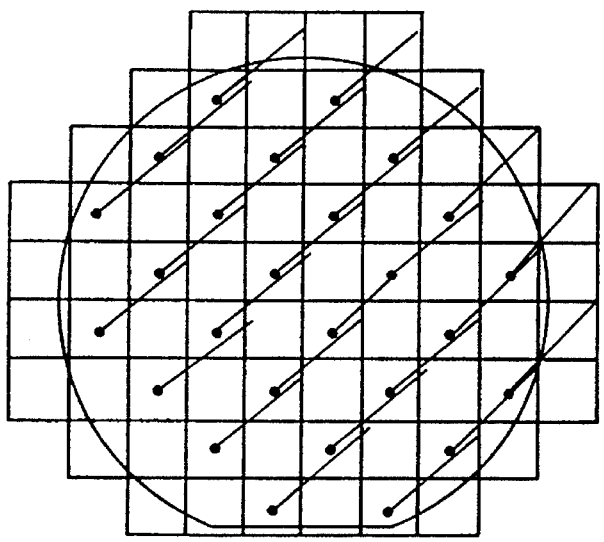
FIG. 24 is a vector map showing change amounts of the alignment errors of the sample shots on the k-th wafer (FIG. 23) with reference to the alignment errors of the shot areas on the first wafer (FIG. 22).

In step 202, the calculation section 505 reads out alignment errors of all the shot areas on the first wafer stored in the memory section 506 in step 105. FIG. 22 shows the readout alignment errors of the shot areas as vectors. In this case, a wafer for which alignment errors are to be read out is not limited to the first wafer, but may be one of the first to (k−1)th wafers. In addition, alignment errors of all the shot areas need not always be read out. For example, only alignment errors of a plurality of shot areas corresponding to the sample shot arrangement (e.g., the first sample shot group in FIG. 17) used for the third wafer in step 200 may be read out. Then, the calculation section 505 calculates alignment errors of sample shots on the third wafer obtained in step 200. FIG. 23 shows the alignment errors of the sample shots as vectors. Furthermore, the calculation section 505 calculates change amounts of the alignment errors of the sample shots with reference to the readout alignment errors in units of sample shots, and outputs the change amounts in units of sample shots to the memory section 506. FIG. 24 shows the change amounts of the alignment errors as vectors.

As described above, the EGA calculation uses the scaling amounts Rx and Ry, the offset amounts Ox and Oy, the residual rotation error θ, and the degree of orthogonality ω as variable elements. Of the above-mentioned four variable elements, the offset amounts Ox and Oy and the residual rotation error θ may vary in units of wafers even though these wafers are those in a single lot. However, the scaling amounts Rx and Ry and the degree of orthogonality ω may be almost constant for all the wafers as long as the wafers are those in a single lot. Therefore, when the two components, i.e., the offset amounts Ox and Oy and the residual rotation error θ are removed from the calculated change amounts of the alignment errors, the remaining amount can be assumed as a variation of printing positions in a single lot, which variation is attributed to the scaling amounts Rx and Ry and the degree of orthogonality ω. If the amount assumed as the variation of printing positions in a single lot (to be referred to as an assumed amount hereinafter) is larger than a predetermined value, it is considered that the trend of alignment errors in a single lot changes, or a variation in a single lot is considerable. Conversely, if the assumed amount is equal to or smaller than the predetermined value, it is considered that the trend of alignment errors in a single lot is the same. Thus, whether or not the trend of the alignment errors of the k-th wafer is the same as that of the first to (k−1)th wafers can be easily confirmed by obtaining the alignment errors of sample shots on the k-th wafer.

After the change amounts (FIG. 23) of the alignment errors of the sample shots are calculated, the EGA calculation unit 502 executes the EGA calculation using the coordinate positions of the sample shots on the third wafer to calculate the calculation parameters a to f, i.e., the offset amounts Ox and Oy and the residual rotation error θ. At this time, the EGA calculation is executed under an assumption that the scaling amounts Rx and Ry and the degree of orthogonality ω are zero, thereby obtaining only the offset amounts Ox and Oy and the residual rotation error θ. Thereafter, the calculation section 505 removes components of the offset amounts Ox and Oy and the residual rotation error θ from the change amounts in units of sample shots stored in the memory section 506 to obtain the above-mentioned assumed amounts in units of sample shots.

Furthermore, the calculation section 505 compares each assumed amount and the predetermined value. If the assumed amounts of all the sample shots are equal to or smaller than the predetermined value, it is determined that the trend of the alignment errors of the third wafer is the same as that of the first wafer, and the flow advances to step 204. In this case, assume that the same trend of alignment errors is determined, and the flow advances to step 204. In step 204, the EGA calculation unit 502 executes the EGA calculation using the coordinate positions of the sample shots stored in the store section 501, thereby calculating the coordinate positions of all shot areas on the third wafer. Thereafter, the sequence controller 508 executes superposition exposure for each shot area while aligning the wafer stage WS according to the coordinate positions of all the shot areas (step 205).

The sequence controller 508 then checks if superposition exposure is completed for all the wafers in the lot (step 206). Since the exposure is completed only up to the third wafer, the flow immediately returns to step 100, and the fourth wafer is loaded onto the wafer stage WS. Thereafter, the above-mentioned operation is repetitively executed, and after the trends of the alignment errors of the fourth and fifth wafers are confirmed, superposition exposure is executed. At this time, since the alignment mode used for the fourth and fifth wafers has already been determined, the flow advances to step 200 after completion of preliminary alignment in step 101, and sample alignment is executed. Upon completion of superposition exposure for the fifth wafer, if it is confirmed that the trends of the alignment errors of the third to fifth wafers are the same as that of the first wafer, the flow immediately advances from step 200 to step 204 for the sixth and subsequent wafers, and superposition exposure is performed for all the remaining wafers according to the EGA mode.

If it is determined in step 203 that the trend of the alignment errors of one of the third to fifth wafers is different from that of the first wafer, the flow advances to step 103. Then, the wafer having the different trend is assumed as the first wafer, and steps 103 to 106 are executed to determine an alignment for the wafer assumed as the first wafer. Thereafter, superposition exposure is performed for the wafer assumed as the first wafer according to the selected alignment mode. In particular, if a mode other than the D/D mode is selected, various conditions of calculation of the selected mode are also optimized prior to the exposure operation, as described above.

As described above, when re-determination of an alignment mode is performed for one of the third to fifth wafers, selection of an alignment mode is performed for (k−1) wafers from the wafer assumed as the first wafer (two wafers in this case), and the trends of alignment errors of another α (=3) wafers are confirmed. For example, if it is determined that the trend of the alignment errors of the fourth wafer is different from that of the first wafer, selection (re-determination) of an alignment mode is performed for each of the fourth and fifth wafers, and the trends of alignment errors of the sixth to eighth wafers are confirmed. If the trends of the alignment errors of the sixth to eighth wafers are the same as that of the fourth or fifth wafer, the flow immediately advances from step 200 to step 204 for the ninth and subsequent wafers, and superposition exposure is executed for all the remaining wafers according to the alignment mode selected for the fourth and fifth wafers.

If the D/D mode is selected in step 138, the flow advances to step 208 to determine if superposition exposure is executed for the third and subsequent wafers according to the D/D mode, in other words, an alignment mode is to be re-selected. This determination is made by the calculation section 505 according to a predetermined program or an instruction from an operator. If it is determined that no re-selection of an alignment mode is performed, and the D/D mode is used, superposition exposure is executed for the third wafer according to the D/D mode (step 209). Then, the sequence controller 508 checks if superposition exposure is completed for all the wafers in the lot (step 210). Since the exposure is completed only up to the third wafer, the flow immediately returns to step 100, and the fourth wafer is loaded onto the wafer stage WS. Thereafter, the above-mentioned operation is repetitively executed until superposition exposure is completed for all the wafers in the lot according to the D/D mode.

On the other hand, if it is determined in step 208 that re-selection of an alignment mode is performed, the flow advances to step 103. In this case, the third wafer is assumed as the first wafer in the lot. Furthermore, steps 103 to 106 are executed to select an alignment for the third wafer, and superposition exposure is executed according to the selected alignment mode. Thereafter, selection of an alignment mode is performed for wafers from the wafer assumed as the first wafer up to the (k−1)th (=second) wafer, i.e., up to the fourth wafer, and superposition exposure is executed according to the selected alignment mode.

After re-selection of an alignment mode, if the D/D mode is selected as the alignment mode for the third and fourth wafers, the flow advances from step 138 to step 208. It is determined that wafers in the lot have random errors (irregular nonlinear distortion), and it is also determined that the D/D mode is used for the fifth and subsequent wafers. In contrast to this, if the previously selected alignment mode is other than the D/D mode, the flow advances to step 200, and the trends of alignment errors of α (=3) wafers from the fifth wafer, i.e., the fifth to seventh wafers, are confirmed. If the trends of the alignment errors of the fifth to seventh wafers are the same as those of the third and fourth wafers, the flow immediately advances from step 200 to step 204 for the eighth and subsequent wafers, and superposition exposure is executed for all the remaining wafers according to the previously selected alignment mode.

In the above-mentioned exposure sequence, the EGA mode is selected for each of the first to (k−1)th wafers for the sake of simplicity. However, even if the W-EGA mode is selected, the exposure sequence is the same as that for the EGA mode, i.e., the exposure sequence shown in FIG. 15 need not be changed.

In FIG. 15, the EGA, W-EGA, and D/D modes are prepared, and one of these modes is selected according to the characteristic of alignment errors in step 106. For example, an alignment mode may be selected from only the EGA and W-EGA modes. In this case, whether a wafer has a linear or non-linear distortion is determined in step 105. Furthermore, in step 106, the EGA mode need only be selected for a wafer having a linear distortion, and the W-EGA mode need only be selected for a wafer having a non-linear distortion. In this case, if an accuracy of superposition does not satisfy a required accuracy after the various conditions of calculation are altered, as described above, the alignment mode can be altered to the D/D mode regardless of which of the EGA and W-EGA modes is selected first. Alternatively, if the EGA mode is selected initially, the alignment mode may be altered in the order of the W-EGA mode and the D/D mode. As a method of determining in step 105 whether a wafer has a linear or non-linear distortion, the coordinate positions of all shot areas on a wafer are calculated using the EGA mode, and differences (residual errors) between the coordinate positions (calculated values) and designed coordinate positions are then calculated in units of shot areas. If the residual error of each shot area is sufficiently small, it is considered that a linear approximation can be applied, i.e., the wafer has only a linear distortion; otherwise, it is considered that the wafer has a non-linear distortion.

Furthermore, in the exposure sequence shown in FIG. 15, one of the EGA, W-EGA, and D/D modes is selected according to the characteristics of alignment errors obtained in step 105. For example, the EGA mode may always be selected as an alignment mode. More specifically, the following sequence may be adopted. That is, after the coordinate positions of all shot areas are calculated in step 104, the flow immediately advances to step 107 to execute the EGA calculation. Thereafter, if an accuracy of superposition does not satisfy a required accuracy after the various conditions of calculation are altered, the alignment mode is altered from the EGA mode to the W-EGA mode. Furthermore, if the required accuracy is not satisfied in the W-EGA mode, the alignment mode is altered to the D/D mode. In particular, if the accuracy of superposition in the EGA mode obtained in step 108 is far from a required accuracy, the alignment mode may be immediately altered to the W-EGA mode without changing various conditions of calculation. If the differences (residual errors) between the coordinate positions of shot areas calculated in step 107 and the actual coordinate positions (measurement values) are large, the alignment mode may be immediately altered to the W-EGA mode without calculating an accuracy of superposition.

In step 105 in FIG. 15, the change amount of alignment errors between two adjacent shots and its change amount (standard deviation) are calculated as the characteristic of alignment errors, and in step 106, an alignment mode is selected according to these characteristic data. For example, linear and non-linear distortions may be distinguished from each other by calculating the above-mentioned residual errors in units of shot areas using, e.g., the EGA mode. Furthermore, the degree of correlation obtained when alignment errors in units of shot areas are approximated to a predetermined function (e.g., a high-order (quadratic or higher) function, an exponential function, or the like) is calculated using the method of least squares. If the degree of correlation is high, it is considered that a wafer has a regular non-linear distortion; otherwise, i.e., if the degree of correlation is low, it is considered that a wafer has random errors. Therefore, a regular non-linear distortion and random errors (irregular non-linear distortion) may be distinguished from each other according to the degree of correlation. As another method of distinguishing regular non-linear distortion and random errors from each other, the coordinate positions of all shot areas on a wafer are calculated by applying the $W_1$-EGA mode to the coordinate positions calculated in step 104, and the differences (residual errors) between these coordinate positions (calculated values) and the actual coordinate positions (measurement values) are calculated in units of shot areas. If the residual error of each shot area is sufficiently small, it is considered that a wafer has a regular non-linear distortion; conversely, if the residual error is large, it is considered that a wafer has random errors.

The sixth embodiment of the present invention will be described next with reference to FIGS. 25 to 28. In this embodiment, an exposure sequence in the projection exposure apparatus shown in FIGS. 2 and 3, i.e., an apparatus having a plurality of alignment modes, will be described. In the fifth embodiment, only one alignment mode is used for one wafer. In contrast to this, this embodiment is characterized in that a plurality of alignment modes are used for one wafer. Assume that four alignment modes, i.e., a D/D mode, an EGA mode, a $W_1$-EGA mode, and a $W_2$-EGA mode, are set in the projection exposure apparatus. In addition, it is assumed that in this embodiment, a plurality of wafers, e.g., 25 wafers, stored in the same lot are subjected to batch processing. Furthermore, assume that all the wafers in the lot have undergone various types of treatments in the same conditions and steps.

In the projection exposure apparatus shown in FIG. 2, a sequence controller 508 loads the first wafer W in a lot onto a wafer stage WS (step 300). At this time, a calculation section 505 receives information (e.g., the type and thickness of the wafer, an underlayer, a resist, the shape of each alignment mark, a level difference, and the like) written as an identification code of the wafer through a read unit 60, and selects the optimal alignment sensor for detection of alignment marks on the wafer on the basis of this information. In this embodiment, assume that an LSA system is selected, and pre-alignment of the wafer W is executed by using this LSA system (step 301). Note that an arbitrary alignment mark on the first wafer may be detected plural times by each of a plurality of alignment sensors, and a standard deviation ($\sigma$ or $3\sigma$) of the detection results may be obtained so that the optimal alignment sensor can be selected on the basis of the standard deviation, i.e., the repeatability of measurement, of each alignment sensor.

In step 301, at least two alignment marks located on the peripheral portion of the wafer to be almost symmetrical about the wafer center are detected by using the LSA system. Thereafter, a residual rotational error of the wafer W is calculated from the coordinate positions of the two alignment marks, and a wafer holder (not shown) is finely rotated to nullify this rotational error. With this operation, pre-alignment of the wafer W is completed, and the flow advances to step 302. In step 302, the ordinal number of the wafer W, placed on the wafer stage WS, in the lot is determined. In this embodiment, if the wafer is the first, second, or third wafer, the flow advances to step 303. If the wafer is the fourth or subsequent wafer, the flow advances to step 306. In this case, since the wafer is the first wafer, the flow immediately advances to step 303.

In step 303, the sequence controller 508 detects the alignment marks in all the shot areas on the wafer W by using the LSA system. The LSA system outputs photoelectric signals, obtained from the respective marks, to an LSA calculation unit 41. The LSA calculation unit 41 converts the photoelectric signals from the LSA system into digital values, and performs waveform processing under the signal processing condition determined by the calculation section 505 or an operator to obtain the coordinate position of each mark. The mark positions obtained in this step, i.e., the coordinate positions of the respective shot areas, are stored in an alignment data store section 501.

The calculation section 505 obtains the characteristic of alignment errors of all the shot areas on the wafer W by using the coordinate positions stored in the alignment data store section 501 (step 3034). Note that since step 304 is completely the same as step 105 in FIG. 15, a description thereof will be omitted here. The characteristic obtained in step 304 is stored in a memory section 506.

In step 305, the calculation section 505 determines the optimal alignment mode for the shot arrangement on the wafer W from the characteristic of the alignment errors, of the shot areas, obtained in step 304. More specifically, the calculation section 505 pays attention to the change amounts of the alignment errors like those shown in FIG. 20B to determine whether the directions and magnitudes of the respective change amounts (vectors) are almost equal to each other throughout the wafer surface. If the directions and magnitudes of the respective change amounts are almost equal to each other, it is considered that the wafer W has a linear distortion. Therefore, the calculation section 505 selects the EGA mode as the optimal alignment mode. If the change amounts vary in at least one of the direction and magnitude throughout the wafer surface, the calculation section 505 pays attention to a standard deviation to determine whether this standard deviation exceeds a predetermined value. If the standard deviation is equal to or less than a predetermined value, it is considered that the wafer W has a regular non-linear distortion. Consequently, the calculation section 505 selects the W-EGA mode as the optimal alignment mode. If the standard deviation exceeds the predetermined value, it is considered that the wafer W has a random error (irregular non-linear distortion). Thus, the calculation section 505 selects the D/D mode as the optimal alignment mode.

In the above description, it is assumed that the wafer W has one type of distortion on its entire surface. In the embodiment, however, if two or more types of distortions are produced in the wafer W, a plurality of optimal alignment modes for the respective distortions are selected. If, for example, the wafer W does not have a linear distortion throughout the wafer surface but has a linear distortion locally, i.e., the directions and magnitudes of the above-mentioned change amounts in only a predetermined local area on the wafer W are almost equal to each other, the calculation section 505 selects the EGA mode to be applied to each shot area present in the local area, and stores the corresponding information in the memory section 506. In addition, considering that a non-linear distortion is produced in the remaining area on the wafer W other than the local area having the linear distortion, the calculation section 505 selects the W-EGA mode to be applied to each shot area present in the area having the non-linear distortion, and stores the corresponding information in the memory section 506. That is, the calculation section 505 selects the EGA and W-EGA modes with respect to the same wafer, and an EGA calculation unit 502 calculates the coordinate positions of all the shot areas on the wafer W by using the two modes.

In this case, the EGA and W-EGA modes are selected. However, the D/D mode may be selected for a shot area, of the shot areas present in the area having the non-linear distortion, in which the above-mentioned alignment error exceeds a predetermined allowable value, considering that such an area has a large random error. In this case, three alignment modes are selected with respect to the same wafer. Furthermore, if a non-linear distortion (or linear distortion) is produced throughout the wafer surface, and at least one shot area has a random error, the calculation section 505 selects the W-EGA mode (or EGA mode) and the D/D mode. Note that when the wafer W has no distortion or its distortion amount can be neglected in terms of accuracy, the calculation section 505 selects the EGA mode.

Figure 26:
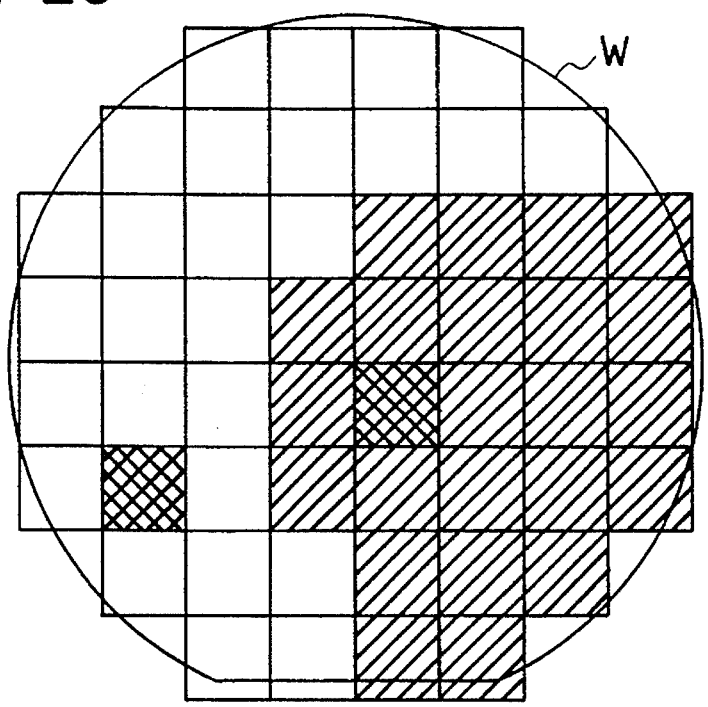
FIG. 26 is a view for explaining an alignment operation in the sixth embodiment.

Assume, in this embodiment, that the wafer W locally has non-linear distortions, i.e., non-linear distortions are produced in the hatched areas in FIG. 26, and especially the two shot areas indicated by double hatching have irregular non-linear distortions. In step 305, the calculation section 505 selects the EGA mode with respect to shot areas other than the hatched areas in FIG. 26, and also selects the W-EGA mode with respect to the shot areas in the hatched area. In addition, the calculation section 505 selects the D/D mode with respect to the two shot areas indicated by double hatching (to be referred to as split shots hereinafter). The calculation section 505 then outputs information (the positions and number of shot areas present in blocks) associated with a plurality of areas (blocks) grouped as shown in FIG. 26 and the alignment modes selected for the respective blocks to the EGA calculation unit 502, a sample shot designation section 504, and the sequence controller 508. At this time, the calculation section 505 may output the information about the alignment modes to be used in units of shot areas on the wafer W. Note that if the W-EGA mode is selected, it is further determined whether a non-linear distortion is point-symmetrical. If it is point-symmetrical, the $W_2$-EGA mode is selected. Otherwise, the $W_1$-EGA mode is selected. Upon selection of the $W_2$-EGA mode, the calculation section 505 also obtains the coordinate position of the center point of symmetry of the non-linear distortion, and outputs the coordinate position to the EGA calculation unit 502.

Figure 27:
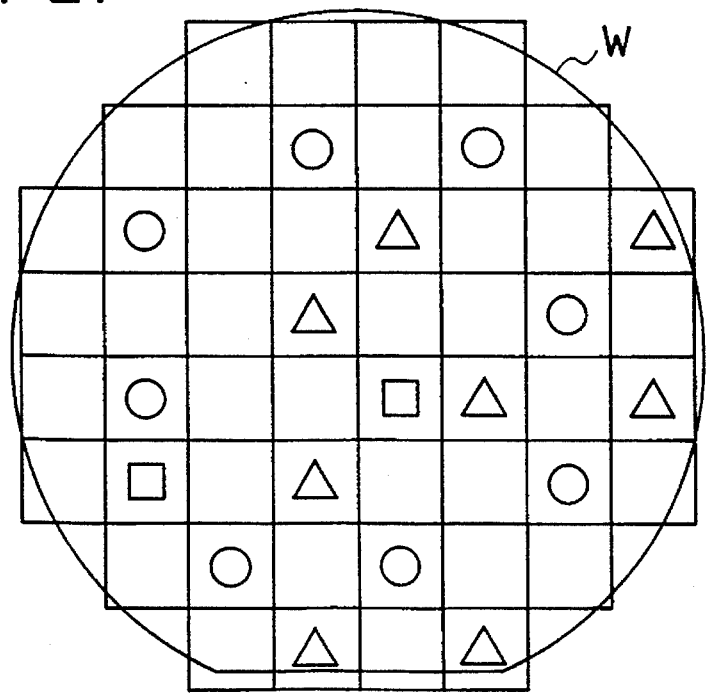
FIG. 27 is a view showing a sample shot arrangement used in the sixth embodiment.

The sample shot designation section 504 determines the optimal sample shot arrangement (FIG. 27) for the wafer W like the one shown in FIG. 26 on the basis of the information input from the calculation section 505 (step 306). More specifically, as shown in FIG. 27, the sample shot designation section 504 selects a plurality of shot areas (the eight shot areas indicated by the circles, in this embodiment), located on a wafer peripheral portion, as sample shots, because the EGA mode is selected. Furthermore, the sample shot designation section 504 selects a plurality of shot areas (the eight shot areas indicated by the triangles, in this embodiment) as sample shots such that the sample shots are uniformly arranged in the above-mentioned hatched areas, because the W-EGA mode is selected, and the hatched areas shown in FIG. 26 have the non-linear distortions. As described above, the sample shot designation section 504 selects and determines a total of 16 shot areas, arranged in the manner shown in FIG. 27 with respect to the wafer W shown in FIG. 26, as sample shots.

In this embodiment, the wafer W has two split shots (indicated by double hatching), and the D/D mode is applied to the split shots. For this purpose, the sample shot designation section 504 also designates the two split shots (the shot areas indicated by the squares in FIG. 27) as apparent sample shots. With this designation, the coordinate positions of the split shots are measured together with the coordinate positions of the 16 sample shots. Note that split shots are designated as apparent sample shots only to measure their coordinate positions at the same time when the coordinate positions of sample shots are measured. In EGA calculation processing (to be described later), however, the alignment data (coordinate positions) of the split shots are not used in consideration of accuracy of calculation of shot alignment. The calculation section 505 may display the sample shot arrangement, determined in the above-described manner, on a display unit 62 to inform it to the operator. In this case, for example, sample shots may be displayed in units of alignment modes.

In step 307, the coordinate positions of all the sample shots (18 sample shots) on the wafer are obtained. That is, sample alignment is executed. In the embodiment, the coordinate positions of all the shot areas on the wafer W have already been measured. For this reason, upon receiving the sample shot arrangement determined by the sample shot designation section 504, the EGA calculation unit 502 reads out the coordinate positions of the 18 sample shots (respectively indicated by the circles, the triangles, and the squares) from the coordinate positions stored in the alignment data store section 501. At this time, the EGA calculation unit 502 outputs the coordinate positions of the two split shots (indicated by the squares), of the read coordinate positions, to the sequence controller 508. In this case, the coordinate positions of the sample shots are read out from the alignment data store section 501. However, the coordinate positions of the sample shots may be measured again by using the LSA system. In the embodiment, since steps 303 to 306 are not executed with respect to the fourth and subsequent wafers, the coordinate positions of the sample shots are measured by using the LSA system in step 307.

In step 308, the EGA calculation unit 502 determines the coordinate positions of all the shot areas (except for the two split shots) on the wafer W in FIG. 26 by using the coordinate positions of the 16 sample shots indicated by the circles and the triangles in FIG. 27. First, the EGA calculation unit 502 uses the EGA mode and executes EGA calculation processing by using the coordinate positions of the 16 sample shots (or the eight sample shots indicated by the circles in FIG. 27). That is, the EGA calculation unit 502 determines calculation parameters $\underline{a}$ to f by using the method of least squares according to equation (2), and subsequently calculates the coordinate position of each shot area on the wafer W, i.e., each of the remaining shot areas (27 shot areas in FIG. 26) except for the shot areas indicated by hatching and double hatching in FIG. 26 in the embodiment. In the EGA mode, the coordinate positions of the 27 shot areas are calculated by using only one set of parameters $\underline{a}$ to f, and the calculated coordinate positions are output to the memory section 506 and the sequence controller 508.

Subsequently, the EGA calculation unit 502 uses the W-EGA mode, and executes W-EGA calculation processing upon weighting the coordinate positions of the 16 sample shots (or the ten sample shots present in the hatched area in FIG. 26, or the 14 sample shots present in and near the hatched area). That is, the EGA calculation unit 502 determines calculation parameters $\underline{a}$ to f, with respect to each of a plurality of shot areas (23 shot areas in FIG. 26) present in the hatched area in FIG. 26, by using the method of least squares according to equation (3) or (5), and then calculates the coordinate position of each shot area by using the parameters $\underline{a}$ to f. In the W-EGA mode, the parameters $\underline{a}$ to f are determined for each shot area to calculate its coordinate position, and the calculated coordinate positions are output to the memory section 506 and the sequence controller 508. With the above-described operation, all the coordinate positions (52 positions) on the wafer W in FIG. 26 are determined.

In step 309, the sequence controller 508 executes superposition exposure of a reticle pattern with respect to each shot area on the first wafer W while sequentially aligning the wafer stage WS in accordance with the coordinate positions of all the shot areas, input from the EGA calculation unit 502. Thereafter, the sequence controller 508 determines whether superposition exposure with respect to all the wafers in the lot is finished (step 310). In this case, since superposition exposure with respect to only the first wafer is finished, the flow immediately returns to step 300 to execute wafer exchange and load the second wafer in the lot onto the wafer stage WS. In this case, since the same formation conditions (the types of underlayer and resist, the shape of each alignment mark, and the like) are applied to the first and subsequent wafers, the alignment sensor used for the first wafer, i.e., the LSA system in the embodiment, is used for the second and subsequent wafers.

Steps 301 to 309 described above are repeatedly executed with respect to the second wafer to perform superposition exposure of a reticle pattern with respect to each shot area. In step 310, it is determined that wafer exchange is performed. The third wafer in the lot is then loaded on the wafer stage WS (step 300). Subsequently, steps 301 to 309 described above are repeatedly executed to perform superposition exposure of a reticle pattern with respect to each shot area on the third wafer. In this case, in the embodiment, since the flow advances to step 303 if the first, second, or third wafer is determined in step 302, a distorted state of the wafer is obtained by executing steps 303 to 306. That is, as shown in FIG. 26, the shot areas on the wafer are classified according to the types of distortions (in units of the alignment modes). Such an operation is performed because classification of shot areas cannot always be performed accurately with one wafer. Assume that the shot areas on each of the first to third wafers are classified as shown in FIG. 26. Therefore, the positions and numbers of shot areas to which the EGA mode, the W-EGA mode, and the D/D mode are respectively applied, and the sample shot arrangement determined in step 306 are the same throughout the first to third wafers. Note that if the shot areas on the second or third wafer are classified in the same manner as the first wafer in step 305, a sample shot arrangement need not be determined again in step 306, and the sample shot arrangement determined with respect to the first wafer can be used. In addition, with respect to the first to third wafers, superposition exposure may be performed by using the coordinate positions measured in step 303 without using the coordinate positions of the shot areas determined in step 308.

An exposure operation with respect to the fourth and subsequent wafers will be described next. In this case, the first to third wafers have almost identical distortions. For this reason, in the embodiment, it is considered that the fourth and subsequent wafers have the same distortions as those of the first to third wafers, and classification of shot areas is performed in the same manner as shown in FIG. 26. That is, superposition exposure is performed by using the EGA mode, the W-EGA mode, and the D/D mode. After the fourth wafer in the lot is loaded on the wafer stage WS in step 300, the sequence controller 508 executes pre-alignment by using the LSA system (step 301). Thereafter, it is determined in step 302 that the current wafer is the fourth wafer, and the flow immediately advances to step 307. In step 307, the sequence controller 508 executes sample alignment in accordance with the sample shot arrangement (FIG. 27) determined with respect to the first wafer. More specifically, the sequence controller 508 detects two pairs of alignment marks attached to each of 18 sample shots by using the LSA system in accordance with the sample shot arrangement input from the sample shot designation section 504. The LSA calculation unit 41 then outputs the coordinate position of each mark to the alignment data store section 501.

The EGA calculation unit 502 receives the alignment modes determined with respect to the first wafer (step 305) and the information about the classification of the shot areas from the memory section 506, and determines the coordinate positions of all the shot areas on the wafer by using the coordinate positions of the 18 sample shots (step 308). The EGA calculation unit 502 reads out the coordinate positions of the two split shots (indicated by the squares in FIG. 27) from the alignment data store section 501, and outputs them to the sequence controller 508. In addition, the EGA calculation unit 502 calculates the coordinate positions of the remaining shot areas (50 areas) by using both the EGA mode and the W-EGA mode in the same manner as described above, and outputs the calculated coordinate positions to the sequence controller 508. In this case, the EGA calculation unit 502 calculates the coordinate positions of the shot areas in the hatched area in FIG. 26 by the W-EGA mode using the coordinate positions of the 16 sample shots (indicated by the circles and the triangles in FIG. 27) except for the two split shots, and calculates the coordinate positions of the remaining shot areas by the EGA mode. The sequence controller 508 sequentially aligns the wafer stage SW in accordance with the coordinate positions of all the shot areas input from the EGA calculation unit 502, and performs superposition exposure of a reticle pattern in units of shot areas (step 309).

Subsequently, the sequence controller 508 determines whether superposition exposure is completed with respect to all the wafers in the lot (step 310). In this case, since exposure has been completed up to only the fourth wafer, the flow immediately returns to step 300 to load the fifth wafer on the wafer stage WS. Steps 301, 302, and 307 to 309 described above are then executed to perform superposition exposure with respect to the fifth wafer. Subsequently, superposition exposure is executed by using the EGA mode, the W-EGA mode, and the D/D mode in units of wafers until superposition exposure with respect to all the wafers in the lot is completed. With the above-described exposure sequence, superposition exposure of a reticle pattern can be performed with respect to all the wafers, in units of shot areas, with a high accuracy, while a decrease in throughput is minimized.

In the sixth embodiment, alignment modes are selectively determined from the characteristic of the alignment errors obtained in step 304. However, alignment modes may be determined by using, e.g., the EGA mode. This determination method will be briefly described below. Upon measuring the coordinate positions of all the shot areas on the wafer in step 303, the EGA calculation unit 502 receives a sample shot arrangement (e.g., the eight shot areas indicated by the circles in FIG. 27) suitable for the EGA mode from the sample shot designation section 504, and reads out the coordinate positions of eight sample shots (indicated by the circles) from the alignment data store section 501. The EGA calculation unit 502 also executes EGA calculation processing by using the coordinate positions of the eight sample shots. That is, the EGA calculation unit 502 determines calculation parameters $\underline{a}$ to f by using the method of least squares in the EGA mode according to equation (2), and calculates the coordinate positions of all the shot areas on the wafer W. The EGA calculation unit 502 outputs the calculated coordinate positions to the memory section 506.

The calculation section 505 obtains the difference (residual error) between the coordinate position (measurement value) measured in step 303 and the coordinate position calculated by the EGA mode in units of shot areas on the wafer. The calculation section 505 then selects shot areas, of all the shot areas on the wafer, in which a residual error is zero or is equal to or less than a predetermined value. The coordinate positions of the selected shot areas can be calculated with a sufficiently high accuracy even by the EGA mode (linear approximation). That is, these shot areas are stored, as shot areas to which the EGA mode is to be applied, in the memory section 506. It is considered that the shot areas other than the selected shot areas are shot areas whose coordinate positions cannot be calculated by the EGA mode with a sufficiently high accuracy, i.e., shot areas having non-linear distortions. For this reason, these shot areas are stored, as shot areas to which the W-EGA mode is to be applied, in the memory section 506. In this case, of the shot areas to which the W-EGA mode is to be applied, shot areas in which the above-mentioned residual errors are extremely large are designed as split shots, and hence are stored, as shot areas to which the D/D mode is to be applied, in the memory section 506. With this operation, selection of alignment modes and classification of shot areas in units of alignment modes are completed.

As described above, alignment modes can be easily determined by using only the EGA mode. This sequence is different from the one shown in FIG. 25 only in the operations in steps 304 and 305, but other operations are the same as those in FIG. 25. Note that in step 308, the coordinate positions of shot areas to which the EGA mode is to be applied need not be calculated. This is because those coordinate positions have already been calculated when alignment modes are determined. Therefore, the coordinate positions may only be read out from the memory section 506.

In the sixth embodiment, the second and third wafers have the same distortions as those of the first wafer, and the same alignment modes are selected. If, however, at least the alignment modes selected for the second or third wafer, or the positions or number of shot areas present in each of a plurality of local areas (FIG. 26) on the wafer are different from those set for the first wafer, the second or third wafer is to be regarded as the first wafer in the lot, and superposition exposure is to be performed with respect to this wafer in accordance with the selected alignment modes. In this case, steps 303 to 306 described above are executed with respect to only the wafer regarded as the first wafer and subsequent two wafers to determine alignment modes and sample shot arrangements. If, for example, the positions or number of shot areas to which the W-EGA mode is to be applied is different from that set for the first and second wafers, steps 303 to 306 are executed with respect to only the third and subsequent two wafers, i.e., the third to fifth wafers. If the alignment modes selected for each of the third to fifth wafers and the positions and number of shot areas set in units of the alignment modes for each wafer are the same, superposition exposure may be performed with respect to the sixth and subsequent wafers by using the alignment modes determined with respect to the third to fifth wafers.

Figure 25:
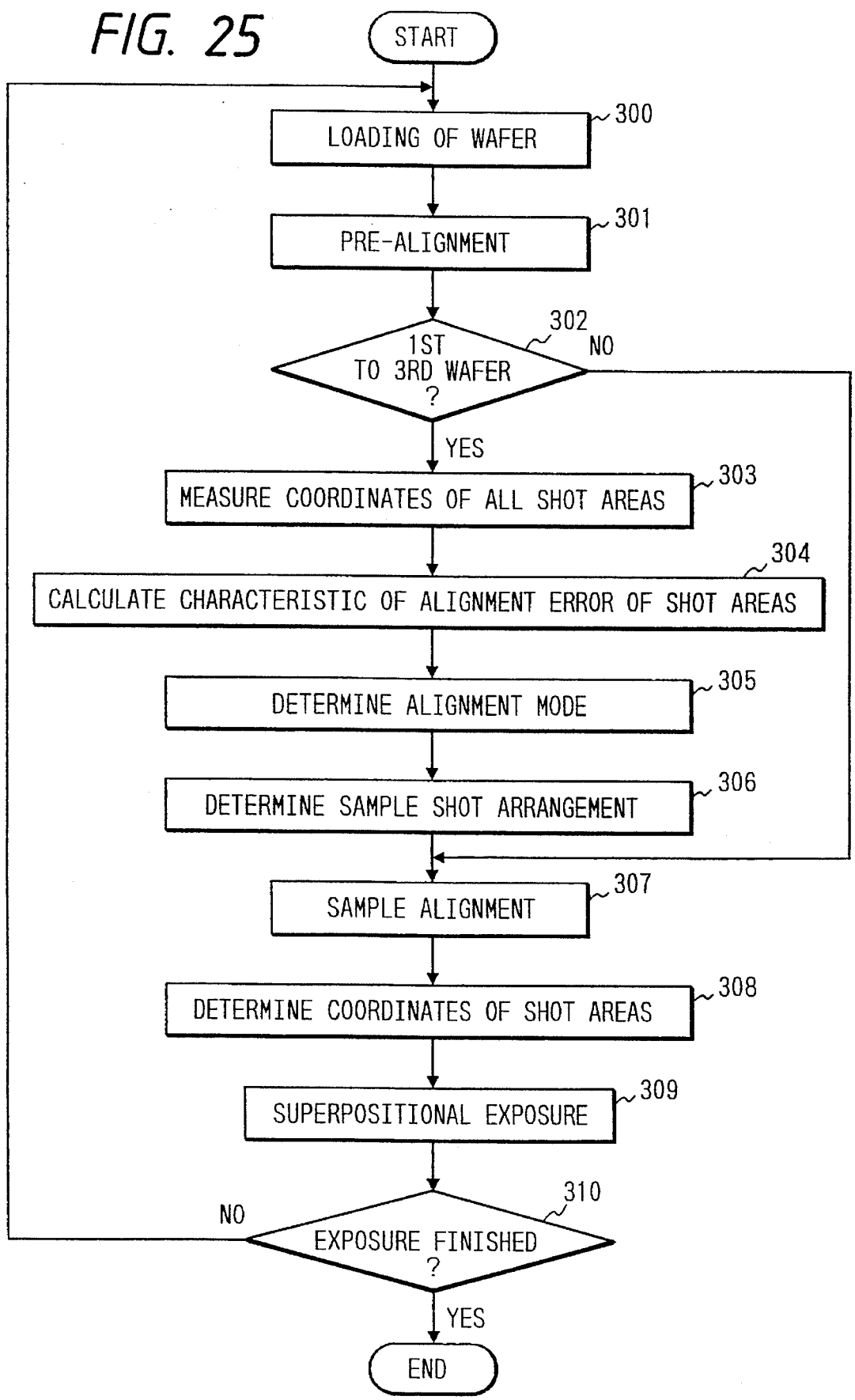
FIG. 25 is a flow chart showing an exposure sequence in the sixth embodiment of the present invention.

In the sequence shown in FIG. 25, steps 303 to 306 are executed with respect to the first to third wafers. However, the number of wafers subject to such processing is not specifically limited, except that the number must be one or more. If, however, the number of wafers subjected to the processing in steps 303 to 306 is-increased, the throughput decreases accordingly. Therefore, the number of wafers is preferably determined in consideration of throughput. In addition, when superposition exposure is to be performed with respect to the kth (k is an integer of 2 or more) wafer in a lot, steps 303 to 306 described above may be executed with respect to at least one of the first to (k–1)th wafers. That is, steps 303 to 306 need not always be executed with respect to the first wafer in a lot.

After steps 303 to 306 are executed with respect to only the first wafer, and step 307 in FIG. 25 is completed with respect to the second or subsequent wafer, the coordinate position of each of a plurality of sample shots is calculated by using the EGA mode or the W-EGA mode, and the difference (residual error) between each calculated coordinate position and a corresponding coordinate position measured in step 307 is calculated. It is then checked whether the tendencies (magnitude, direction, and the like) of the residual errors of the respective sample shots of the first and second wafers are almost the same. If the tendencies are almost the same, steps 308 and 309 are executed in accordance with the alignment modes determined with respect to the first wafer. If the tendencies are different from each other, steps 303 to 306 are executed. In this case, the residual error of each of a plurality of sample shots of the first wafer is obtained and stored in the memory section 506 in advance. By using the above-described sequence, even if steps 303 to 306 are executed with respect to only one wafer, each shot area of all the wafers in a lot can be aligned with a high accuracy while a decrease in throughput is minimized.

Assume that a plurality of lots are to be continuously processed. In this case, if the alignment modes and the positions and number of shot areas in each alignment mode selected and set for each of the first to (k–1)th wafers in the first lot are the same, the number of wafers, of the next lot, for which steps 303 to 306 are to be executed is set to be smaller than that of the first lot. If the number of wafers, of the subsequent lots, for which steps 303 to 306 are to be executed is sequentially decreased as long as the alignment modes and the positions and number of shot areas in each alignment mode selected and set for each of the first to (k–1)th wafers in each lot are the same, the number of wafers (the total number of wafers of all the lots) to which steps 303 to 306 are to be executed can be decreased, thereby increasing the throughput while maintaining the accuracy of alignment for each lot.

An alignment method according to the seventh embodiment of the present invention will be described next with reference to FIG. 28. Assume, in this embodiment, that a regular non-linear distortion is produced throughout the wafer surface. Since the exposure sequence in the seventh embodiment is basically the same as that in the sixth embodiment (FIG. 25), only the differences between the two embodiments will be described below.

When a regular non-linear distortion is produced throughout the wafer surface, only the W-EGA mode is selected as an alignment mode in step 304 in FIG. 25. In step 308, the coordinate positions of all shot areas are calculated by using the W-EGA mode. More specifically, after the coordinate positions of a plurality of sample shots (e.g., the 13 shot areas indicated by the circles in FIG. 28) are weighted in units of shot areas, parameters $\underline{a}$ to f are determined by using the method of least squares according to equation (3) or (5). The coordinate positions of the shot areas are then calculated by using these parameters $\underline{a}$ to f. Thereafter, superposition exposure is performed while a wafer stage SW is sequentially aligned in accordance with the calculated coordinate positions, thereby obtaining a desired accuracy of superposition in all the shot areas on the wafer.

Figure 28:
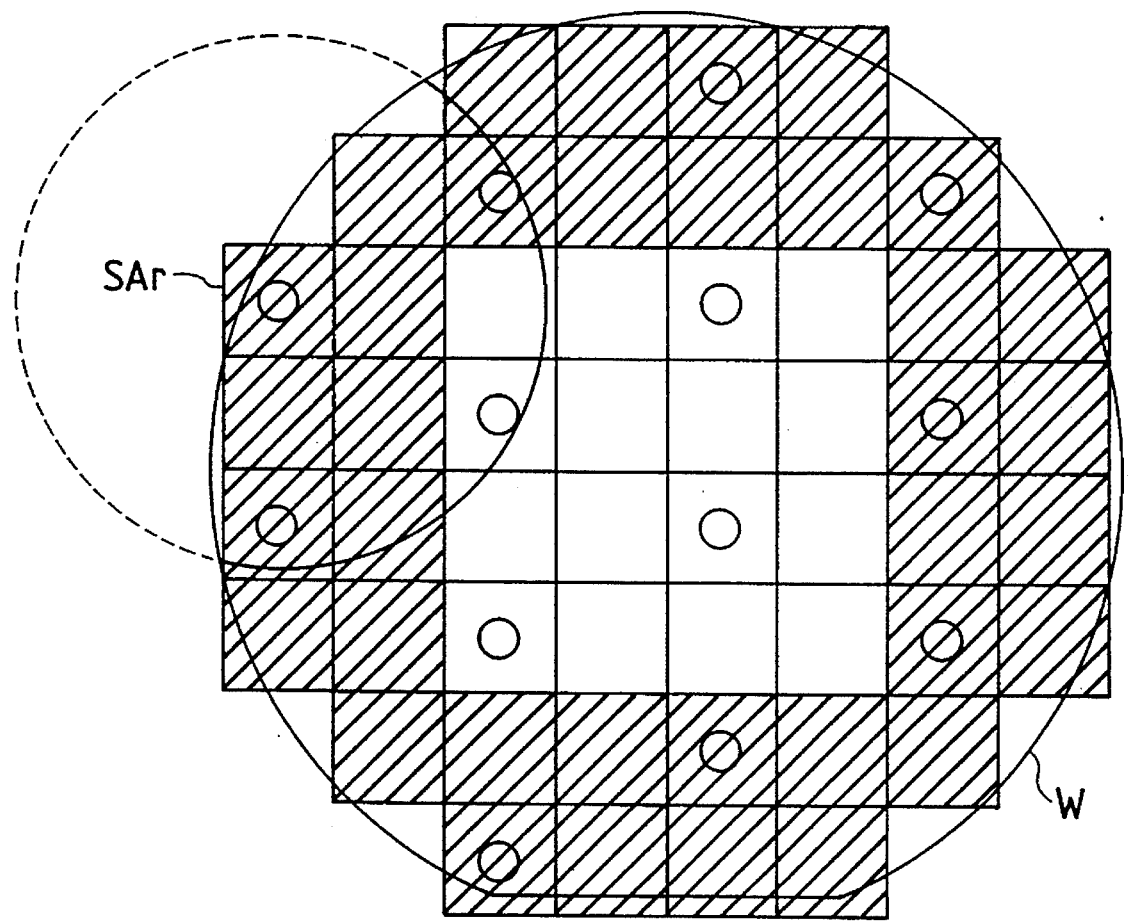
FIG. 28 is a view for explaining the operation of the seventh embodiment of the present invention.

In the W-EGA mode, however, since the accuracy of measurement with respect to the coordinate positions shot areas present on the wafer peripheral portion, e.g., the shot areas indicated by hatching in FIG. 28, is lower than that of shot areas on the wafer central portion, the accuracy of superposition of the shot areas on the wafer peripheral portion cannot satisfy a required accuracy in some case. This is because the number of sample shots, in the shot areas on the wafer peripheral portion, which are effective in calculating the coordinate positions of the respective shot areas, i.e., the number of sample shots to which weights larger than a predetermined value are assigned, is smaller than that in the shot areas on the wafer central portion. With regard to a shot area SAr in FIG. 28, weights larger than a predetermined value are assigned to, e.g., four sample shots (indicated by circles) present in a circle. It is obvious that the number of sample shots is smaller than that of shot areas on the central portion. Note that the positions and number of shot areas, on a wafer, which do not satisfy a required accuracy slightly differ depending on a sample shot arrangement and the degree of a non-linear distortion of a wafer. However, it is difficult to satisfy the required accuracy at least in shot areas located on the outermost peripheral portion, of a large number of shot areas on the wafer.

In the seventh embodiment, therefore, after the characteristic of alignment errors is calculated in step 304 in the same manner as in the sixth embodiment, only the W-EGA mode is selected as an accuracy mode in step 305. In this case, in the seventh embodiment, since only the W-EGA mode is selected, it is determined that the accuracy of superposition in the shot areas on a wafer peripheral portion does not satisfy a required accuracy. A calculation section 505 (or an operator) determines that the D/D mode is applied to the shot areas on the wafer peripheral portion (e.g., the hatched area in FIG. 28), and stores the corresponding information in a memory section 506. In this case, the number and positions of shot areas to which the D/D mode is to applied are determined in accordance with, for example, the characteristic of the alignment errors calculated in step 304, i.e., a standard deviation (σ or 3σ), and the like. As described above, in the seventh embodiment, in step 305, the D/D mode is selected for the shot areas on the wafer peripheral portion, and the W-EGA mode is selected for the shot areas on the wafer central portion.

In step 306, a sample shot arrangement is determined. In this embodiment, shot areas according to a sample shot arrangement (e.g., an arrangement in which sample shots are uniformly distributed on the entire wafer surface, as shown in FIG. 28) suitable for the W-EGA mode and all shot areas to which the D/D mode is applied are all selected and determined as sampled shots. In step 307, sample accuracy is executed. More specifically, an EGA calculation unit 502 reads out the coordinate position of each sample shot from a alignment data store section 501, and outputs the coordinate position of each shot area, to which the D/D mode is applied, to a sequence controller 508. In addition, the EGA calculation unit 502 calculates the coordinate positions of only the shot areas present on the wafer central portion by using the W-EGA mode, and outputs the calculated coordinate positions to the sequence controller 508. With this operation, the coordinate positions of all the shot areas on the wafer have been output to the sequence controller 508. In step 309, the sequence controller 508 performs superposition exposure of a reticle pattern with respect to each shot area while sequentially aligning the wafer stage WS in accordance with the coordinate positions input from the EGA calculation unit 502. Since other sequences are the same as those in the sixth embodiment, a description thereof will be omitted. Similar to the sixth embodiment, in the seventh embodiment, if at least one of the shot areas present on the wafer central portion is a split shot, the D/D mode is applied to this split shot.

As described above, in the seventh embodiment, since the W-EGA mode and the D/D mode are used for a wafer having non-linear distortions, superposition exposure of reticle patterns can be performed with respect to all the shot areas on a wafer with a high accuracy. According to this embodiment, an application of the D/D mode to the shot areas on the wafer peripheral portion is determined in step 305. However, for example, shot areas to which the D/D mode is to be applied may be determined by using the $W_1$-EGA mode. More specifically, the $W_1$-EGA mode may be applied to all the coordinate positions obtained in step 303, or the coordinate positions of a plurality of sample shots (the shot areas indicated by the circles in FIG. 28) to calculate the coordinate positions of all the shot areas on the wafer. Differences (residual errors) between the calculated coordinate positions (calculation values) and the coordinate positions measured in step 303 are then obtained in units of shot areas. It is determined that a shot area in which the residual error is sufficiently small has a regular non-linear distortion, and the W-EGA mode is applied to this shot area. In contrast to this, it is determined that a shot area in which the residual error is extremely large has a random error, and the D/D mode is applied to this shot area. In addition, the degree of correlation is obtained by approximating the alignment error of each shot area to a predetermined function (e.g., a function of higher order, higher than a quadratic function, or exponential function) by using the method of least squares. When the degree of correlation is high, it is considered that the wafer has regular non-linear distortions. Otherwise, i.e., if the degree of correlation is low, it is considered that the wafer has random errors. Therefore, regular non-linear distortion and random errors (irregular non-linear distortions) may be discriminated from each other in accordance with the above-mentioned degree of correlation, and shot areas may be classified into groups of shot areas to which the W-EGA mode and the D/D mode are respectively applied.

In the sixth and seventh embodiments, when the coordinate position of each shot area on a wafer is to be determined by using the EGA mode or the W-EGA mode, parameters a to f may be determined by selectively using two types of accuracy sensors, as described above with reference to the fifth embodiment.

The eighth embodiment of the present invention will be described next with reference to FIG. 29. In this embodiment, an example of the exposure sequence of the projection exposure apparatus shown in FIGS. 2 and 3 will be described. More specifically, a method of optimizing the processing condition of each detection signal from an alignment sensor will be described below, on the assumption that the EGA mode or the W-EGA mode is used. Assuming that the EGA mode using an FIA system 20 is used, signal processing conditions in an FIA calculation unit 42 will be optimized.

Figure 29:
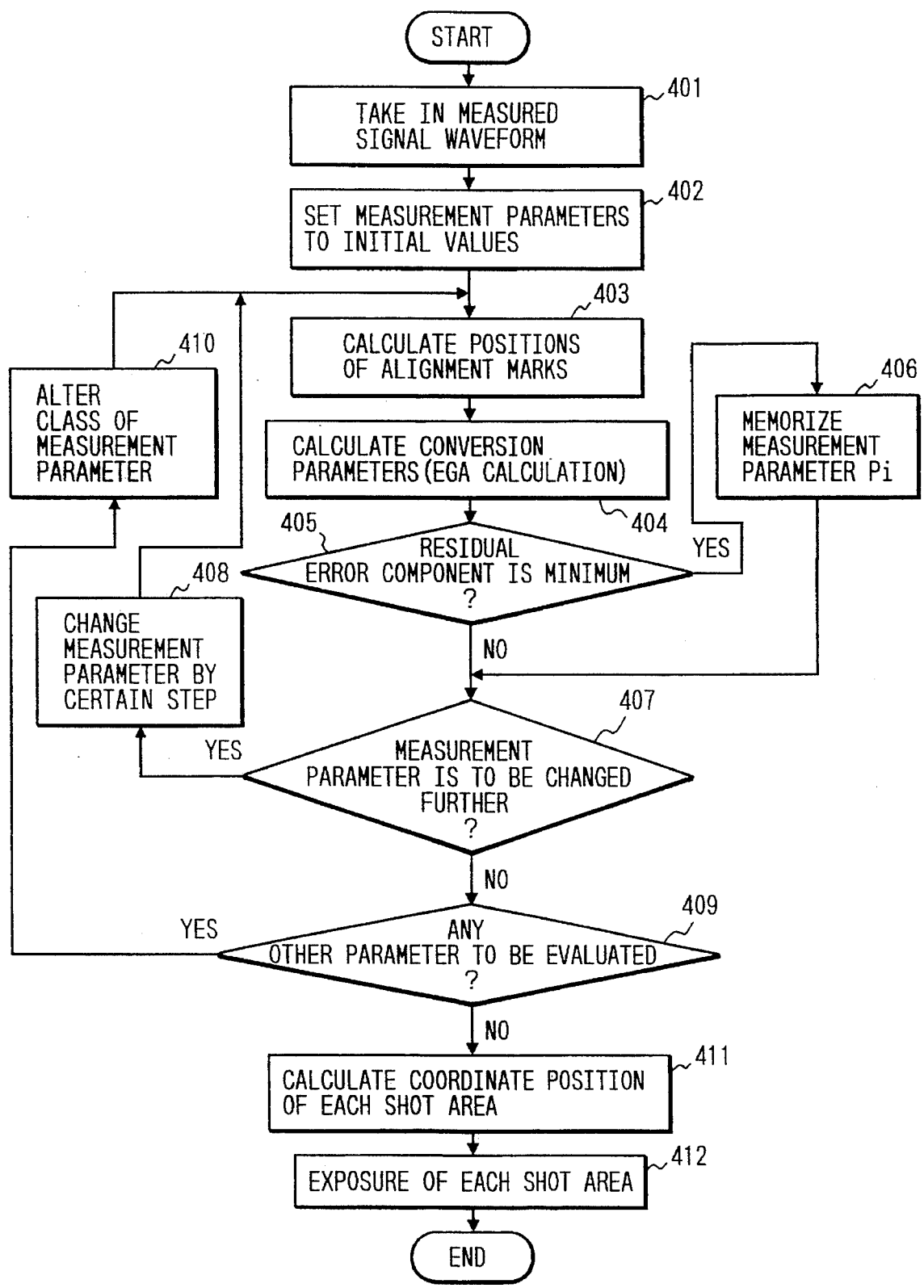
FIG. 29 is a flow chart showing an exposure sequence in the eighth embodiment of the present invention.

In step 401 in FIG. 29, a sequence controller 508 (FIG. 3) detects an alignment mark attached to each of several (e.g., nine) sample shots on a wafer W by using the FIA system 20. The FIA system 20 outputs an image signal obtained from each mark to the FIA calculation unit 42. The FIA calculation unit 42 converts each image signal from the FIA system 20 into a digital value, and outputs its waveform data to a memory section 40.

In step 402, the sequence controller 508 (or an operator) sets the signal processing conditions of the FIA calculation unit 42, e.g., a waveform analysis algorithm and measurement parameters for slice level and the like, to initial values. Subsequently, in step 403, the FIA calculation unit 42 processes the waveform data (measurement signals) read out from the memory section 40 in accordance with the conditions set in step 401, and obtains the coordinate positions of the respective marks. The mark positions, i.e., the coordinate positions of the sample shots, are stored in an alignment data store section 501 and are also supplied to an EGA calculation unit 502 via the alignment data store section 501.

In step 404, the EGA calculation unit 502 obtains parameters a to f by using the method of least squares according to equation (2). In addition, the EGA calculation unit 502 obtains a residual error component based on residual errors between the coordinate positions calculated by using the parameters a to f in step 404 and the coordinate positions measured and stored in the alignment data store section 501 in advance, i.e., the square sum of residual errors between the calculated coordinate positions and the measured coordinate positions. Letting $X_n$ be the calculated coordinate position of a wafer mark Mxn in the X-direction; $XM_n$ be the measured coordinate position; $Y_n$ be the calculated coordinate position of a wafer mark Myn in the Y-direction; and $YM_n$ be the measured coordinate position, a residual error component in the EGA scheme is defined as follows:

$$\text{residual error component} = \sum_{n=1}^{m} \{(X_n - XM_n)^2 + (Y_n - YM_n)^2\} \quad (11)$$

where m is 9.

This calculation is the first EGA calculation. Therefore, after the EGA calculation unit 502 stores the conversion parameters a to f and the residual error component obtained in step 404 in the memory section 506, the flow advances to step 406 to also store a value $P_1$ of a measurement parameter, set in the FIA calculation unit 42, in the memory section Thereafter, in step 407, the EGA calculation unit 502 checks whether the measurement parameter is to be changed. If YES in step 407, the value of the measurement parameter is changed by a predetermined value in step 408, and the flow returns to step 403.

The FIA calculation unit 42 processes the measurement signals read out from the memory section 40 by using the updated measurement parameter to calculate the coordinate positions of the respective wafer marks Mxi and Myi. In step 404, the EGA calculation unit 502 obtains six conversion parameters $\underline{a}$ to f by using the method of least squares according to equation (2).

In step 405, the EGA calculation unit 502 obtains a residual error component based on the coordinate positions calculated by using the conversion parameters $\underline{a}$ to f obtained in step 404 and the coordinate positions calculated by the FIA calculation unit 42 again, and compares it with the residual error component stored in the memory section 506. If the currently obtained residual error component is larger than the stored component, the flow advances to step 407. If the currently obtained residual error component is smaller than the stored component, i.e., the currently obtained residual error component is the minimum component of all the components obtained so far, the EGA calculation unit 502 stores the currently obtained conversion parameters $\underline{a}$ to f and residual error component in the memory section 506. The flow then advances to step 406 to also store a value $P_2$ of a measurement parameter, currently set in the FIA calculation unit 42, in the memory section 506.

If it is determined in step 407 that the measurement parameter is to be changed, steps 408 and 407 are repeated. If NO in step 407, the sequence controller 508 checks in step 409 whether any other measurement parameters to be evaluated are present. If YES in step 409, the sequence controller 508 designates the class of a measurement parameter to be changed for evaluation to the EGA calculation unit 502 in step 410. In accordance with this designation, the EGA calculation unit 502 changes the class of the measurement parameter to be evaluated and repeats the operations in steps 403 to 408, thus causing the memory section 506 to store the conversion parameters $\underline{a}$ to f obtained when the residual error component is minimized, the minimum residual error component, and the corresponding value of the measurement parameter.

If it is determined in step 409 that there are no other measurement parameters to be evaluated, the flow advances to step 411. In step 411, the EGA calculation unit 502 obtains the coordinate position of each shot on the wafer by using the conversion parameters $\underline{a}$ to f obtained when the residual error component is minimized. Note that a baseline amount as the distance between the measurement center of the FIA system 20 and a reference point in the exposure field of a projection optical system is obtained in advance. In step 412, the sequence controller 508 aligns each shot area on the basis of coordinate positions obtained by correcting the coordinate positions, calculated by the EGA calculation unit 502, in accordance with the baseline amount, and exposes a pattern image of a reticle R.

Upon completion of exposure with respect to all the shot areas on the wafer W, the wafer W is unloaded. Thereafter, automatic optimization of a measurement parameter is performed with respect to the next wafer in the same lot in accordance with the flow shown in FIG. 29, and exposure is performed with respect to the wafer. Note that since measurement signals obtained from wafers in the same lot exhibit similar tendencies in many cases, the same measurement parameter determined for the first wafer may be used for the second and subsequent wafers in the same lot.

In the eight embodiment, a measurement parameter is optimized by using a condition that minimizes a residual error component. Instead of using this method, for example, a measurement parameter may be optimized such that the scaling parameters $\underline{a}$ and d, of the conversion parameters $\underline{a}$ to f, are made to come closest to measurement values. More specifically, the scaling parameters $\underline{a}$ and d are parameters which represent the linear contraction/extension amount of a wafer. In this case, two marks are formed, at a predetermined distance, on a wafer in advance. The values of these scaling parameters $\underline{a}$ and d can be estimated by measuring the distance between the two marks before the second and subsequent exposure operations. Thus, in step 405 in FIG. 29, instead of checking whether a residual error component is minimum, the square sum of deviations between the scaling parameters $\underline{a}$ and d of the conversion parameters $\underline{a}$ to f obtained in step 404 and their estimated values may be obtained, and a measurement parameter may be optimized so as to minimize this square sum. Furthermore, if, for example, a sample shot arrangement or the type of accuracy sensor is sequentially changed, in addition to the above-mentioned signal processing condition, and a corresponding residual error component (equation (11)) is obtained, the corresponding condition can be optimized.

In this embodiment, the EGA mode is used. However, if the $W_1$-EGA mode or the $W_2$-EGA mode is used, the above-mentioned signal processing condition can be optimized in the same manner as in the embodiment. Note that in the $W_1$-EGA mode or the $W_2$-EGA mode, a residual error component is defined by equations (12) and (13), respectively, instead of equation (11):

$$\text{residual error component} = \sum_{n=1}^{m} W_{in}\{(X_n - XM_n)^2 + (Y_n - YM_n)^2\} \quad (12)$$

$$\text{residual error component} = \sum_{n=1}^{m} W_{in}'\{(X_n - XM_n)^2 + (Y_n - YM_n)^2\} \quad (13)$$

As is apparent from equations (12) and (13), if the above-mentioned signal processing condition (measurement parameter), together with a weight Win, i.e., a parameter S, are sequentially changed to obtain a residual error component, both the signal processing condition and the parameter S can be optimized. Note that in the W-EGA mode, the calculated coordinate positions of sample shots, used in equations (12) and (13), are calculated by determining parameters $\underline{a}$ to f, according to equation (3) or (5), in units of sample shots. Although residual error components expressed by equations (11) to (13) are obtained by using the coordinate positions of m sample shots in this embodiment, the number of shots used in equations (11) to (13) need not be set to be equal to the number of sample shots.

The ninth embodiment of the present invention will be described next with reference to FIGS. 30A to 33. In this embodiment, an example of the exposure sequence in the projection exposure apparatus shown in FIGS. 2 and 3 will be described. More specifically, a method of optimizing various conditions (e.g., a sample shot arrangement) of alignment modes in consideration of the repeatability of measurement of an alignment sensor will be described. In this case, a random number generator 509 in FIG. 3 is required for only the ninth embodiment. The random number generator 509 (to be described in detail later) serves to receive the true coordinate position of each shot area, calculated by a calculation section 505, and a measurement repeatability (standard deviation 3σ) of an alignment sensor, and output regular random numbers having this true coordinate position and the standard deviation to an EGA calculation unit 502. In this embodiment, it is assumed that a plurality of wafers, e.g., 25 wafers, stored in the same lot are subjected to batch processing. Furthermore, assume that all the wafers in the lot have undergone various types of treatments in the same conditions and steps.

In the projection exposure apparatus shown in FIG. 2, a sequence controller 508 loads a first wafer W in a lot onto a wafer stage WS (step 600). In step 601, the sequence controller 508 executes pre-alignment by using an alignment sensor. In this case, for example, two alignment marks located on the peripheral portion of the wafer W to be almost symmetrical about the center of the wafer W are detected. In addition, a residual rotational error of the wafer W is calculated from the coordinate positions of the two marks, and a wafer holder (not shown) is finely rotated to nullify this rotational error. With this operation, pre-alignment of the wafer W is completed. Note that in this case, either the LSA system or the FIA system is used as an alignment sensor.

In step 602, the sequence controller 508 detects (relatively scans) an alignment mark (to be referred to as a specified mark hereinafter) attached to an arbitrary shot area on the wafer W plural times, e.g., 10 times, by using one of the LSA system, the FIA system, and the LIA system, e.g., the LSA system. In this case, an LSA system 17 outputs a photoelectric signal, obtained by every scan operation, to an LSA calculation unit 41. The LSA calculation unit 41 converts the photoelectric signals, sequentially output from the LSA system 17, into digital values and outputs the corresponding waveform data to a memory section 40. In addition, the LSA calculation unit 41 performs waveform processing under the signal processing condition determined by the calculation section 505 (or an operator) to determine coordinate positions in units of signals. As a result, 10 coordinate positions are obtained with respect to one specified mark, and the respective coordinate positions are stored in a memory section 501 (step 603).

Figure 31:
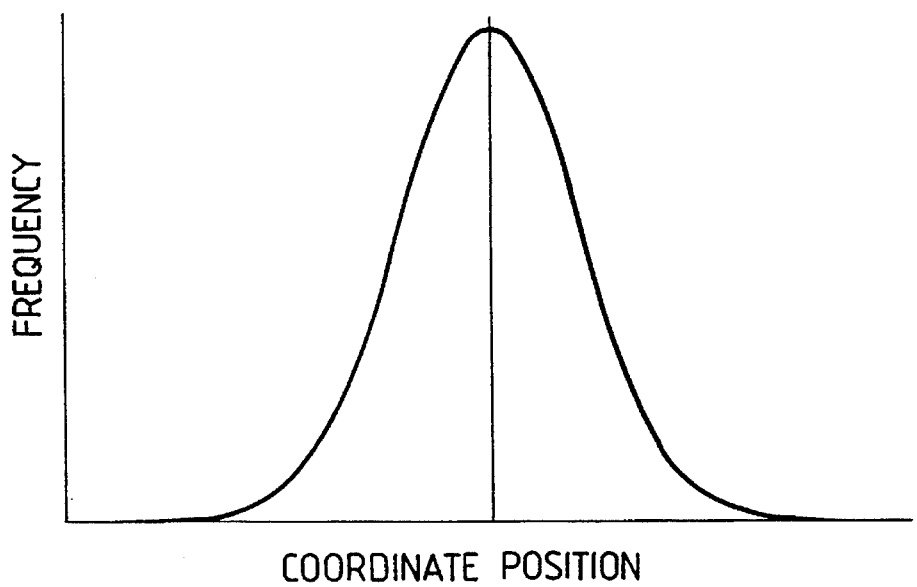
FIG. 31 is a graph showing a normal distribution corresponding to the repeatability of measurement (measurement error distribution) of an alignment sensor.

In step 604, the calculation section 505 performs statistical calculation processing, e.g., averaging processing, with respect to the 10 coordinate positions stored in the memory section 501 to determine the coordinate position of the specified mark, and obtains a variation (standard deviation $\sigma$ or $3\sigma$) of the 10 coordinate positions. FIG. 31 shows a normal distribution having the coordinate position (average value) obtained by the calculation section 505 and the standard deviation ($3\sigma$). The normal distribution shown in FIG. 31 corresponds to the repeatability of measurement of the LSA system 17.

Subsequently, the calculation section 505 (or an operator) determines, in accordance with the standard deviation obtained in step 604, whether the number of times the specified mark is measured in step 602 is sufficient (step 605). In this embodiment, since the number of times of measurement is set to be 10, if the standard deviation ($3\sigma$) is poor, i.e., the normal distribution (FIG. 31) is a broad distribution, it is determined that the number of times of measurement (data count) is insufficient, and the flow advances to step 606. If the standard deviation ($3\sigma$) is good, i.e., the normal distribution is a sharp distribution, it is determined that the number of times of measurement (data count) is sufficient, and the flow advances to step 607. Assume that the number of times of measurement is set to be a large value, e.g., about 20, in advance. In this case, even if the normal distribution is broad, the flow may advance to step 607 upon determining that the number of times of measurement is sufficient.

If it is determined in step 605 that the number of times of measurement is sufficient, the calculation section 505 stores the coordinate position (average value) and the standard deviation ($3\sigma$), obtained in step 604, and the number of times of measurement (10 times) above mentioned in a memory section 506 (step 607). At this time, the calculation section 505 displays the normal distribution (FIG. 31) having the coordinate position and the standard deviation, stored in the memory section 506, on a display unit 62, together with the signal processing condition and the number of times of measurement, set in the LSA calculation unit 41. Note that if the number of times of measurement is too large, the set value may be decreased and stored in the memory section 506.

If it is determined in step 605 that the number of times of measurement is insufficient, the calculation section 505 changes (adds) the number of times of measurement with respect to the specified mark in accordance the standard deviation obtained in step 604 (step 606). In this case, 15 is added to the number of times of measurement to change it to a total of 25. Subsequently, steps 602 and 603 are executed again to store the same number of coordinate positions as the added number (15) in the memory section 501. As a result, a total of 25 coordinate positions are stored in the memory section 501. In addition, the calculation section 505 obtains the coordinate position (average value) of the specified mark and a standard deviation ($3\sigma$) by using the 25 coordinate positions (step 604). In this case, since the number of times of measurement has already been increased, it is determined that the number of times of measurement (data count) is sufficient, and the flow immediately advances to step 607. The calculation section 505 then stores the coordinate position (average value) and the standard deviation ($3\sigma$), obtained in step 604), and the number of times of measurement (25 times) in the memory section 506. The following description is based on the assumption that the number of times of measurement is increased to 25.

In step 608, the calculation section 505 (or the operator) determines whether a standard deviation ($3\sigma$) is obtained in each of a plurality of signal processing conditions. In this case, since the standard deviation is obtained in only one signal processing condition, the flow advances to step 609. The plurality of signal processing conditions are set by the calculation section 505 or the operator in units of lots in advance. In step 609, the calculation section 505 changes at least one of a plurality of conditions which can be changed in the LSA calculation unit 41, e.g., a waveform analysis algorithm.

The LSA calculation unit 41 sequentially reads out the 25 waveform data, which have already been stored in the memory section 40, and performs waveform processing under a new signal processing condition, thus outputting each coordinate position to the memory section 501 (step 603). The calculation section 505 calculates the coordinate position (average value) of the specified mark and a standard deviation ($3\sigma$) from the newly obtained 25 coordinate positions, and outputs the calculated values to the memory section 506 and the display unit 62 (step 604). It is then checked whether a standard deviation ($3\sigma$) is obtained in each of all the signal processing conditions (step 608). Subsequently, the above-described operation is repeatedly executed until standard deviations ($3\sigma$) are obtained in all the signal processing conditions. In this case, the screen of the display unit 62 is divided into a plurality of screen areas, and the standard deviation (normal distribution) in each signal processing condition is displayed in each screen area. Alternatively, the normal distributions in all the signal processing conditions may be separately displayed on the same graph (screen), or the normal distributions may be sequentially displayed in units of signal processing conditions by switching the screen.

When standard deviations (3σ) in all the signal processing conditions are obtained, the calculation section 505 (or the operator) compares a plurality of standard deviations, stored in the memory section 506, with each other to select the standard deviation having the minimum value, and determines the signal processing condition, in which the selected deviation is obtained, as the optimal condition (step 610). In this case, minimization of the standard deviation (3σ) may mean that the signal processing condition is optimized, and the repeatability of measurement of the alignment sensor is improved. Note, however, that the standard deviation (3σ), i.e., the repeatability of measurement of the alignment sensor, is greatly degraded by factors, other than a signal processing condition, such as a rough wafer surface due to various types of processes. For this reason, even if the standard deviation (3σ) is minimized, the repeatability of measurement of the alignment sensor may become lower than a predetermined allowable value, that is, it cannot always be said that the reliability of a coordinate position (measurement value) is high and can be regarded as a true coordinate position.

Of the data stored in the memory section 506, a previously selected standard deviation (and coordinate position) and data other than the optimal signal processing condition may be deleted. In addition, various all data (standard deviation and the like) obtained in units of signal processing conditions need not be stored in the memory section 506. Instead, data in the memory section 506 may be replaced by various data obtained in the second and subsequent signal conditions on when standard deviations (3σ) obtained therein become smaller than the standard deviation which has already been stored in the memory section 506. Alternatively, if a standard deviation (3σ) becomes smaller than the allowable value in step 607, it may be considered that the signal processing condition is optimized, and the flow may immediately advance to step 610, even though standard deviations in all signal processing conditions are not obtained.

The calculation section 505 then checks whether the alignment sensor is to be altered. That is, it is determined whether the LSA system, the FIA system, and the LIA system have respectively obtained the minimum standard deviations (3σ) while changing signal processing conditions (step 611). In this case, since only the LSA system has obtained the standard deviation, the flow immediately returns to step 602. In step 602, the sequence controller 508 detects the specified mark (the same mark as that detected by the LSA system) plural times, e.g., about 10 times, by using an FIA system 20. The FIA system 20 (image pickup element) electrically scans an image of the specified mark and an image of an index mark plural times, and outputs an image signal obtained in each scan operation to an FIA calculation unit 42. Subsequently, steps 602 to 610 are executed with respect to the FIA system 20 to determine the minimum standard deviation (3σ) and the optimal signal processing condition, similar to the LSA system.

When the signal processing condition in the FIA calculation unit 42 is optimized, the flow returns to step 602 again. The sequence controller 508 then detects the specified mark (the mark as that detected by the LSA system and the FIA system) plural times, e.g., about 10 times, by using an LIA system 30. Since the LIA system 30 keeps outputting a sine photoelectric signal, an LIA calculation unit 43 fetches the sine photoelectric signal plural times every unit time. In this case, the time taken to fetch one photoelectric signal remains the same. Subsequently, steps 602 to 610 are executed with respect to the LIA system to determine the minimum deviation (3σ) and the optimal signal processing condition, similar to the LSA system and the FIA system. Note that there are three modes as signal processing conditions in the LIA system 30. In this case, standard deviations may be respectively obtained in the first mode, in which interference light of ±1st-order diffracted light is detected, and the second mode, in which interference light of 0th- and 2nd-order diffracted light is detected.

When the minimum standard deviations are respectively obtained in the LSA system, the FIA system, and the LIA system, the flow advances to step 612 to compare the three standard deviations in the memory section 506 so as to select (determine) an alignment sensor having the optimal repeatability of measurement (the minimum standard deviation) for the wafer. In this case, a normal distribution having each standard deviation may be displayed on the display unit 62 to allow the operator to select the optimal alignment sensor. In this case, assuming that the LSA system is selected, the optimal signal processing condition stored in the memory section 506 is set in the LSA calculation unit 41, and the standard deviation (3σ) obtained in the optimal signal processing condition is output to the random number generator 509. With the above-described operation, selection of the optimal alignment sensor for the wafer and optimization of the signal processing condition are completed.

Subsequently, the sequence controller 508 detects two pairs of alignment marks attached to each of the shot areas on the wafer W by using the LSA system. The LSA system outputs photoelectric signals obtained from the respective marks to the LSA calculation unit 41. The LSA calculation unit 41 performs waveform processing under the signal processing condition set in step 612 to obtain the coordinate positions of the respective marks, and outputs them to the memory section 501 (step 613).

Furthermore, the sequence controller 508 determines the optimal alignment mode for the wafer W (shot arrangement) by using the coordinate positions of all the shot areas which are stored in the memory section 501 (step 614). First, the calculation section 505 obtains alignment errors like those shown in FIG. 20A, change amounts of the alignment errors like those shown in FIG. 20B, and a standard deviation (σ or 3σ) of the change amounts like the one shown in FIG. 20C in the same manner as in step 105 in FIG. 15A, and stores them in the memory section 506. In addition, the obtained values, together with corresponding vectors, are displayed on the display unit 62. In this case, while only the vectors indicating the alignment errors (FIG. 20A) may be displayed on the display unit 62 in units of shot areas, the change amounts (FIG. 20B) of the alignment errors, the change amount of the change amounts (FIG. 20C), and the standard deviation (normal distribution) may be sequentially switched and displayed in accordance with designation from the operator.

Consider the change amounts of the alignment errors in FIG. 20B. If the directions and magnitudes of the respective change amounts (vectors) are almost the same throughout the wafer surface, it is considered that the wafer W has a linear distortion, and the EGA mode is selected as an alignment mode. If at least the directions or magnitudes of the change amounts vary, attention is paid to the standard deviation. If the standard deviation is lower than a predetermined value, it is considered that the wafer W has a regular non-linear distortion, and the W-EGA mode is selected as an alignment mode. In contrast to this, if the standard deviation exceeds the predetermined value, it is considered that the wafer W has random errors (irregular non-linear distortion), and hence the D/D mode is selected as an alignment mode.

The calculation section 505 (or the operator) selects (determines) the optimal alignment mode in accordance with the above-mentioned determination criteria. In this case, assuming that the EGA mode is selected, the EGA mode is designated with respect to the EGA calculation unit 502, and the flow advances to step 615. This embodiment may be designed such that only one of the EGA mode and the W-EGA mode can be selected in step 614. In this case, since the D/D mode cannot be selected, a change amount (standard deviation) like the one shown in FIG. 20C need not be obtained in step 614.

The calculation section 505 (or the operator) checks whether the repeatability of measurement, i.e., the standard deviation ($3\sigma$), of the alignment sensor selected in step 612 is good. In other words, the calculation section 505 checks whether the reliability of the coordinate position obtained in step 613 is high and can be regarded as a true coordinate position (step 615). The calculation section 505 reads out the standard deviation ($3\sigma$) obtained in the optimal signal processing condition determined in step 612 and stored in step 607 from the memory section 506, and compares the read standard deviation with a predetermined allowable value. If it is determined that the standard deviation is smaller than the allowable value, i.e., the repeatability of measurement is good, the flow advances to step 619. In contrast to this, if it is determined that the standard deviation exceeds the allowable value, i.e., the repeatability of measurement is poor, the flow advances to step 616. The following description is based on the assumption that it is determined that the repeatability of measurement is poor.

The sequence controller 508 detects two pairs of alignment marks attached to each of the shot areas on the wafer W plural times (e.g., the same number of times of measurement (25 times) as that stored in step 607) by using the LSA system. The LSA system then outputs a photoelectric signal obtained by each scan operation to the LSA calculation unit 41. The LSA calculation unit 41 performs waveform processing with respect to the photoelectric signals sequentially output from the LSA system to obtain a plurality of (25) coordinate positions in units of alignment marks, and outputs the respective coordinate positions to the memory section 501 (step 616). In this case, since the signal processing condition has been optimized in step 612, waveform data converted into digital values by the LSA calculation unit 41 need not be stored in the memory section 40.

The calculation section 505 performs statistical calculation processing, e.g., averaging processing, with respect to the plurality of (25) coordinate positions, stored in the memory section 501 in step 616, in units of alignment marks, and determines the resultant average value as a true coordinate position (first coordinate position), and outputs the true coordinate position of each alignment mark to the memory section 506 (step 617). In this case, the calculation section 505 may obtain differences (alignment errors) between the true coordinate positions and the design coordinate positions and display the alignment errors, as vectors, on the display unit 62 in units of shot areas. The above operation is based on the idea that when the same mark is detected plural times to improve the reliability of a measurement value, even if the repeatability of measurement of the alignment sensor is poor, a coordinate position (average value) determined by a plurality of measurement values can be regarded as a true coordinate position.

As described above, in the LSA system, when a plurality of coordinate positions are obtained by detecting the same mark plural times, the average value of the coordinate positions can be regarded as a true coordinate position. Similarly, in the FIA system, when a plurality of coordinate positions are obtained by electrically scanning the same mark image plural times, the average value of the coordinate positions can be regarded as a true coordinate position. In contrast to this, in the LIA system, if a plurality of coordinate positions are obtained by fetching a photoelectric signal plural of times after the time taken to fetch one sine photoelectric signal is set to be greatly (sufficiently) longer than that in a normal alignment operation, the average value of the coordinate positions can be regarded as a true coordinate position.

Assume that the repeatability of measurement of the alignment sensor with respect to a wafer is poor, and the measurement value cannot be regarded as a true coordinate position. In this case, as described above, the processing conditions (a sample shot arrangement, a weighting factor, and the like) in the EGA mode (or W-EGA mode) needs to be optimized in consideration of the repeatability of measurement of the alignment sensor. That is, each processing condition must be optimized on the assumption that coordinate positions (measurement values) vary. In this embodiment, therefore, a measurement error caused by other factors (especially the roughness of the wafer surface) than the repeatability of measurement of the alignment sensor, i.e., the optimized signal processing condition, is intentionally provided for the true coordinate position determined in step 617, and the coordinate position for which the measurement error is provided is used. The embodiment is characterized in that random numbers generated by a calculation unit are used as measurement errors to be provided for each true coordinate position.

In step 618, the EGA calculation unit 502 receives the first sample shot arrangement (number and positions) suitable for the EGA mode which is determined by a sample shot designation section 504, and reads out a true coordinate position $(X_{tm}, Y_{tm})$ of each sample shot of n true coordinate positions stored in the memory section 506 in step 617. Note that n is the total number of shots on the wafer. In this case, of all the shot areas, only sample shots are displayed on the display unit 62 upon inversion, e.g., black-and-white inversion, thus informing the first sample shot arrangement to the operator. Assume that the first sample shot arrangement has m (an integer satisfying $3 \leq m \leq n$) sample shots, and that the coordinate positions of the first to mth sample shots are expressed by $(X_{t1}, Y_{t1})$, $(X_{t2}, Y_{t2})$, . . . , $(X_{tm}, Y_{tm})$.

The random number generator 509 generates a plurality of random numbers on the basis of the standard deviation ($3\sigma$) input in step 612. That is, normal distribution random numbers $(RX_{ij}, RY_{ij})$ having a standard deviation ($3\sigma$) centered on the true coordinate position (average value) of a specified mark which is obtained in the optimal signal processing condition, are independently generated in the X- and Y-directions. In this case, the affix "i" indicates the ith set of normal distribution random numbers generated by the random number generator 509, and the affix "j" indicates the jth random number of the ith set of normal distribution random numbers. In this embodiment, since the random number generator 509 generates the first set of normal distribution random numbers with respect to the above-mentioned measurement error, the affix "i" is 1. In addition, since the number of sample shots is m, the affix "j" is 1 to m. When the number of sample shots is m, the random number generator 509 generates m normal distribution random numbers $(RX_{11}, RY_{11})$, $(RX_{12}, RY_{12})$, . . . , $(RX_{1m}, RY_{1m})$, and the EGA calculation unit 502 provides each normal distribution random number from the random number generator 509, as the above-mentioned measurement error, for the true coordinate position of a corresponding sample shot. As a result, the coordinate positions of the respective sample shots are expressed as $(X_{t1}+RX_{11}, Y_{t1}+RY_{11})$, $(X_{t2}+RX_{12}, Y_{t2}+RY_{12})$, ..., $(X_{tm}+RX_{1m}, Y_{tm}+RY_{1m})$, thus completing correction of the coordinate positions in consideration of the repeatability of measurement of the alignment sensor.

In step 619, the EGA calculation unit 502 performs statistical calculation processing by the EGA mode using the coordinate positions of the m sample shots, corrected in step 601, and the coordinate positions (design values) of the respective sample shots stored in a data section. That is, the EGA calculation unit 502 determines calculation parameters $\underline{a}$ to f by using the method of least squares according to equation (2), calculates the coordinate positions of all the shot areas on the wafer W by using the determined parameters $\underline{a}$ to f, and outputs the calculated coordinate positions to the memory section 506.

In this case, when the wafer stage WS is aligned in accordance with the coordinate positions (calculated values) calculated by the EGA mode (or W-EGA mode), errors, i.e., stepping errors, are caused around the coordinate positions with which the wafer stage WS are to be aligned. For this reason, it is difficult to obtain a desired accuracy of superposition unless the processing conditions in the EGA mode are optimized in consideration of even stepping errors as well as the repeatability of measurement of an alignment sensor. Similar to the repeatability of measurement of an alignment sensor, stepping errors (distribution) can also be represented by a normal distribution like the one shown in FIG. 31. In this embodiment, therefore, in addition to the above-descried measurement errors (step 617), normal distribution random numbers having a standard deviation ($\sigma$ or $3\sigma$) equivalent to a stepping error distribution obtained in advance by experiments or the like are intentionally provided, as the above-mentioned stepping errors, for the coordinate positions calculated in step 619. The processing conditions in the EGA mode (or W-EGA mode) are optimized by using the coordinate positions for which the stepping errors are provided.

Note that in the EGA mode (or W-EGA mode), the above-described measurement errors are produced with respect to only sample shots upon detection of alignment marks. However, stepping errors are produced with respect to all the shot areas on a wafer. For this reason, the above-mentioned normal distribution random numbers as stepping errors are provided for the coordinate position of each of all shot areas. Alternatively, normal distribution random numbers as stepping errors may be generated in consideration of the tendencies of a wafer stage. Assume that stepping errors produced when the wafer stage is moved from right to left along the arrangement direction of shot areas are different from those produced when the wafer stage is moved in the reverse direction. In this case, normal distribution random numbers having standard deviations equivalent to the respective error distributions may be switched and provided for the respective coordinate positions, in units of shot arrays, in accordance with the moving direction of the wafer stage.

In step 620, the calculation section 505 reads out the coordinate positions (calculated values) of all the shot areas stored in the memory section 506. A stepping error distribution of the wafer stage WS, obtained by experiments or the like, is input to the random number generator 509 in advance. The random number generator 509 generates normal distribution random numbers having a standard deviation ($\sigma$ or $3\sigma$) equivalent to this error distribution. For the sake of simplicity, assume that only one type of error distribution (standard deviation) is input to the random number generator 509. The error distribution (standard deviation) input to the random number generator 509 is displayed, as, e.g., a normal distribution, on the display unit 62. As described above, when the total number of shots on the wafer is n, the random number generator 509 generates n normal distribution random numbers. The calculation section 505 provides the normal distribution random numbers from the random number generator 509, as the above-mentioned stepping errors, for the coordinate position (calculated value) of each of all the shot areas, and outputs, to the memory section 506, the coordinate positions (which are the second coordinate positions and will be referred to as corrected coordinate positions hereinafter) for which the normal distribution random numbers are provided. With this operation, correction of the coordinate positions, in which the stepping errors are taken into consideration, is completed. At this time, the corrected coordinate positions may be stored in the memory section 506 in place of the coordinate positions (calculated values) obtained in step 619. In this embodiment, the above-mentioned replacement is performed, so that the true coordinate positions (first coordinate positions) and the corrected coordinate positions (second coordinate positions) are stored in the memory section 506.

fin step 621, the calculation section 505 obtains differences (residual errors) between the true coordinate positions (measured values) stored in memory section 506 in step 617 and the corrected coordinate positions (calculated values) stored in the memory section 506 in step 620 in units of shot areas, and calculates a superposition accuracy ($|X|+3\sigma$, $3\sigma$, or $|X|$) on the basis of the residual error of each shot area. Note that $|X|$ is the absolute value of the average value of superposition errors in the X-direction. In this case, the calculation section 505 displays the residual errors, as vectors, on the display unit 62 in units of shot areas. In addition, the standard deviation (normal distribution) corresponding to the repeatability of measurement or the stepping error distribution and the first sample shot arrangement may be displayed together with the residual errors. Thereafter, the calculation section 505 (or the operator) checks whether the superposition accuracy ($|X|+3\sigma$) satisfies a required accuracy (e.g., 0.09 μm) (step 622).

If the superposition accuracy satisfies the required accuracy, it is considered that a processing condition in the EGA mode, i.e., a sample shot arrangement, is optimized. Thus, the flow advances to step 623 to store (register) the first sample shot arrangement used in step 619, as the optimal condition, in the sample shot designation section 504. With the above-described operation, optimization of the processing condition in the EGA mode is completed. In this case, when the superposition accuracy satisfies the required accuracy, the calculation section 505 may receive n normal distribution random numbers from the random number generator 509 again to obtain corrected coordinate positions, and may check the superposition accuracy again by using the corrected coordinate positions. In this case, since the superposition accuracy is checked by using two sets of normal distribution random numbers (stepping errors), the sample shot arrangement can be optimized with a higher accuracy as compared with the above-described case wherein only one set of normal distribution random numbers is used. Not that if the superposition accuracy does not satisfy the required accuracy when two sets of normal distribution random numbers are used, the sample shot arrangement is changed again, and a sample shot arrangement which is obtained when it is determined, by using two sets of normal distribution random numbers, that the superposition accuracy satisfies the required accuracy is determined as the optimal condition. In addition, three or more sets of normal distribution random numbers may be generated by the random number generator 509, and a sample shot arrangement may be optimized such that the superposition accuracy based on each set satisfies the required accuracy.

Subsequently, the sequence controller 508 detects the alignment marks attached to all the sample shots by using the LSA system in accordance with the sample shot arrangement registered in step 623. The LSA calculation unit 41 obtains the coordinate positions of the alignment marks by performing waveform processing with respect to photoelectric signals from the LSA system, and outputs the coordinate positions of the respective sample shots to the memory section 501. The EGA calculation unit 502 performs statistical calculation processing (equation (2)) by using the coordinate positions (measurement values) stored in the memory section 501 and the coordinate positions (design values) stored in the data section 503 so as to calculate the coordinate positions of all the shot areas on the wafer W, and outputs all the calculated coordinate positions to the sequence controller 508. The sequence controller 508 executes superposition exposure with respect to each shot area on the first wafer W while aligning the wafer stage SW in accordance with the coordinate positions (calculated values) from the EGA calculation unit 502 (step 624).

In this case, in step 624, the coordinate positions of all the shot areas are calculated by the EGA mode in accordance with the optimized sample shot arrangement. However, superposition exposure may be performed by using the true coordinate position of each shot area determined in step 617 without any modification. With respect to the second and subsequent wafers in the lot, superposition exposure is performed by using the EGA mode under the various conditions optimized with respect to the first wafer in the above-described manner.

If it is determined in step 622 that the required accuracy is not satisfied, the flow immediately advances to step 625. In step 625, the calculation section 505 checks whether the sample shot arrangement is to be altered. In this case, since it is considered that the sample shot arrangement in the EGA mode is not optimized, the flow immediately advances to step 626 upon determining that the sample shot arrangement is to be altered. In step 626, the sample shot designation section 504 alters the sample shot arrangement in accordance with designation from the calculation section 505 (or the operator). Assume that in the embodiment, the first sample shot arrangement is altered to the second sample shot arrangement which has the same number of sample shots as that of the first sample shot arrangement but has completely different positions of the sample shots from those thereof.

In step 627, it is checked whether the repeatability of measurement of the alignment sensor is good or poor. Since it has already been determined in step 615 that the repeatability of measurement is poor, the flow immediately advances to step 618 to provide normal distribution random numbers for each of true coordinate positions $(X_{tm+1}, Y_{tm+1})$, $(X_{tm+2}, Y_{tm+2})$, ..., $(X_{t2m}, Y_{t2m})$ Of m sample shots of the second sample shot arrangement. In this case, the random number generator 509 has already generated the m normal distribution random numbers $(RX_{11}, RY_{11})$, $(RX_{12}, RY_{12})$, ..., $(RX_{1m}, RY_{1m})$ in the first sample shot arrangement. For this reason, the random number generator 509 generates m normal distribution random numbers of the first sets of normal distribution random numbers, i.e., the (m+1)th to 2mth normal distribution random numbers $(RX_{1m+1}, RY_{1m+1})$, $(RX_{1m+2}, RY_{1m+2})$, ..., $(RX_{12m}, RY_{12m})$. The EGA calculation unit 502 provides the normal distribution random numbers from the random number generator 509, as measurement errors, to the true coordinate positions of the sample shots to obtain corrected coordinate positions $(X_{tm+m}+RX_{1m+1}, Y_{tm+1}+RY_{1m+1})$, $(X_{tm+2}+RX_{1m+2}, Y_{tm+2}+RY_{1m+2})$, ..., $(X_{t2m}+RX_{12m}, Y_{t2m}+RY_{12m})$. In this case, there are no sample shots which are commonly used in the first and second sample shot arrangement. If, however, at least portions of the first and second sample shot arrangements are superposed on each other, normal distribution random numbers generated in the first sample shot arrangement may be provided for the superposed sample shots without any modification.

The EGA calculation unit 502 performs statistical calculation processing (equation (2)) again by using the corrected coordinate positions of the m sample shots in the second sample shot arrangement and the coordinate positions (design values) of the respective sample shots which are stored in the data section 503 so as to calculate the coordinate positions of all the shot areas on the wafer W (step 619). The calculation section 505 provides n normal distribution random numbers input from the random number generator 509 for the coordinate positions calculated by the EGA calculation unit 502 (step 620). In this case, the normal distribution random numbers provided for the n coordinate positions are completely the same as the n normal distribution random numbers provided for the coordinate positions obtained in the first sample shot arrangement in the above-described manner.

The calculation section 505 calculates a superposition accuracy on the basis of a residual error (a difference between each true coordinate position and a corresponding corrected coordinate position) of each shot area (step 621), and checks whether the superposition accuracy satisfies the required accuracy (step 622). If it is determined that the superposition accuracy satisfies the required accuracy, steps 623 and 624 are executed to complete superposition exposure, as described above. In contrast to this, if the required accuracy is not satisfied, the flow advances step 625 again. Subsequently, steps 625 to 627 and 618 to 621 are repeatedly executed until the superposition accuracy satisfies the required accuracy. When the superposition accuracy satisfies the required accuracy, it is considered that the sample shot arrangement is optimized, and the flow advances to step 623. Note that if it has been determined in step 615 that the repeatability of measurement is poor, the sample shot arrangement is preferably altered to increase the number of sample shots.

If it is determined in step 615 that the repeatability of measurement is good, the flow immediately advances to step 619 to perform statistical calculation processing. A sequence to be executed when the repeatability of measurement is good will be described below. In step 619, the EGA calculation unit 502 reads out the coordinate position of each sample shot, of the coordinate positions stored in the memory section 501 in step 613, in accordance with the first sample shot arrangement input from the sample shot designation section 504. In this case, since it is assumed that the repeatability of measurement is good, the coordinate positions obtained by the LSA calculation unit 41 can be directly used without performing measurement plural times as in the case descried above. That is, the coordinate positions obtained in step 613 can be regarded as the true coordinate positions (first coordinate positions). In addition, the EGA calculation unit 502 performs statistical calculation processing (equation (2)) by the EGA mode using the previously read coordinate positions (measurement values) and the coordinate positions (design values) in the data section 503 so as to calculate the coordinate position of each of all the shot areas on the wafer W, and outputs the coordinate positions to the memory section 506.

The calculation section 505 provides the n normal distribution random numbers, input from the random number generator 509, for the coordinate positions calculated by the EGA calculation unit 502 (step 620), and obtains differences (residual errors) between the resultant corrected coordinate positions and the coordinate positions (measurement values) stored in the memory section 501 in step 613. Thereafter, the calculation section 505 calculates a superposition accuracy from the residual error of each shot area (step 621). It is then checked whether the superposition accuracy satisfies the required accuracy (step 622). If the required accuracy is satisfied, the flow advances to step 623 to set the first sample shot arrangement, used in step 619, as the optimal condition, in the designation section 504. The sequence controller 508 executes superposition exposure of a reticle pattern with respect to each shot area on the first wafer W while aligning the wafer stage WS in accordance with the coordinate positions (calculated values) stored in the memory section 506 (step 624).

If the superposition accuracy does not satisfy the required accuracy, the flow advances to step 625. It is determined in step 625 that the sample shot arrangement is to be altered, and the hence the flow advances to step 626. In step 626, the designation section 504 alters the sample shot arrangement. Thereafter, it is determined in step 627 that the accuracy of measurement is good, and the flow returns to step 619. In step 619, the EGA calculation unit 502 reads out the coordinate position of each sample shot from the memory section 501 in accordance with the second sample shot arrangement input from the designation section 504. The EGA calculation unit 502 further performs statistical calculation processing (equation (2)) to calculate the coordinate position of each of all the shot areas on the wafer, and outputs each coordinate position to the memory section 506. Subsequently, steps 620 to 622 are executed in the same manner as described above. If the superposition accuracy satisfies the required accuracy, steps 623 and 624 are executed to complete superposition exposure. If the required accuracy is not satisfied, the flow advances to step 625 again. Steps 625 to 627 and 619 to 621 are repeatedly executed until the superposition accuracy satisfies the required accuracy. When the superposition accuracy satisfies the required accuracy, it is considered that the sample shot arrangement is optimized, and the flow advances to step 623.

In the above description, the sample shot arrangement in the EGA mode selected in step 614 is optimized. However, in some case, the superposition accuracy does not satisfy the required accuracy, even if the sample shot arrangement is changed in the above-described manner, regardless of the repeatability of measurement of the alignment sensor. For this reason, if the superposition accuracy doest not satisfy the required accuracy after the sample shot arrangement is altered a predetermined number of times, it is determined in step 625 that the sample shot arrangement is not altered, and the flow advances to step 628 to check whether the EGA mode is altered to the W-EGA mode (or D/D mode). The necessity to alter the alignment mode is determined by the calculation section 505 in accordance with a predetermined program. Alternatively, the display unit 62, or a buzzer or the like may be used to inform the operator that exposure cannot be performed in the EGA mode, thereby allowing the operator to determine the necessity to alter the alignment mode. In this case, if the mode is to be altered, the flow advances to step 629. Otherwise, wafer exchange is executed, and the second wafer is loaded on the wafer stage SW without performing superposition exposure with respect to the first wafer.

In step 629, an alignment mode to be applied to the first wafer is determined. In this case, if the alignment mode determined in step 614 is the EGA mode, the W-EGA mode or the D/D mode can be selected. If the alignment mode determined in step 614 is the W-FGA mode, the D/D mode can be selected. Therefore, in this embodiment, the W-EGA mode or the D/D mode can be selected. In this case, however, the W-EGA mode is selected in consideration of the throughput of the apparatus. At this time, the calculation section 505 or the operator designates the W-EGA mode with respect to the EGA calculation unit 502.

In step 630, it is checked whether the current alignment mode is the D/D mode (step 630). If YES in step 630, the flow immediately shifts to step 624 to execute superposition exposure. At this time, if it has been determined in step 615 that the accuracy of measurement is good, the sequence controller 508 executes superposition exposure while detecting alignment marks in units of shot areas by using the LSA system. Alternatively, the sequence controller 508 may align the wafer stage WS in accordance with the coordinate positions stored in the memory section 501 in step 613. In contrast to this, if it has already been determined in step 615 that the repeatability of measurement is poor, the sequence controller 508 executes superposition exposure while aligning the wafer stage WS in accordance with the coordinate positions stored in the memory section 506 in step 617. Note that if the D/D mode is selected for the first wafer, the D/D mode will be applied to the second and subsequent wafers. If the D/D mode is selected in step 629, or the D/D mode is selected while the repeatability of measurement is poor, it is preferable that the same sequence as that used for the first wafer be used for the second and subsequent wafers, and selection of an alignment mode and the like be performed again.

In this embodiment, since the W-EGA mode is selected, the flow shifts from step 630 to step 627 to check the repeatability of measurement of the alignment sensor. If the repeatability of measurement is good, the flow advances to step 619. In contrast to this, if the repeatability of measurement is poor, the flow advances to step 618. In this case, when the W-EGA mode is selected, either the $W_1$-EGA mode or the $W_2$-EGA mode may be selected on the basis of, e.g., the characteristic of the alignment errors calculated in step 614 regardless of the repeatability of measurement of the alignment sensor. A case wherein the $W_1$-EGA mode is selected will be described below. Assume that since the repeatability of measurement is poor, the flow advances to step 618.

In step 618, the EGA calculation unit 502 receives the first sample shot which is suitable for the $W_1$-EGA mode and determined by the sample shot designation section 504, and reads out the true coordinate positions of m sample shots of n true coordinate positions which have already been stored in the memory section 506 in step 617. The EGA calculation unit 502 provides m normal distribution random numbers (corresponding to measurement errors), input from the random number generator 509, for the true coordinate position of each sample shot.

The calculation section 505 (or the operator) determines the value of a parameter S (i.e., a weighting parameter D or a correction coefficient C) in equation (4), and supplies it to a weight generation section 507. The weight generation section 507 determines a weighting function (equation (4)) from the value of the parameter S, and calculates a weight to be provided for the coordinate position (obtained by providing the normal distribution random numbers for a true coordinate position) of the m sample shots, by using the determined function in units of shot areas. The weight generation section 507 then outputs the calculated weights to the EGA calculation unit 502. The EGA calculation unit 502 provides the weights, supplied from the weight generation section 507, for the coordinate positions of the respective sample shots, and determines calculation parameters $\underline{a}$ to f by using the method of least squares according to equation (3). The EGA calculation unit 502 then calculates the coordinate positions of the respective shot areas by using these parameters $\underline{a}$ to f. The coordinate positions of all the shot areas calculated in this operation are stored in the memory section 506 together with the value of the parameter S (step 619). The calculation section 505 provides the n normal distribution random numbers (corresponding to stepping errors), input from the random number generator 509, for the coordinate positions calculated by the EGA calculation unit 502 (step 620), and obtains differences (residual errors) between the resultant corrected coordinate positions and the true coordinate positions stored in the memory section 506 in step 617. Thereafter, the calculation section 505 calculates superposition accuracy from the residual error for each shot area (step 621).

Figure 32:
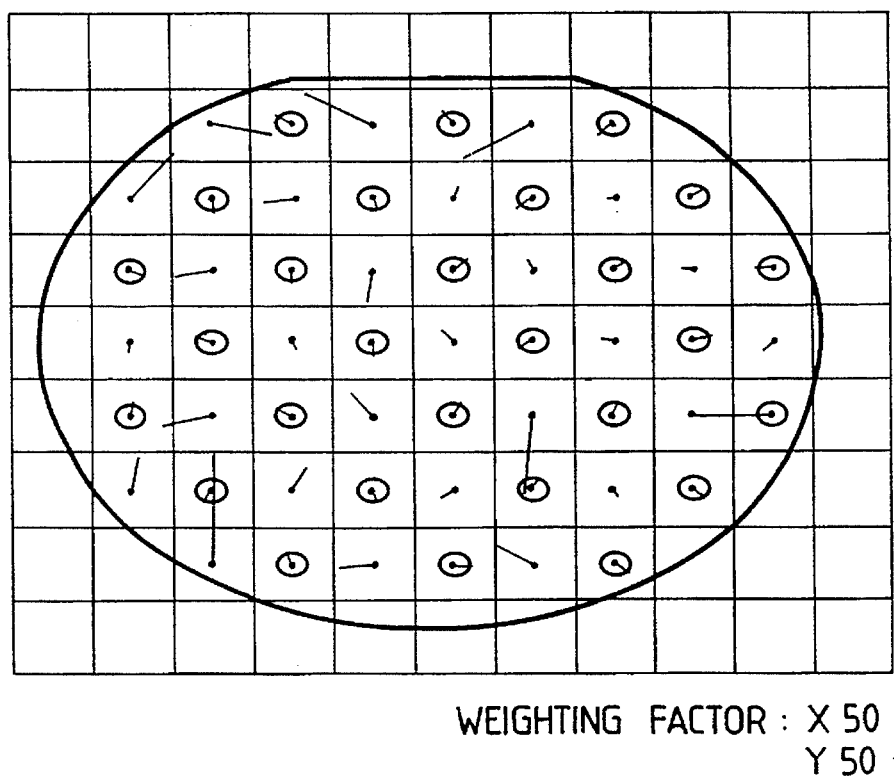
FIG. 32 is a vector map showing a residual error in each shot area on a wafer.

The calculation section 505 outputs the residual error of each shot area, the first sample shot arrangement, and the value of the parameter S (weighting factor) to the display unit 62. As shown in FIG. 32, the display unit 62 displays the residual error of each shot area as a vector, and also displays the m (28 in FIG. 32) shot areas selected as the sample shots with circles being attached thereto. In addition, the weighting factors in the X- and Y-directions are displayed to be informed to the operator. The superposition accuracy (|X|+ 3σ, 3σ, or |X|) calculated by the calculation section 505 may also be displayed as a numerical value or in the form of a normal distribution.

Subsequently, it is checked whether the superposition accuracy satisfies the required accuracy (step 622). If the required accuracy is satisfied, the flow advances to step 623 to set the first sample shot arrangement, as the optimal condition, in the sample shot designation section 504, and set the weighting factor (the value of the parameter S), as the optimal value, (or the weighting function as the optimal function) in the weight generation section 507. The sequence controller 508 then detects the alignment marks of all the sample shots by using the LSA in accordance with the sample shot arrangement set in step 623. The LSA calculation unit 41 performs waveform processing with respect to photoelectric signals from the LSA system to obtain the coordinate positions of the alignment marks, and outputs the coordinate positions of the respective sample shots to the memory section 501. The EGA calculation unit 502 receives weights for the respective sample shots, generated by the weight generation section 507 in units of shot areas, and performs weighting of the coordinate position (measurement value) of each sample shot, stored in the memory section 501. Furthermore, the EGA calculation unit 502 performs statistical calculation processing (equation (3)) by the W-EGA mode using the weighted coordinate positions and the coordinate positions (design values) stored in the data section 503 so as to calculate the coordinate positions of all the shot areas on the wafer W, and outputs all the calculated coordinate positions to the sequence controller 508. The sequence controller 508 executes superposition exposure of a reticle pattern with respect to each shot area on the first wafer W while aligning the wafer stage WS in accordance with the coordinate positions (calculated values) from the EGA calculation unit 502 (step 624).

If the superposition accuracy does not satisfy the required accuracy, the flow advances step 625 to check whether at least one of the processing conditions of the W-EGA mode, i.e., the sample shot arrangement and the weighting factor (the value of the parameter S) is to be altered. Assume, in this case, that it is determined that the weighting factor is not optimized. In step 626, the calculation section 505 (or the operator) alters the value of the weighting factor (i.e., a correction coefficient C or a weighting parameter D). Thereafter, in step 627, it is checked whether the repeatability of measurement is good. If the repeatability of measurement in the EGA mode (step 615) is good, the flow advances to step 619. Otherwise, the flow advances to step 618. In this case, it is determined that the repeatability of measurement is poor, and hence the flow advances to step 618. However, in step 626, only the weighting factor is altered, but the sample shot arrangement is not altered. For this reason, in step 618, there is no need to newly generate normal distribution random numbers from the random number generator 509 so as to correct the coordinate positions of the sample shots. Instead, the flow immediately advances to step 619. That is, if the repeatability of measurement is poor, the flow advances to step 618. However, only when the sample shot arrangement is altered in step 626, the calculation section 505 receives normal distribution random numbers from the random number generator 509 with respect to sample shots added (altered) by the designation section 504, and corrects the true coordinate position of each sample shot.

The weight generation section 507 determines a weighting function (equation (4)) in accordance with the weighting factor (parameter S) altered in step 626, calculates weights to be provided for the coordinate positions of m sample shots, by using the determined function, in units of shot areas, and outputs the calculated weights to the EGA calculation unit 502. In addition, the EGA calculation unit 502 determines calculation parameters $\underline{a}$ to f by using the method of least squares according to equation (3) upon providing the weights, supplied from the weight generation section 507, for the coordinate positions (obtained by providing the normal distribution random numbers for the true coordinate positions) of the respective sample shots in units of shot areas, and calculates the coordinate positions of the respective shot areas by using the parameters $\underline{a}$ to f. The calculated coordinate positions of all the shot areas are stored in the memory section 506 together with the value of the parameter S (step 619).

The calculation section 505 provides the n normal distribution random numbers, input from the random number generator 509, for the coordinate positions calculated by the EGA calculation unit 502 (step 620), and obtains differences (residual errors) between the resultant corrected coordinate positions and the true coordinate positions stored in the memory section 506. Thereafter, a superposition accuracy is calculated from the residual error of each shot area (step 621). It is then checked whether the superposition accuracy satisfies the required accuracy (step 622). If the required accuracy is satisfied, steps 623 and 624 are executed, as described above. If the required accuracy is not satisfied, the flow advances to step 625 to check whether the weighting factor is altered again, or the sample shot arrangement is also altered. In this case, it is determined that the superposition accuracy does not satisfy the required accuracy, and hence the flow advances to step 626 to alter only the weighting factor. If the superposition accuracy satisfies the required accuracy after execution of steps 627 and 618 to 622 are executed, steps 623 and 624 are executed. If the required accuracy is not satisfied, the flow advances to step 625. Subsequently, steps 618 to 622 are repeatedly executed while at least one of the weighting factor and the sample shot arrangement is sequentially altered, until the superposition accuracy in the $W_1$-EGA mode satisfies the required accuracy. Note that if the repeatability of measurement is good, the flow may shift from step 627 to step 619, and the above-mentioned weighting factor or sample shot arrangement may be optimized by using the coordinate positions obtained in step 613 without any modification in the same manner as in the EGA mode.

Figure 33:
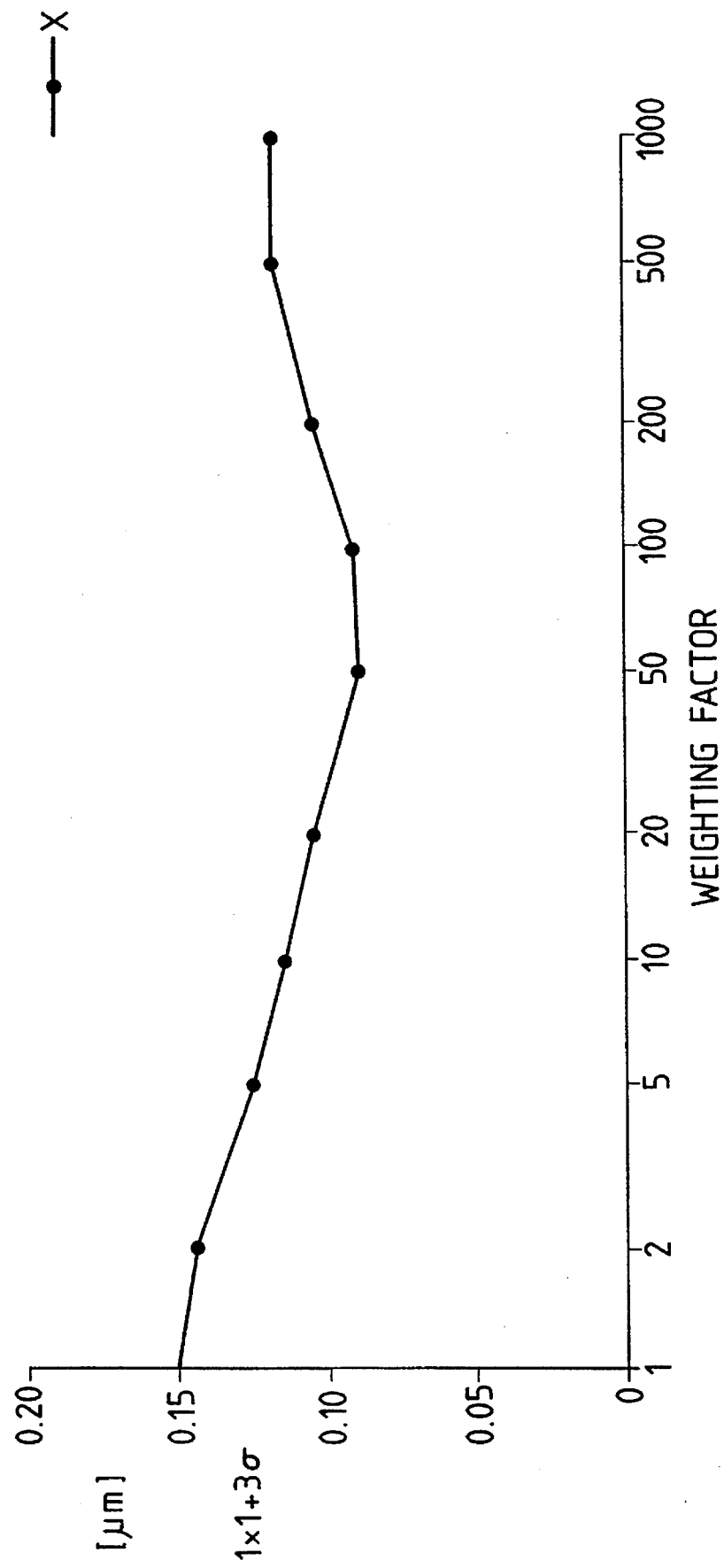
FIG. 33 is a graph showing the relationship between the accuracy of superposition and the weighting factor when only the weighting factor is changed with a sample shot arrangement remaining the same.

In this case, according to this embodiment, only the weighting factor for the same sample shot arrangement is sequentially altered, and a weighting factor with which the optimal superposition accuracy can be obtained is selected. FIG. 33 shows the relationship between the weighting factor and the superposition accuracy ($|X|+3\sigma$) obtained when only the weighting factor for the sample shot arrangement shown in FIG. 32 is sequentially altered. Referring to FIG. 33, when the weighting factor is 50, the superposition accuracy is optimized. In this case, a weighting factor of 50 is selected, and the value of the superposition accuracy is set in the weight generation section 507 if the superposition accuracy satisfies the required accuracy. At this time, the relationship shown in FIG. 33 may be displayed on the display unit 62. In this case, the operator selects a weighting factor with which the superposition accuracy is optimized, and sets the value of the weighting factor in the weight generation section 507. Note that if any superposition accuracies obtained with respect to the same sample shot arrangement do not satisfy the required accuracy, the sample shot arrangement is altered, and superposition accuracies are obtained with a plurality of weighting factors again.

If the superposition accuracy does not satisfy the required accuracy even after the weighting factor and the sample shot arrangement are altered, it is determined in step 625 that no conditions are altered, and the flow advances to step 628 to check whether the alignment mode is to be altered from the $W_1$-EGA mode to the D/D mode. The necessity to alter the alignment mode is determined by the calculation section 505 in accordance with a predetermined program.

Alternatively, the display unit 62, or a buzzer or the like may be used to inform the operator that exposure cannot be performed in the $W_1$-EGA mode, thus allowing the operator to determine the necessity to alter the alignment mode. If it is determined that the mode is to be altered, the alignment modes is altered to the D/D mode in step 629, and the flow shifts from step 630 to step 624 to execute superposition exposure by the D/D mode in the same manner as described above. If it is determined that the mode is not altered, superposition exposure is not performed with respect to the first wafer, and the wafer is stored in the original lot (carrier) or in a lot (carrier) for an unloading operation. Meanwhile, the sequence controller 508 loads the second wafer on the wafer stage WS.

The above description is associated with the $W_1$-EGA mode. Since the sequence in the $W_2$-EGA mode is the same as that in the $W_1$-EGa mode, a description thereof will be omitted. Note that in the $W_2$-EGA mode, the center of symmetry of non-linear distortions is sometimes altered as well as the weighting factor and the sample shot arrangement so as to be optimized. The $W_2$-EGA mode is different from the $W_1$-EGA mode only in these respects. Furthermore, when the W-EGA mode is selected in step 614, the weighting factor and the sample shot arrangement (also, the center of symmetry of non-linear distortions) are optimized in the same manner as described above.

In addition, in the W-EGA mode, the distances between shot areas whose coordinate positions should be determined and a plurality of sample shots are used to obtain weights to be provided for the coordinate positions of the respective sample shots. In this case, the above distances can be obtained from the coordinate positions of the shot areas and the coordinate positions of the sample shots. As the coordinate positions of arbitrary shot areas or sample shots on a wafer, the design coordinate positions stored in the shot position data section 503 or the true coordinate positions stored in the memory section 506 in step 617 may be used. Especially when the repeatability of measurement is good, the coordinate positions (measurement values) stored in the memory section 501 in step 613 may be used.

Weighting functions (equation (4)) are respectively prepared for an X-direction alignment mark and a Y-direction alignment mark so that weights $W_{in}$ can be independently set in the X- and Y-directions. Even if, therefore, the degree (magnitude) or regularity of a non-linear distribution of a wafer, or the step pitch or the distance between the centers of two adjacent shots (which distance almost corresponds to a shot size, although it depends on the width of a street line on a wafer) in the X-direction is different from that in the Y-direction, shot alignment errors on the wafer can be corrected with a high accuracy by independently setting weighting factors in the X- and Y-directions. For this reason, when the weighting factor is to be altered as described above, different weighting factors may be set in the X- and Y-directions, respectively.

In the above-described ninth embodiment, in step 617, a set of normal distribution random numbers $(RX_{11}, RY_{11})$, $(RX_{12}, RY_{12}), \ldots, (RX_{1m}, RY_{1m})$ are generated to correct the coordinate position of each sample shot. However, for example, the second set of normal distribution random numbers $(RX_{21}, RY_{21})$, $(RX_{22}, RY_{22}), \ldots, (RX_{2m}, RY_{2m})$ may be generated again to correct the coordinate position of each sample shot, and a superposition accuracy may be obtained by using the corrected coordinate positions, thus checking, by using the second set of normal distribution random numbers, whether the superposition accuracy satisfies the required accuracy. If the superposition accuracy does not satisfy the required accuracy when the second set of normal distribution random numbers are used, the sample shot arrangement, the weighting factor, the center of symmetry of non-linear distortions, and the like are altered again to optimize the processing condition such that the superposition accuracy satisfies the required accuracy with each of the second set of normal distribution random numbers. In this case, the processing condition in the EGA mode or the W-EGA mode is optimized by using each of the second set of normal distribution random numbers (measurement errors). Therefore, in this case, the processing condition can be optimized with a higher accuracy as compared with the case wherein only one set of normal distribution random numbers is used in the above-described manner. In addition, three or more sets of normal distribution random numbers may be generated by the random number generator 509 to optimize the processing condition such that the superposition accuracy satisfies the required accuracy with each of the sets. That is, if two or more sets of normal distribution random sets are prepared, measurement errors caused at random can be repeated with a high accuracy to allow optimization of processing condition with higher reliability. Note that when a plurality of sets of normal distribution random numbers are to be used, the processing condition is not altered but only the normal distribution random numbers may be altered in step 626, and steps 618 to 622 may be repeatedly executed.

If the coordinate position of each sample shot is to be corrected in step 617, different sets of normal distribution random numbers may be respectively provided for the coordinate positions in the X- and Y-directions. For example, the same X-direction alignment mark is detected plural times by using the LSA system to obtain a measurement error distribution (standard deviation), and normal distribution random numbers having this standard deviation are provided for a corresponding coordinate position in the X-direction. Similarly, the same Y-direction alignment mark is detected plural times by using the LSA system to obtain a measurement error distribution (standard deviation), and normal distribution random numbers having this standard deviation are provided for a corresponding coordinate position in the Y-direction.

Since alignment marks on a wafer peripheral portion tend to be adversely affected by a process and the like, measurement errors in shot areas present on the wafer peripheral portion tend to become large. For this reason, normal distribution random numbers having a large standard deviation may be provided for the coordinate position of each shot present on an area (e.g., ring-like area on the wafer peripheral portion), on the wafer, in which measurement errors are assumed to become large, whereas normal distribution random numbers having a small standard deviation may be provided for the coordinate position of each sample shot present in an area (e.g., a circular area on the wafer central portion) in which measurement errors are assumed to become small. In this case, one alignment mark within the ring-like area on the wafer peripheral portion and one alignment mark within the circular area on the wafer central portion may be detected as specified marks, respectively, plural times by using the same alignment sensor to obtain a measurement error distribution (standard deviation) in each area to be stored in the random number generator 509 in advance. Alternatively, the entire wafer surface may be divided into three areas in accordance with the degrees of measurement errors, and normal distribution random numbers respectively having standard deviations equivalent to the measurement error distributions of the respective areas may be provided for the coordinate positions of sample shots. If, for example, measurement errors become gradually large from the central portion to the peripheral portion of a wafer, the wafer surface may be divided into a plurality of ring-like areas which are concentric with respect to the circular area on the central portion.

In the sequence (FIGS. 30A and 30B) in this embodiment normal distribution random numbers having a standard deviation equivalent to a stepping error distribution are provided for each coordinate position on a wafer. However, such normal distribution random numbers may not be provided for each coordinate position depending on the degree (magnitude) of a stepping error distribution. That is, each coordinate position calculated in step 619 may be used as the second coordinate position in the present invention, without any modification, to obtain a superposition accuracy.

Figure 30B:
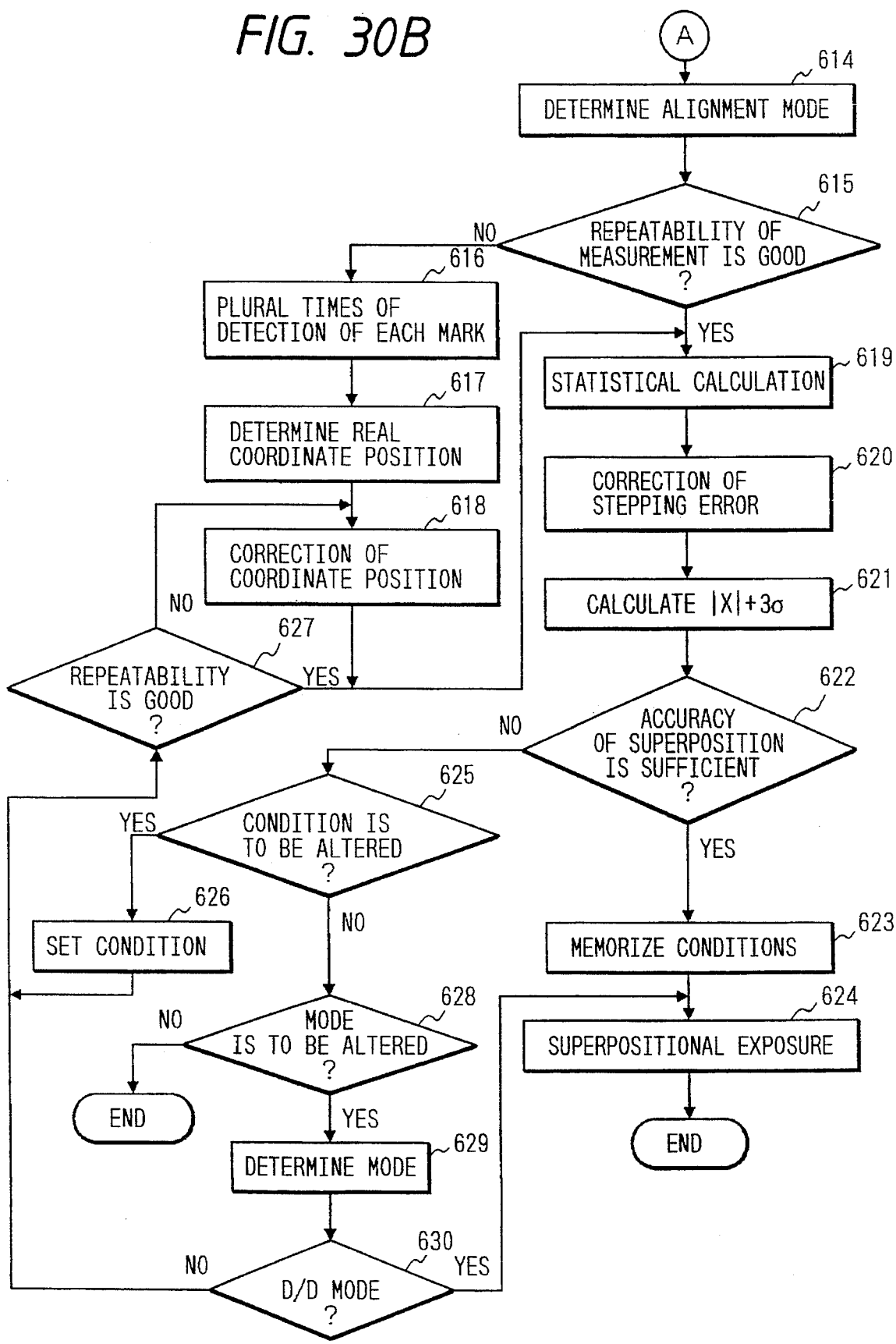
FIG. 30 is comprised of FIGS. 30A and 30B showing flow charts of an exposure sequence in the ninth embodiment of the present invention.

If the D/D mode is selected in step 614, and the repeatability of measurement is good, the flow immediately advances from step 615 to step 624 to execute superposition exposure, although this operation is not shown in FIGS. 30A and 30B. In contrast to this, if the repeatability of measurement is poor, steps 616 and 617 are executed to obtain the true coordinate position of each shot area, and the flow advances to step 624 to execute superposition exposure. In this case, if the D/D mode is selected, i.e., the true coordinate position of each shot area is obtained, with resect to the second and subsequent wafers, the throughput greatly decreases. For this reason, if the D/D mode is selected with respect to the first wafer, and the repeatability of measurement is poor, it is preferable that the EGA mode or the W-EGA mode be selected with respect to the second wafer in step 614, and that a desired superposition accuracy be obtained by optimizing the processing conditions in the selected alignment mode. Alternatively, the sequence shown in FIG. 30 may be applied to the second wafer again to determine an alignment mode and obtain a repeatability of measurement. Note that the sequence shown in FIG. 30 (e.g., the first wafer to a wafer of a given ordinal number) regardless of the type of alignment mode, repeatability of measurement, and the like.

If alignment marks formed on a wafer, especially on a peripheral portion, are made asymmetrical owing to the influences of processes such as a coverage process, coordinate positions measured by an alignment sensor have errors (offsets). That is, detection is erroneously performed. Such an error occurs in only a specific direction (e.g., a direction to separate from the wafer center), and this error (detection error amount) cannot be obtained even by performing measurement plural times, unlike measurement errors centered on a true coordinate position as described above. That is, if erroneous detection is performed, true coordinate positions obtained in step 617 are "erroneously detected coordinate positions". If, therefore, the repeatability of measurement is poor, errors obtained by experiment, experience, or the like are subtracted from the "erroneously detected coordinate positions" in step 617 to obtain true coordinate positions. If the repeatability of measurement is good, the above-mentioned errors are subtracted from the coordinate positions of all the shot areas, obtained in step 613, to obtain true coordinate positions. A superposition accuracy may be obtained by using these coordinate positions. With this operation, the processing conditions in the EGA mode or the W-EGA mode can be optimized with a higher accuracy.

Although coordinate positions used to determine an alignment mode in step 614 are those obtained in step 613, the coordinate positions obtained in this step are not necessarily true coordinate positions because each alignment mark is not detected plural times in step 613. If, therefore, the repeatability of measurement is extremely poor, it is uncertain that the alignment mode determined in step 614 is the optimal mode (i.e., the reliability is poor). For this reason, if the repeatability of measurement, i.e., the standard deviation ($3\sigma$), stored in step 607 is larger than a predetermined allowable value, each alignment mark may be detected plural times to obtain the true coordinate positions of all the shot areas in step 613. In step 614, an alignment mode may be determined by using the true coordinate position of each shot area. In the sequence shown in FIG. 30, it is determined in step 615 that the repeatability of measurement is poor, and the flow advances to step 616. However, since the operations in steps 616 and 617 have already been completed in step 613, the flow immediately advances to step 618 to perform coordinate position correction. Note that other sequences are the same as those in the ninth embodiment.

In the ninth embodiment, the sequence for optimizing the processing conditions in the EGA mode or the W-EGA mode has been described. However, a superposition accuracy with each of a plurality of processing conditions in the EGA mode or the W-EGA mode may be obtained, and the superposition accuracy in each processing condition in each alignment mode may only be analyzed (simulated). FIG. 33 shows the relationship between the superposition accuracy and the weighting factor in a case wherein only the weighting factor is altered while the sample shot arrangement is kept unchanged. However, the above-mentioned relationship may be obtained in each of a plurality of sample shots and may be displayed on the same graph. In this case, superposition accuracies obtained when the weighting factor and the sample shot arrangement are altered can be easily checked. Referring to FIG. 32, only one data (residual error) in each shot area is displayed as a vector. However, a plurality of data in each shot area may be displayed as vectors. For example, the above-mentioned simulation result, an actual exposure result, and a difference between the simulation result and the exposure result may be simultaneously displayed as three vectors. In this case, by changing the scale of the vector of each data, only the vector of one necessary data can be displayed. This operation can be easily realized by changing the magnification ratio of data stored in the memory section 506 when the data are displayed, as vectors, on the display unit 62.

If only one of the EGA mode and the W-EGA mode can be selected in step 614, it is only required to check whether a wafer has a linear or non-linear distortion. Therefore, for example, this determination may be performed by the following method. The coordinate positions of all the shot areas on a wafer are calculated by using the EGA mode, and differences (residual errors) between the coordinate positions (calculated values) and the coordinate positions obtained in step 613 are obtained in units of shot areas. If the residual error in each shot area is sufficiently small, linear approximation can be used, that is, it can be considered that the wafer has only a linear distortion. In contrast to this, if this residual error is large, it can be considered that the wafer has only a non-linear distortion.

In the above-described embodiment, even selection of the optimal alignment sensor is performed. However, for example, various information (e.g., the types and thicknesses of a wafer, an underlayer, and a resist, the shape of an alignment mark, level difference, and the like) may be written on a lot (carrier) or a wafer so that the apparatus itself can select the optimal alignment sensor for the wafer by reading this identification code. As an alignment sensor, any one of the following sensors may be used: a TTR sensor, a TTL sensor, and an off-axis sensor. In addition, as a detection scheme, any one of the following schemes may be used: the above-mentioned LSA scheme, the image processing scheme in the FIA system 20, and the two-beam interference scheme in the LIA system 30. Furthermore, the exposure apparatus of the present invention may be realized by software or hardware. Moreover, the present invention can be equally applied to a repair apparatus, a wafer prober, and the like as well as exposure apparatuses (a projection exposure apparatus, an X-ray exposure apparatus, and the like) of various schemes including the step-and-repeat scheme, the step-and-scan scheme, and the proximity scheme.

What is claimed is:

1. A method of aligning each of a plurality of processing areas regularly aligned on a substrate according to designed alignment coordinates to a predetermined reference position in a static coordinate system for defining a moving position of said substrate, comprising the steps of:

measuring coordinate positions, on the static coordinate system, of at least three processing areas selected in advance as specific processing areas from the plurality of processing areas; and determining coordinate positions, on the static coordinate system, of the plurality of processing areas on said substrate by weighting the coordinate positions, on the static coordinate system, of said at least three specific processing areas according to distances between a processing area of interest and each of said at least three specific processing areas in units of processing areas on said substrate, and executing a statistic calculation using the plurality of weighted coordinate positions.

2. A method according to claim 1, wherein when the coordinate positions, on the static coordinate system, of the processing areas on said substrate are determined, as the specific processing area has a shorter distance to the processing area of interest, a weighting coefficient to be multiplied with the coordinate position of the specific processing area is increased.

3. A method according to claim 2, wherein the weighting is independently performed for coordinate positions, in X- and Y-directions of the static coordinate system, of the specific processing area.

4. A method according to claim 2, wherein the weighting coefficient to be multiplied with the coordinate position of the specific processing area is altered according to a deformation state of said substrate.

5. A method according to claim 4, wherein said substrate has a non-linear distortion.

6. A method according to claim 1, wherein, in determining the coordinate positions of each of the plurality of processing areas on said substrate, a model formula corresponding to the arrangement of said plurality of processing areas on said substrate is determined for each processing area by said statistic calculation and said coordinate positions in the static coordinate system are calculated based on the determined model formula.

7. A method according to claim 6, wherein, in determining the model formula for a processing area of interest on said substrate, weighting is given to squares of residuals between coordinate positions, of each of said at least three specific processing areas, preestimated by said model formula and said measured coordinate positions in accordance with the distance between said specific processing area and said processing area of interest such that said residuals become minimum, and a statistic calculation is executed on the weighted residuals.

8. A method according to claim 1, further comprising the step of rejecting a coordinate position on said static coordinate system of at least one specific processing area among said at least three specific processing areas, in which a difference between said measured coordinate position and a corresponding reference position exceeds a predetermined allowable value, so that said statistic calculation is performed by using a plurality of coordinate positions excluding the rejected coordinate position.

9. A method according to claim 8, wherein said allowable value is set in accordance with a weight provided for the coordinate position of said specific processing area.

10. A method according to claim 8, wherein in determining a coordinate position of a processing area on said substrate on said static coordinate system, a weight to be provided for the coordinate position of the specific processing area is increased as a distance to said processing area decreases, and the allowable value for the specific processing area is decreased as the weight increases.

11. A method according to claim 10, wherein said allowable value is set to be a value proportional to a reciprocal of a weight provided for a coordinate position of said specific processing area.

12. A method of aligning each of a plurality of processing areas regularly aligned on a substrate according to designed alignment coordinates to a predetermined reference position in a static coordinate system for defining a moving position of said substrate, comprising the steps of:

measuring coordinate positions, on the static coordinate system, of at least three processing areas selected in advance as specific processing areas from the plurality of processing areas; and determining coordinate positions, on the static coordinate system, of the plurality of processing areas on said substrate by weighting the coordinate positions, on the static coordinate system, of said at least three specific processing areas according to a distance between a processing area of interest and a predetermined point of interest defined in advance on said substrate, and distances between the point of interest and each of said at least three specific processing areas in units of processing areas on said substrate, and executing a statistic calculation using the plurality of weighted coordinate positions.

13. A method according to claim 12, wherein when the coordinate positions, on the static coordinate system, of the processing areas on said substrate are determined, as the specific processing area has a distance to the point of interest closer to the distance between the point of interest and the processing area of interest, a weighting coefficient to be multiplied with the coordinate position of the specific processing area is increased.

14. A method according to claim 13, wherein the weighting coefficients to be multiplied with the coordinate positions of the specific processing areas are set to be substantially equal to each other for the processing areas having substantially equal distances to the point of interest on said substrate.

15. A method according to claim 12, wherein the point of interest is a center point of deformation of said substrate.

16. A method according to claim 15, wherein said substrate has a non-linear distortion symmetry about said center point of deformation.

17. A method according to claim 15, wherein the center point of deformation is substantially a center point of said substrate.

18. A method according to claim 13, wherein the weighting coefficient to be multiplied with the coordinate position of the specific processing area is altered according to a deformation state of said substrate.

19. A method according to claim 12, wherein, in determining the coordinate positions of each of the plurality of processing areas on said substrate, a model formula corresponding to the arrangement of said plurality of processing areas on said substrate is determined for each processing area by said statistic calculation and said coordinate positions in the static coordinate system are calculated based on the determined model formula.

20. A method according to claim 19, wherein, in determining the model formula for a processing area of interest on said substrate, weights are given to squares of residuals between coordinate positions, of each of said at least three specific processing areas, preestimated by said model formula and said measured coordinate positions in accordance with the distance between said processing area of interest and said predetermined point of interest and the distance between said predetermined point of interest and said specific processing area such that said residuals become minimum, and a statistic calculation is executed on the weighted residuals.

21. A method of aligning each of a plurality of processing areas regularly aligned on a substrate according to designed alignment coordinates to a predetermined reference position in a static coordinate system for defining a moving position of said substrate, comprising:

the measurement step of measuring coordinate positions, on the static coordinate system, of at least three processing areas selected in advance as specific processing areas from the plurality of processing areas;

the correction step of correcting the coordinate positions, on the static coordinate system, of said at least three specific processing areas on the basis of a flatness of said substrate; and the calculation step of calculating coordinate positions, on the static coordinate system, of the plurality of processing areas on said substrate by executing a statistic calculation using the plurality of corrected coordinate positions, wherein the moving position of said substrate is controlled according to the calculated coordinate positions and the flatness of said substrate, thereby aligning each of the plurality of processing areas to the reference position.

22. A method of aligning each of a plurality of processing areas regularly aligned on a substrate according to designed alignment coordinates to a predetermined reference position in a static coordinate system for defining a moving position of said substrate, comprising:

the detection step of selecting at least three processing areas as specific processing areas from the plurality of processing areas, and detecting coordinate positions, on the static coordinate system, of said at least three specific processing areas when a surface of each of the selected specific processing areas is substantially parallel to a moving plane of said substrate; and the calculation step of calculating coordinate positions, on the static coordinate system, of the plurality of processing areas on said substrate by executing a statistic calculation using the plurality of detected coordinate positions, wherein the moving position of said substrate is controlled according to the calculated coordinate positions and inclination amounts in units of processing areas with respect to the moving plane of said substrate, thereby aligning each of the plurality of processing areas to the reference position.

23. A method of aligning each of a plurality of processing areas aligned on a substrate to a predetermined reference position in a static coordinate system for defining a moving position of said substrate in units of N (N is an integer satisfying $N \geq 2$) substrates, comprising the steps of:

designating at least one of substrates up to a (k−1)th substrate as a specific substrate prior to alignment of a plurality of processing areas on a k-th (k is an integer satisfying $2 \leq k \leq N$) substrate, measuring coordinate positions, on the static coordinate system, of a plurality of processing areas designated in advance as measurement processing areas on the specific substrate, and calculating a characteristics of alignment errors of the plurality of processing areas on the basis of the plurality of coordinate positions; and selecting an alignment mode according to the calculated characteristic of the alignment errors from a plurality of alignment modes for coping with alignment errors of the plurality of processing areas on said substrate, and using the selected alignment mode for the k-th substrate.

24. A method according to claim 23, wherein the plurality of measurement processing areas are almost all processing areas on the specific substrate.

25. A method according to claim 23, wherein a first substrate of substrates up to the (k−1)th substrate is determined as the specific substrate, coordinate positions, on the static coordinate system, of almost all processing areas on the first substrate are measured, and an alignment mode according to the characteristic of alignment errors calculated from the plurality of coordinate positions is used.

26. A method according to claim 25, wherein all substrates up to the (k−1)th substrate are determined as the specific substrates, and the characteristics of alignment errors of all the specific substrates are calculated to select an alignment mode.

27. A method according to claim 26, wherein the value of k is set to satisfy $k \geq 3$, when the alignment mode selected for one of the second and subsequent specific substrates is different from the alignment mode selected for the specific substrate before the one specific substrate, the one specific substrate having the different alignment mode is assumed as a first substrate, and an alignment mode is selected using substrates from the one specific substrate to a (k−1)th substrate as the specific substrates.

28. A method according to claim 23, wherein in the specific substrate, differences between the measured coordinate positions of the measurement processing areas and designed coordinate positions are calculated as the alignment errors, and a change amount of the alignment errors between the two adjacent measurement processing ares is calculated as the characteristic of the alignment errors.

29. A method according to claim 23, wherein in the specific substrate, the statistic calculation is executed using the measured coordinate positions of the plurality of measurement processing areas to calculate coordinate positions of the plurality of measurement processing areas, and differences between the calculated coordinate positions and the measured coordinate positions of the measurement processing areas are calculated as the characteristics of alignment errors.

30. A method according to claim 23, wherein the plurality of alignment modes include a first mode of measuring coordinate positions, on the static coordinate system, of at least three processing areas selected in advance as specific processing ares from the plurality of processing areas on the substrate, executing a statistic calculation using the plurality of measured coordinate positions to calculate coordinate positions, on the static coordinate system, of the plurality of processing areas on the substrate, and controlling the moving position of the substrate according to the calculated coordinate positions of the plurality of processing areas.

31. A method according to claim 30, wherein when the first mode is selected for the specific substrate, the characteristic of alignment errors is calculated for the k-th substrate according to differences between the calculated coordinate positions and the measured coordinate positions of the specific processing areas, the characteristic of alignment errors of the k-th substrate is compared with the characteristic of alignment errors of the specific substrate, and whether or not the first mode is used for the k-th substrate is used is determined according to the comparison result.

32. A method according to claim 30, wherein a plurality of groups each including a plurality of processing areas are set on the substrate, and at least one of the plurality of groups is used as said at least three specific processing areas.

33. A method according to claim 30, wherein when the first mode is selected for the specific substrate, an accuracy of alignment is calculated based on differences between the calculated coordinate positions and the measured coordinate positions of the processing areas on the substrate, and an arrangement of the specific processing areas is altered until the accuracy satisfies a predetermined required accuracy.

34. A method according to claim 30, wherein the first mode includes a mode of executing a statistic calculation using the coordinate positions of the plurality of specific processing areas to calculate coordinate positions of the plurality of processing ares on the substrate, and a mode of weighting the coordinate positions of the plurality of specific processing areas, and executing a statistic calculation using the weighted coordinate positions to calculate coordinate positions of the processing areas on the substrate.

35. A method according to claim 34, wherein a degree of the weighting is determined according to a distance between the processing area of interest and each of the plurality of specific processing areas.

36. A method according to claim 34, wherein a degree of the weighting is determined according to a distance between the processing area of interest and a predetermined point of interest defined in advance on the substrate, and a distance between the point of interest and each of said at least three specific processing areas.

37. A method according to claim 30, wherein the plurality of alignment modes include a second mode of measuring coordinate positions in units of processing areas on the substrate, and aligning each of the processing areas to the reference position.

38. An apparatus for aligning each of a plurality of processing areas aligned on a substrate to a predetermined reference position in a static coordinate system for defining a moving position of said substrate in units of N (N is an integer satisfying $N \geq 2$) substrates, comprising:

a substrate stage for holding and two-dimensionally moving said substrate;

position measurement means, having a mark detection system for detecting a mark attached to each of the plurality of processing areas on said substrate, for measuring coordinate positions of the processing areas on the static coordinate system;

calculation means for designating at least one of substrates up to a (k−1)th (k is an integer satisfying $2 \leq k \leq N$) substrate as a specific substrate, and calculating a characteristic of alignment errors of the plurality of processing areas on said substrate on the basis of coordinate positions of a plurality of processing areas designated in advance as measurement processing areas on said specific substrate;

selection means, having a plurality of alignment modes for coping with alignment errors of the plurality of processing areas on said substrate, for selecting an alignment mode according to the calculated characteristic of alignment errors from the plurality of alignment modes; and control means for controlling the moving position of said substrate stage according to the selected alignment mode so as to align each of a plurality of processing areas on a k-th substrate to the reference position.

39. A method of aligning each of a plurality of processing areas arranged on a substrate to a predetermined reference position in a static coordinate system for defining a moving position of said substrate, comprising the steps of:

measuring coordinate positions of some specific processing areas, among said plurality of processing areas, in said static coordinate system; and determining a coordinate position of a processing area of interest on said substrate in said static coordinate system, before aligning the processing area of interest to said reference position, by executing a statistic calculation on said measured coordinate positions using weighting in accordance with each of the distances between said processing area of interest and said specific processing areas.

40. A method according to claim 39, further comprising the step of generating said weighting based on a exponential function functional of the distances said processing area of interest and said specific processing areas.

41. A method according to claim 40, wherein said exponential function is modified in accordance with a non-linear distortion characteristic.

42. A method according to claim 40, wherein said statistic calculation is executed using each of a plurality of sets of weightings generated based on a plurality of exponential functions different from each other and the coordinate position of said processing area of interest in said static coordinate system is determined on the basis of a plurality of results of the calculation.

43. A method according to claim 39, further comprising the step of rejecting a coordinate position on said static coordinate system of at least one specific processing area among said some specific processing areas, in which a difference between said measured coordinate position and a corresponding reference position exceeds a predetermined allowable value.

44. A method according to claim 43, wherein in determining a coordinate position of said processing area of interest on said static coordinate system, a weight to be provided for a coordinate position of a specific processing area is increased as a distance to said processing area of interest decreases, and said allowable value for the specific processing area is decreased as the weight increases.

45. A method according to claim 39, further comprising the step of rejecting at least one coordinate position, of said plurality of measured coordinate positions, which exceeds a predetermined allowable value in terms of a difference with respect to a corresponding reference position.

46. A method according to claim 39, further comprising the step of rejecting at least one abnormal value of said plurality of measured coordinate positions by using a standard deviation of the plurality of coordinate positions.

47. A method of aligning each of a plurality of processing areas arranged on a substrate to a predetermined reference position in a static coordinate system for defining a moving position of said substrate, comprising the steps of:

measuring coordinate positions of some specific processing areas, among said plurality of processing areas, in said static coordinate system; and determining a coordinate position of a processing area of interest on said substrate in said static coordinate system, before aligning the processing area of interest to said reference position, by executing a statistic calculation on said measured coordinate positions using weighting in accordance with the distance between said processing area of interest and a predetermined point of interest on said substrate and the distance between said predetermined point of interest and said specific processing area.

48. A method according to claim 47, further comprising the step of rejecting a coordinate position on said static coordinate system of at least one specific processing area among said some specific processing areas, in which a difference between said measured coordinate position and a corresponding reference position exceeds a predetermined allowable value.

49. A method of aligning each of a plurality of processing areas arranged on a substrate to a predetermined reference position in a static coordinate system defining a moving position of the substrate, comprising the steps of:

measuring a coordinate position, on the static coordinate system, of each of a plurality of processing areas designated as measurement processing areas on the substrate, calculating a characteristic of alignment errors of the plurality of processing areas on the substrate, and grouping the plurality of processing areas into a plurality of blocks on the basis of the calculated characteristic of the alignment errors; and paying attention to one of the blocks, and selecting an alignment mode corresponding to a characteristic of alignment errors in the block, to which the attention is paid, from a plurality of alignment modes for coping with alignment errors in a plurality of processing areas on the substrate, wherein a plurality of alignment modes selected in units of the blocks are used with respect to the substrate.

50. A method according to claim 49, wherein the plurality of measurement processing areas are substantially all processing areas on the substrate.

51. A method of aligning each of a plurality of processing areas arranged on each of N (an integer expressed as N≧2) substrates to a predetermined reference position in a static coordinate system defining a moving position of the substrate, comprising the steps of:

setting at least one of first to (k−1)th substrates as a specific substrate, prior to alignment of each of a plurality of processing areas on a kth (an integer expressed as 2≦k≦N) substrate with the reference position, measuring a coordinate position, on the static coordinate system, of each of a plurality of processing areas designated as measurement processing areas on the specific substrate, calculating a characteristic of alignment errors of the plurality of processing areas on the basis of the plurality of coordinate positions on the specific substrate, and grouping the plurality of processing areas into a plurality of blocks on the basis of the calculated characteristic of the alignment errors; and paying attention to one of the blocks, and selecting an alignment mode corresponding to a characteristic of alignment errors in the block, to which the attention is paid, from a plurality of alignment modes for coping with alignment errors in a plurality of processing areas on the specific substrate, wherein a plurality of alignment blocks selected in units of the blocks are used with respect to the kth substrate.

52. An alignment method of measuring coordinate positions, on a static coordinate system defining a moving position of a substrate, of some of a plurality of processing areas arranged on the substrate prior to alignment of each of the plurality of processing areas with a predetermined reference position in the static coordinate system, and calculating a coordinate position, on the static coordinate system, of each processing area on the substrate by using a calculation parameter calculated by performing statistical calculation processing of the measured coordinate positions, comprising the steps of:

calculating a plurality of calculation parameters by performing the statistical calculation processing while sequentially changing a calculation condition for the calculation parameter, and obtaining a deviation between each of the measured coordinate positions and a corresponding one of coordinate positions, on the static coordinate system, of the processing areas, obtained by using each of the plurality of calculation parameters; and calculating a coordinate position, on the static coordinate system, of each processing area on the substrate by using a calculation parameter, of the plurality of calculation parameters, in which the deviation is minimized.

53. An alignment method of measuring coordinate positions, on a static coordinate system defining a moving position of a substrate, of some of a plurality of processing areas arranged on the substrate prior to alignment of each of the plurality of processing areas with a predetermined reference position in the static coordinate system, and calculating a coordinate position, on the static coordinate system, of each processing area on the substrate by using a calculation parameter calculated by performing statistical calculation processing of the measured coordinate positions, comprising the steps of:

when a mark attached to each of the some processing areas is to be detected to measure a coordinate position, on the static coordinate system, of each of the some processing areas, calculating a plurality of calculation parameters by performing the statistical calculation processing while sequentially changing a detection condition for the mark, and obtaining a deviation between a coordinate position, on the static coordinate system, of each of the processing areas, obtained by using each of the plurality of calculation parameters, and a coordinate position measured under a detection condition corresponding to each of the calculation parameters; and calculating a coordinate position, on the static coordinate system, of each processing area on the substrate by using a calculation parameter, of the plurality of calculation parameters, in which the deviation is minimized.

54. A method according to claim 53, wherein the detection condition is a signal processing condition for an output signal from a mark detection system for detecting the mark.

55. An alignment method of measuring coordinate positions, on a static coordinate system defining a moving position of a substrate, of some of a plurality of processing areas arranged on the substrate prior to alignment of each of the plurality of processing areas with a predetermined reference position in the static coordinate system, and calculating a coordinate position, on the static coordinate system, of each of the plurality of processing areas by performing statistical calculation processing of the measured coordinate positions, comprising:

the first step of measuring a coordinate position, on the static coordinate system, of each of a plurality of measurement processing areas including the some processing areas plural times, and calculating a first coordinate position, on the static coordinate system, of each of the measurement processing areas by performing statistical calculation processing of the measured coordinate positions;

the second step of correcting each of the first coordinate positions of the some processing areas in accordance with measurement reliability of the coordinate position, and calculating a second coordinate position, on the static coordinate system, of each of the plurality of measurement processing areas by performing statistical calculation processing of the plurality of corrected first coordinate positions; and the third step of determining a processing condition in the statistical calculation processing in the second step such that a deviation between the first coordinate position of each of the plurality of measurement processing areas becomes not more than a predetermined value.

56. A method according to claim 55, wherein the plurality of measurement processing areas are substantially all processing areas on the substrate.

57. A method according to claim 55, wherein the second step comprises correcting the first coordinate position by using a normal distribution random number corresponding to the measurement reliability.

* * * * *